United States Patent [19]

Ando et al.

[11] Patent Number: 5,243,296
[45] Date of Patent: Sep. 7, 1993

[54] METHOD AND APPARATUS FOR CHECKING OPERATION OF SOLENOID

[75] Inventors: Tsuyoshi Ando; Toshibumi Kakinuma, both of Sano; Tomokazu Kominami, Tatebayashi; Kazuyuki Kihara, Sano; Kousuke Hatakenaka, Sano; Akio Mito, Sano, all of Japan

[73] Assignee: Tokimec Inc., Tokyo, Japan

[21] Appl. No.: 779,541

[22] Filed: Oct. 18, 1991

[30] Foreign Application Priority Data

| Nov. 6, 1990 [JP] | Japan | 2-300234 |
| Nov. 6, 1990 [JP] | Japan | 2-300235 |
| Nov. 27, 1990 [JP] | Japan | 2-327633 |
| Nov. 27, 1990 [JP] | Japan | 2-327634 |

[51] Int. Cl.$^5$ .......................... G01R 31/06
[52] U.S. Cl. .................. 324/546; 324/418; 324/207.22; 324/207.26; 340/644
[58] Field of Search ............ 324/415, 418, 422, 537, 324/546, 207.16, 207.22, 207.26; 340/644

[56] References Cited

U.S. PATENT DOCUMENTS

| 4,319,193 | 3/1982 | Boccali et al. | 324/418 |
| 4,504,789 | 3/1985 | Carr et al. | 324/418 |

Primary Examiner—Kenneth A. Wieder
Assistant Examiner—Glenn W. Brown
Attorney, Agent, or Firm—Wenderoth, Lind & Ponack

[57] ABSTRACT

When a solenoid has been turned on by supplying current to a coil thereof, the solenoid operation is checked by temporarily ceasing the supply of current to the coil to temporarily deenergize the solenoid. The current flowing in the coil is detected while the solenoid is temporarily deenergized, and the characteristics of the thus detected current are used to discriminate the position of a movable iron core of the solenoid. On the other hand, when the solenoid has been turned off by ceasing the supply of current to the coil, the solenoid operation is checked by temporarily supplying current to the coil to thereby temporarily energize the solenoid. The current flowing in the coil while the solenoid is temporarily energized is detected, and the characteristics of the thus detected coil current are used to determine the position of the movable iron core of the solenoid.

24 Claims, 47 Drawing Sheets

38: SPRING REACTION
40: SPRING REACTION + HYDRAULIC POWER
42: SOLENOID OUTPUT

FIG.3 PRIOR ART
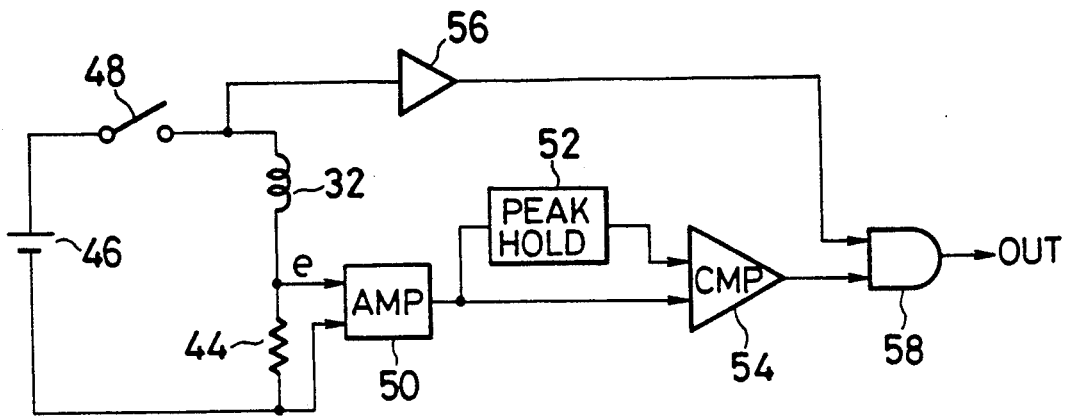
FIG.4A
FIG.4B
FIG.4C
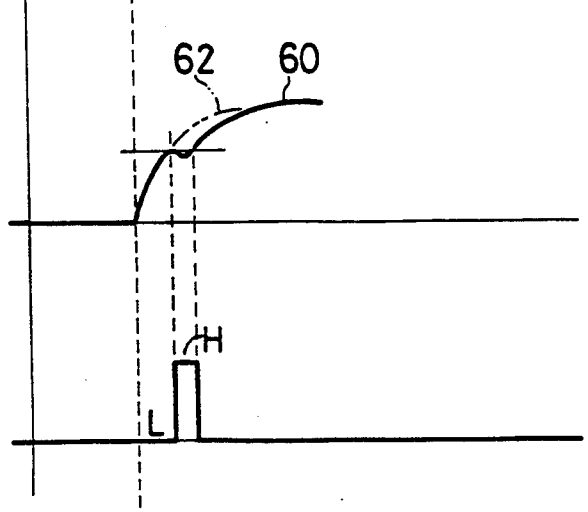

FIG.5 PRIOR ART
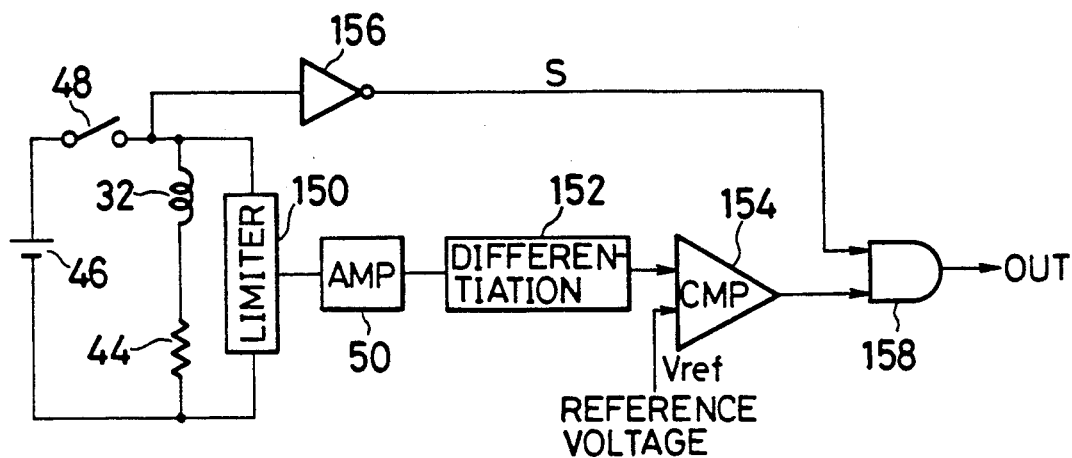
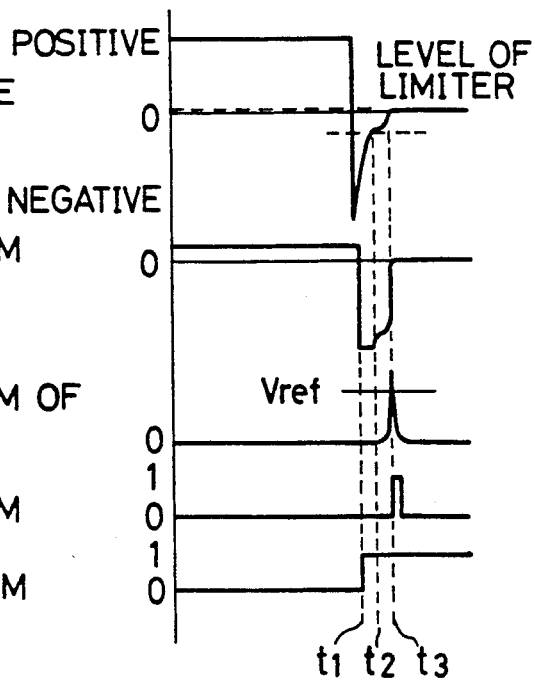
FIG.6A TERMINAL VOLTAGE OF COIL
FIG.6B OUTPUT WAVEFORM OF AMPLIFIER
FIG.6C OUTPUT WAVEFORM OF DIFFERENTIATING CIRCUIT
FIG.6D OUTPUT WAVEFORM OF COMPARATOR
FIG.6E OUTPUT WAVEFORM OF INVERTER

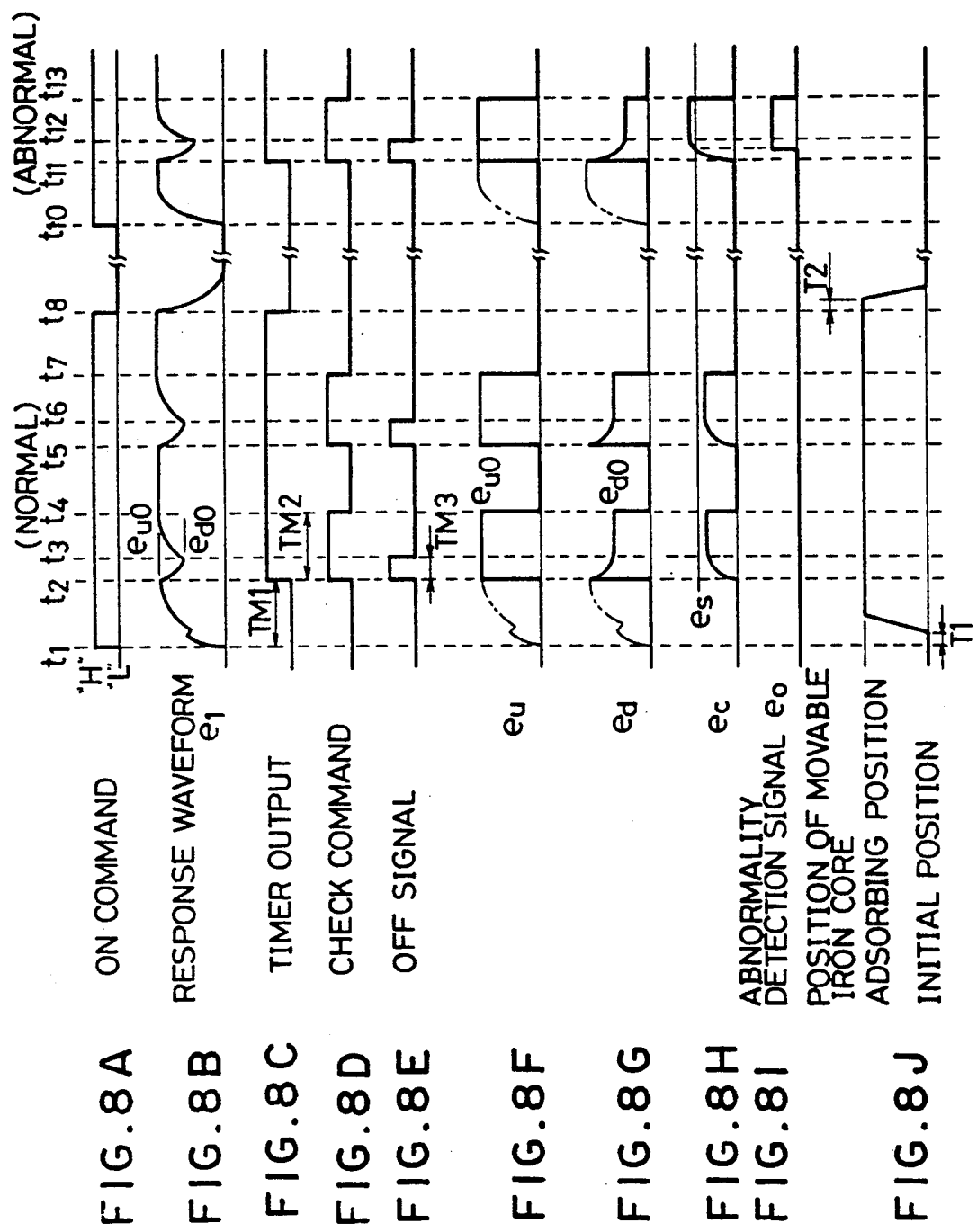

INITIAL POSITION OF
MOVABLE IRON CORE

ADSORBING POSITION OF
MOVABLE IRON CORE

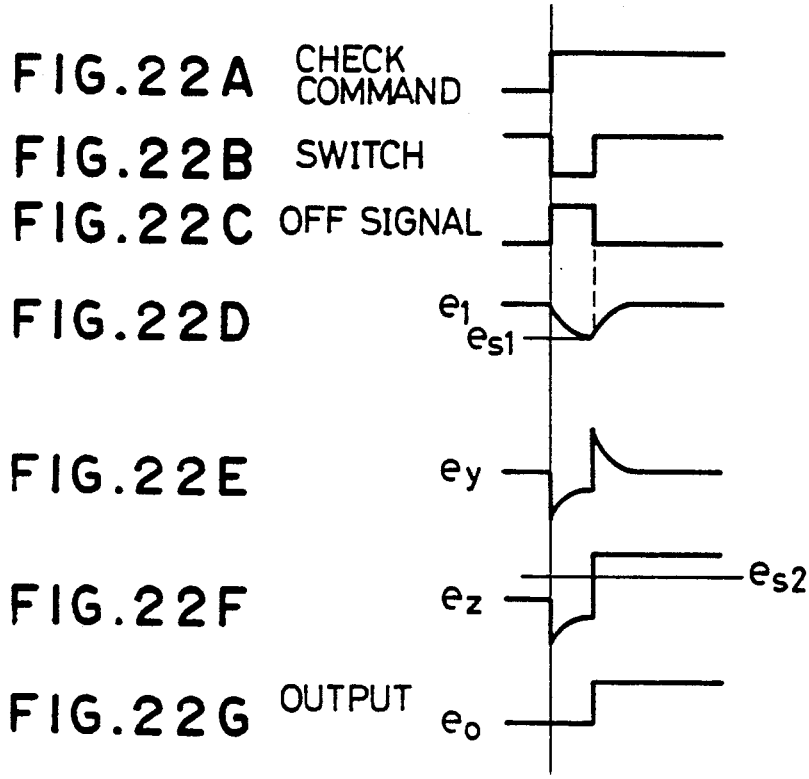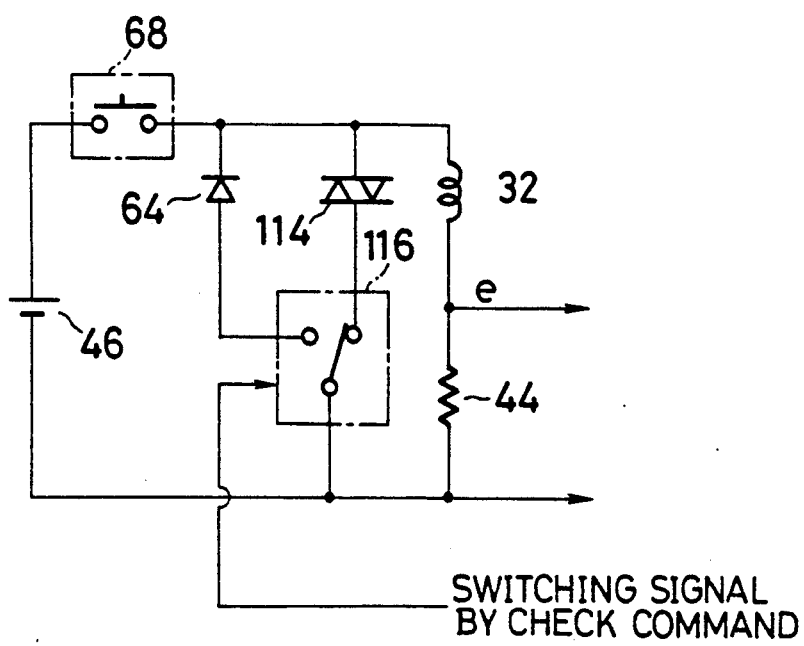

FIG.25A ON COMMAND
FIG.25B e1
FIG.25C TIMER OUTPUT
FIG.25D CHECK COMMAND
FIG.25E OFF SIGNAL
FIG.25F eu
FIG.25G ed
FIG.25H P5
FIG.25I eT
FIG.25J P6

FIG.31A ON COMMAND
FIG.31B $e_1$
FIG.31C TIMER OUTPUT
FIG.31D CHECK COMMAND
FIG.31E OFF SIGNAL
FIG.31F $e_u$
FIG.31G $e_d$
FIG.31H $P_5$
FIG.31I $e_T$
FIG.31J $P_6$

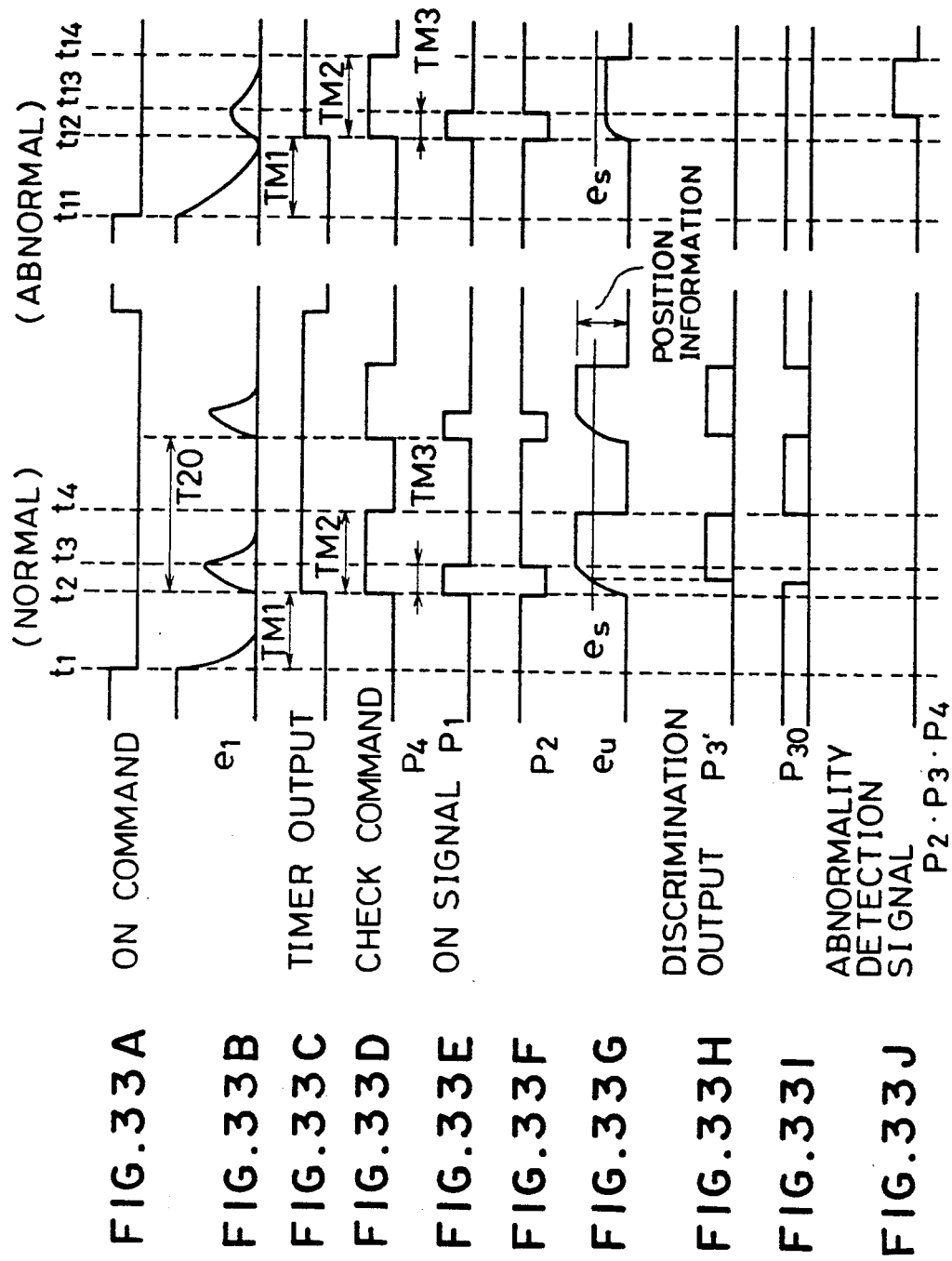

INITIAL POSITION OF MOVABLE IRON CORE

ADSORBING POSITION OF MOVABLE IRON CORE

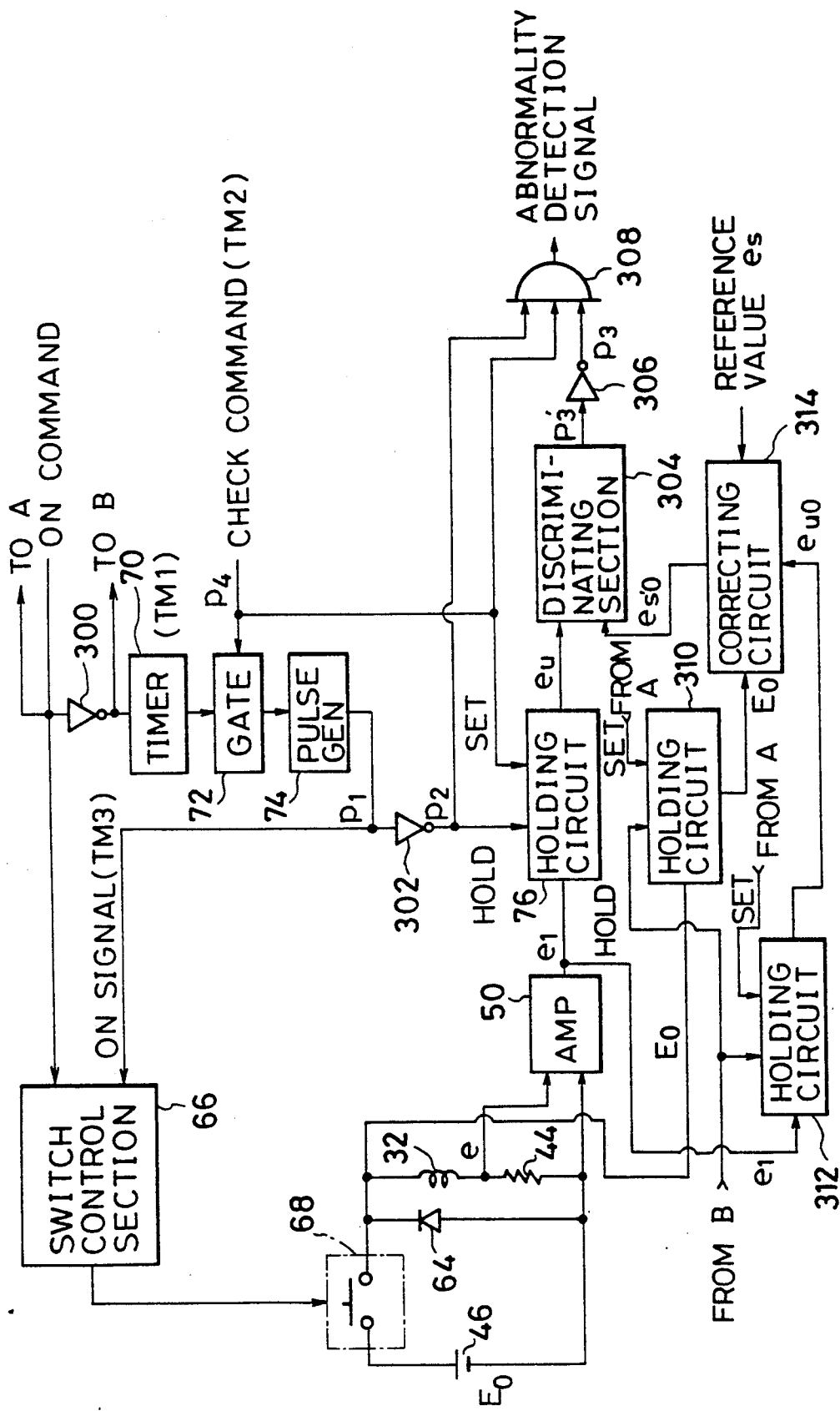

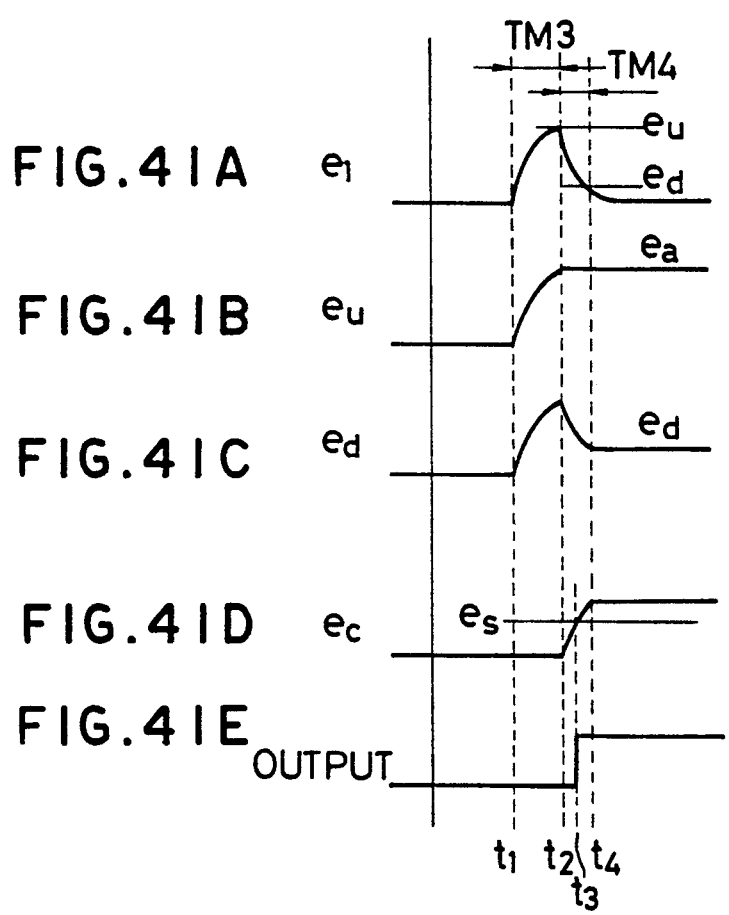

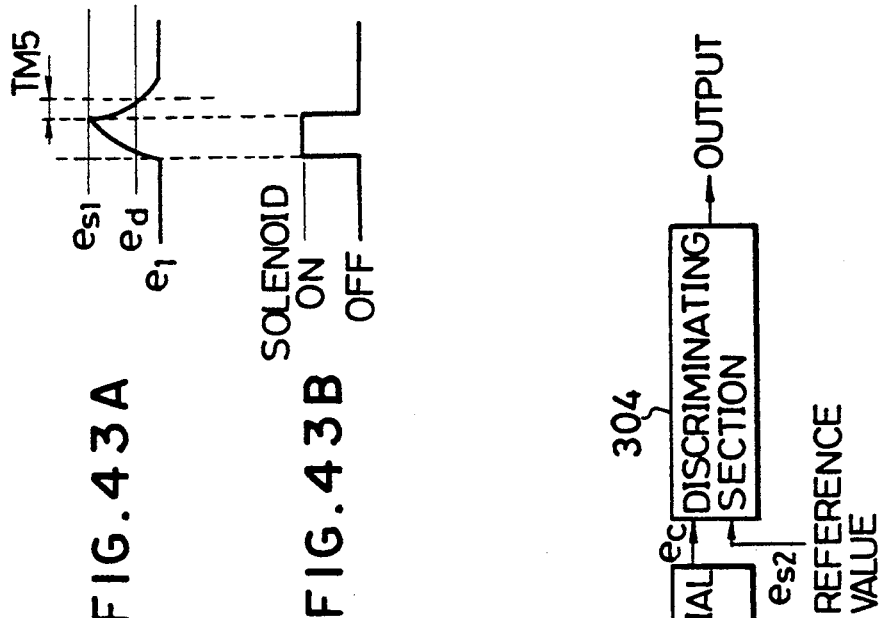
FIG. 43A
FIG. 43B
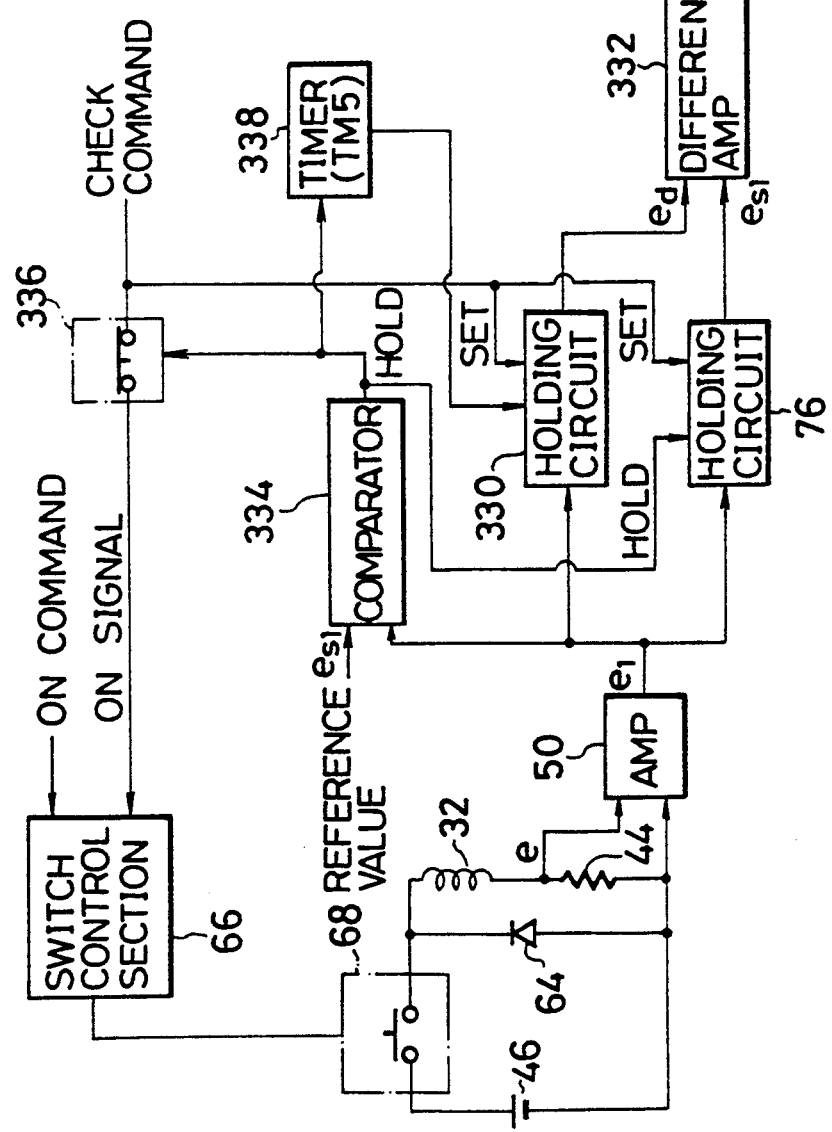
FIG. 42

FIG.45A CHECK COMMAND
FIG.45B SWITCH 27
FIG.45C ON SIGNAL
FIG.45D $e_1$
FIG.45E $\overline{e_1'}$
FIG.45E $e_y$
FIG.45G $e_z$
FIG.45H OUTPUT FIG. 47A ON COMMAND
FIG. 47B $e_1$
FIG. 47C TIMER OUTPUT
FIG. 47D CHECK COMMAND P4
FIG. 47E ON SIGNAL P1
FIG. 47F P5
FIG. 47G $e_T$
FIG. 47H P6

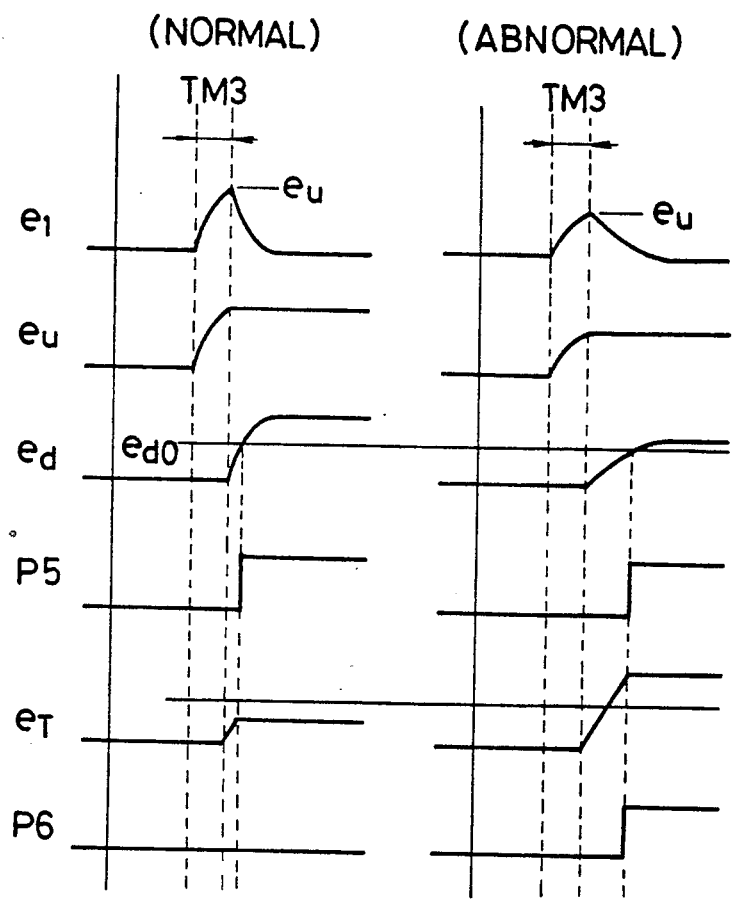

METHOD AND APPARATUS FOR CHECKING OPERATION OF SOLENOID

BACKGROUND OF THE INVENTION

The invention relates to a solenoid operation checking method and apparatus for checking whether solenoids such as various kinds of electromagnetic valves, electromagnetic plungers, or the like are functioning and, more particularly, to a solenoid operation checking method and apparatus in which a current is supplied to a solenoid coil and the solenoid coil is energized and, thereafter, the solenoid coil is temporarily deenergized and the operation is checked, the current supply to the solenoid coil is shut off, and after that, the coil is temporarily energized and the operation is checked.

For instance, as shown in FIG. 1, according to a conventional electromagnetic valve, a spool 14 is slidably provided in a slide hole 12 formed in a body 10, and the spool 14 is held at a closed valve position shown in the diagram by springs 22 and 24 provided in spring chambers 18 and 20 on both sides of the spool 14, that is, the spool 14 is held at a position where a portion between an inlet port 26 and an outlet port 28 is shut off by a land 16. When a current is supplied to a coil 32 of a solenoid 30 provided at one end of the body 10 and the coil 32 is energized, a movable iron core 34 is moved to the left by an attracting force between the movable iron core 34 and a fixed iron core (not shown) in accordance with a magnitude of the exciting current. The spool 14 is moved to the left by a push rod 36, thereby opening a portion between the inlet port 26 and the outlet port 28.

In FIG. 2, a reaction force of the spring 22 in FIG. 1 is shown by a solid line 38, a force which is obtained by adding a hydraulic power to the spring reaction force 38 is shown by an alternate long and short dashed line 40, and an output of the solenoid 30 is shown by a solid line 42. Reference numeral 43 denotes a position where the valve starts to open.

However, if the spool 14 causes a phenomenon such that it becomes fixed due to a choke of an alien matter or the like or if the movable iron core 34 of the solenoid 30 is closely adhered in a slide sleeve, even if the exciting current sufficient to obtain the solenoid output shown by the solid line 42 is supplied to the coil 32 at the fully closed position, the movable iron core 34 cannot be moved to the left. On the other hand, even if the exciting current is reduced so as to decrease the solenoid output by only an amount $\Delta F$ (=spring force + hydraulic power) at the fully opened position, it is possible that the movable iron core 34 will not move away from the adsorbing position.

Hitherto, as a method of checking the operating state of such a solenoid, for instance, there has been known a method whereby the operation of the solenoid at a time point when the solenoid has been turned off is checked on the basis of a difference of a current response waveform due to a moving situation of the movable iron core in the solenoid as disclosed in JP-A-1-265504.

The above method will be briefly explained. As shown in FIG. 3, when a current detecting resistor 44 is serially connected to the coil 32 of the solenoid and a current is supplied from a power source 46 to the series circuit by turning on a switch 48, a magnitude of an exciting current flowing through the coil 32 is converted into a voltage by the resistor and is detected. A current response waveform of a detection voltage e differs depending on whether the movable iron core is moved or not. Such a difference of the current response waveform is used.

That is, if the movable iron core had been moved and the solenoid has normally operated, as shown by a solid line 60 in FIG. 4B, the response waveform temporarily drops during the rising state. However, in an abnormal state in which the movable iron core doesn't move, the response waveform doesn't drop, as shown by an alternate long and short dashed line 62.

Therefore, the detection voltage e of the resistor 44 is amplified by an amplifier 50, a peak value is held by a peak holding circuit 52, and the peak value is subsequently compared with a new detection value by a comparator 54. Thus, an output of the comparator 54 is inverted to the "H" (high) level in the dropout waveform portion in the normal state.

The AND of an output of a comparator 56 which is set to the "H" level as shown in FIG. 4A by the turn-on of the switch 48 and an output of the comparator 54 is obtained by the AND circuit 58, so that a pulse output as shown in FIG. 4C is derived. The pulse output shown in FIG. 4C is not obtained in the normal state. Therefore, a discrimination regarding whether the solenoid has normally operated or not can be made by the presence or absence of the pulse output from the AND circuit 58.

However, in such a conventional method of checking the operation of the solenoid, the operation can be judged only at a moment when the solenoid has been turned on. For instance, in the case where an abnormality has erroneously been detected by the reception of noises at a moment when the solenoid had been turned on, the operator must operate the solenoid again in order to check the operation. However, it is impossible to execute the solenoid again because the reoperation of the solenoid causes a spool and an actuator to be moved. There is a problem in that the operation cannot be checked after the solenoid was operated.

The reliability for the result of the operation check is also low. Particularly, in the case of a shockless electromagnetic valve in which movement has been made difficult by filling an oil into the enclosing portion of a movable iron core, since the motion of the movable iron core is slow, a large difference of a response waveform doesn't appear and there is a problem on reliability of the judgment.

A number of other apparatuses of the type in which a discrimination regarding whether the movable iron core of the solenoid is moved or not function on the basis of a difference of the response waveform of a current or a voltage.

As another method of checking the solenoid operation, there have been proposed many methods of checking the operation of the solenoid by a detection signal by providing a mechanical limit switch, a contactless switch, potentiometer, or the like into the solenoid.

However, the mechanical structure is generally complicated if the above methods are used, and an additional space is needed in order to enclose such a switch or the like. In the case of the mechanical type switch, there is a problem of durability.

On the other hand, when the solenoid has been turned off, the operation is checked by an apparatus shown in FIG. 5.

As shown in FIG. 5, the current detecting resistor 44 is serially connected to the coil 32 of the solenoid. When the switch 48 is turned off from the on state in a state in which a current has been supplied from the power source 46 to the coil 32 by turning on the switch 48, a spike voltage of a polarity opposite to that of a power source voltage is generated by an energy accumulated in the coil 32 as shown in FIG. 6A. A voltage which is equal to or lower than a predetermined voltage is eliminated from the spike voltage by a limiter 150 and, thereafter, the spike voltage is amplified by the amplifier 50, so that a negative constant voltage is generated until time $t_2$ as shown in FIG. 6B.

When the movable iron core starts to return at time $t_2$, an impedance of the coil 32 changes and a convergence of the spike voltage is delayed. After the return of the movable iron core is completed at time $t_3$, the impedance doesn't change, so that the spike voltage is rapidly converged toward zero.

A differentiation waveform output by a differentiating circuit 152 in FIG. 5, therefore, becomes a positive pulse waveform as shown in FIG. 6C. The pulse waveform is compared with a reference voltage $V_{ref}$ by a comparator 154. If a pulse signal shown in FIG. 6D is derived, this means that the solenoid has normally been turned off.

The AND of the above pulse signal and an output shown in FIG. 6E from an inverter 156 is obtained by an AND circuit 158 and is generated as a solenoid off detection signal.

However, even in such a conventional method of checking the operation at the time of turn-off of the solenoid, a check is made to see if the movable iron core has been returned to the initial position or not on the basis of a difference between a current discharge waveform when the movable iron core is moving upon turn-off of the solenoid and a current discharge waveform when the movable iron core is restricted and doesn't move. Consequently, the operation of the solenoid can be judged only at a moment when the solenoid has been turned off. There is also a problem regarding the reliability of the check similar to the case in which the solenoid is turned on.

SUMMARY OF THE INVENTION

It is an object of the invention to provide a solenoid operation checking method and apparatus in which an operating state can be checked as necessary at any time after the operation of the solenoid Another object of the invention is to provide a solenoid operation checking method and apparatus in which a high reliability can be obtained Still another object of the invention is to provide a solenoid operation checking method and apparatus in which there is no need to provide a mechanical switch or the like into the solenoid Another object of the invention is to provide a solenoid operation checking method and apparatus in which after a current is supplied to a coil of the solenoid by turning on a switch, the current supply is temporarily shut off and the solenoid is deenergized, and an operating state of the solenoid is judged from a change amount of the current flowing in the coil at that time.

Another object of the invention is to provide a solenoid operation checking method and apparatus in which after a current is supplied to a coil of the solenoid by turning on a switch, the solenoid is temporarily deenergized, a period of time until a change amount of the coil current due to the deenergization reaches a predetermined value is detected, thereby judging an operating state of the solenoid.

Another object of the invention is to provide a solenoid operation checking method and apparatus in which after a current supply to a coil of the solenoid is shut off by turning off a switch, the current is supplied to the coil for only a short time duration such that a movable iron core hardly moves to thereby temporarily energize the solenoid, and a change amount of a response waveform of the current flowing through the coil at that time is detected, thereby judging the position of the movable iron core.

Another object of the invention is to provide a solenoid operation checking method and apparatus in which after a current supply to a coil of the solenoid is shut off by turning off a switch, the current is supplied to the coil for only a short time duration such that a movable iron core hardly moves to thereby temporarily energize the solenoid, and a period of time until a change amount of a response waveform of the current flowing through the coil reaches a predetermined value is measured, thereby judging the position of the movable iron core.

According to a solenoid of the invention, a resistor used to detect a current is serially connected to a coil and a diode is connected in parallel with the serial circuit. After a current is supplied to the coil of the solenoid by turning on a switch, the operation of the solenoid is checked in the following manner. That is, the current supply to the coil is shut off for only a short time duration such that a movable iron core hardly moves to thereby temporarily deenergize the solenoid. A change amount of a response waveform of the current flowing through the coil which is detected by the current detecting resistor is detected, thereby judging the position of the movable iron core.

The change amount of the response waveform of the current flowing through the coil is detected from a difference between the current value at the start of the temporary deenergization and the current value at the time of the cancellation of the deenergization, or is detected as a differentiation value of the change amount per unit time in the period of time of the temporary deenergization. When the differential current or the differentiation value which has been detected as a change amount of the current response waveform has exceeded a predetermined reference value, it is determined that the movable iron core is in an abnormal state in which case it stops at the initial position and is not moved to an adsorbing position.

According to the method of checking the solenoid operation according to the invention, after the solenoid is turned on, the solenoid is temporarily deenergized for only a short time duration such that the movable iron core of the solenoid hardly moves, and whether the movable iron core is located at the adsorbing position, opening position, or intermediate position due to some troubles can be judged from a difference of the response current waveform due to a difference of the inductance of the solenoid depending on the position of the movable iron core.

After the elapse of a transient state of a certain time, e.g., 100 msec when the current has been supplied to the solenoid coil, the operation can be checked at any time. Therefore, the reliability is high and the operation can be easily monitored from the controller side.

Moreover, since there is no need to provide a mechanical switch or the like into the solenoid, there is no problem regarding space and durability.

According to the invention, after a current is supplied to the solenoid coil, the current supply to the coil is shut off for only a short time duration such that the movable iron core hardly moves to thereby temporarily deenergize the solenoid, and a time which is required until a response waveform of the current flowing through the coil which is detected by a current detecting resistor during the deenergization changes by a predetermined value is measured, thereby detecting the position of the movable iron core on the basis of the measured time.

Even in the above case, a time which is required until the response waveform changes by only a predetermined value by the movable iron core differs due to a difference of the response current waveform by a difference of the inductance of the solenoid depending on the position of the movable iron core. Thus, the position of the movable iron core, namely, the operating state of the solenoid can be judged.

On the other hand, according to the invention, as a method of checking the operation upon deenergization of the solenoid by shutting off the current supply to the solenoid coil, the current is supplied to the coil only for a short time such that the movable iron core hardly moves after the solenoid is deenergized, thereby temporarily energizing the solenoid, and a magnitude of the current flowing through the coil is detected and the position of the movable iron core is judged.

That is, from a difference of the response current waveform due to a temporary energization due to a difference of the inductance of the solenoid depending on the position of the movable iron core, when the operation of the solenoid has been stopped, it is possible to discriminate whether the movable iron core is located at the adsorbing position at the time of turn-on of the solenoid, opening position at the time of the turn-off of the solenoid, or intermediate position due to some troubles.

According to the invention, after the solenoid is deenergized, the current is supplied to the solenoid coil for only a short time duration such that the movable iron core hardly moves to thereby temporarily energize the solenoid. A time which is required until the current flowing through the coil at that time changes by only a predetermined value is measured. The position of the movable iron core can be also judged from the measured value.

The above and other objects, features, and advantages of the present invention will become more apparent from the following detailed description with reference to the drawings.

BRIEF DESCRIPTION THE DRAWINGS

FIG. 3 is an explanatory diagram of a conventional apparatus for checking the operation upon energization of a solenoid;

FIGS. 4A to 4C are time charts showing signal waveforms in respective sections in FIG. 3;

FIG. 5 is an explanatory diagram of a conventional apparatus for checking the operation upon deenergization of the solenoid;

FIGS. 6A to 6E are time charts showing signal waveforms in respective sections in FIG. 5;

FIGS. 8A to 8J are time charts showing the signal waveforms in the respective sections in FIG. 7 in the normal state and the abnormal state, respectively;

FIGS. 22A to 22G are time charts showing signal waveforms in respective sections in FIG. 21;

FIG. 23 is a circuit block diagram showing the ninth embodiment of the invention;

FIGS. 33A to 33J are time charts showing signal waveforms in respective sections in FIG. 32;

FIG. 35 is a circuit block diagram showing the sixteenth embodiment of the invention;

FIGS. 41A to 41E are time charts showing signal waveforms in respective sections in FIG. 40;

FIG. 42 is a circuit block diagram showing the twenty-first embodiment of the invention;

FIGS. 43A to 43B are time charts showing signal waveforms in respective sections in FIG. 42;

FIGS. 53A to 53F are time charts showing signal waveforms in respective sections in FIG. 52.

DETAILED DESCRIPTION OF THE PREFERRED EMBODIMENTS

Figure 7:
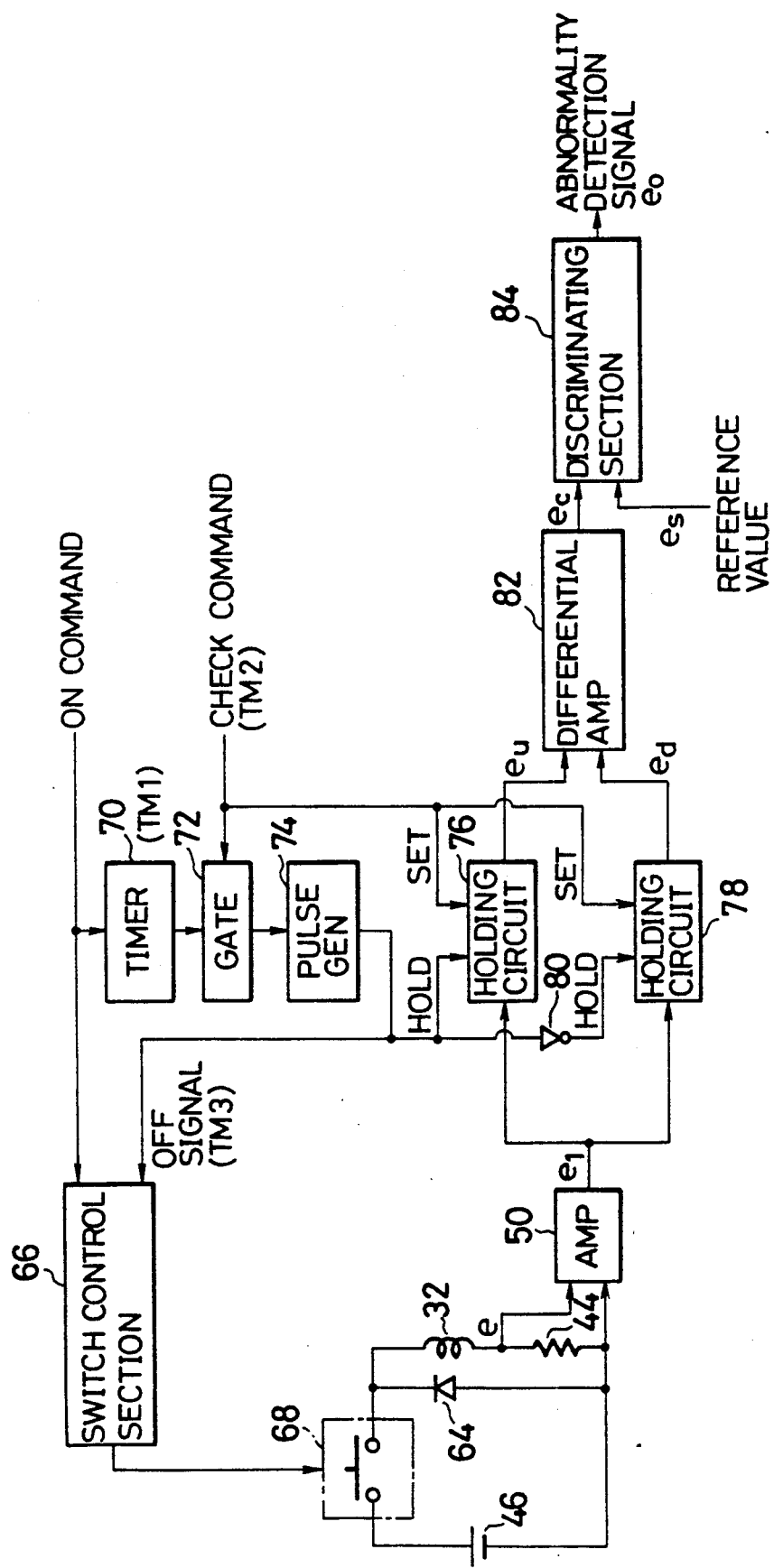
FIG. 7 is a circuit block diagram showing the first embodiment of the invention.

FIG. 7 is a circuit block diagram of a solenoid operation checking apparatus showing the first embodiment of the invention for checking the operation after a solenoid has been energized.

In FIG. 7, the current detecting resistor 44 is serially connected to the coil 32 of the solenoid. A diode 64 is connected in parallel with the serial circuit of the coil 32 and resistor 44. The coil 32, resistor 44, and diode 64 are integratedly assembled in the solenoid. The DC power source 46 is connected to the serial circuit of the coil 32 and resistor 44 through a switch 68. When a current is supplied to the coil 32 by turning on the switch 68, the diode 64 is reversely biased and is made nonconductive. When the switch 68 is turned off after completion of the current supply, the current flows in the coil 32 and resistor 44 through the diode 64 by an energy accumulated in the coil 32.

A relay switch, an electronic switch, or the like is used as the switch 68. The switch 68 is on/off controlled by a switch control section 66.

A timer 70 which is made operative by an ON command from a sequencer or the like provided on the outside is further provided. The timer 70 generates a timer output signal after the elapse of a timer set time $TM_1$ and turns on a gate circuit 72 which receives a check command from the outside. The check command which has passed through the gate circuit 72 activates a pulse generator 74, thereby allowing an OFF command to be generated from the pulse generator 74.

The switch control section 66 on/off controls the switch 68 in response to the ON command from the outside and the OFF command from the pulse generator 74.

The amplifier 50 amplifies a terminal voltage e of the current detecting resistor 44 which is generated in accordance with a magnitude of an exciting current flowing in the coil 32. An output voltage $e_1$ of the amplifier 50 is held by a holding circuit 76 in response to a leading edge of an OFF signal from the pulse generator 74. The output voltage $e_1$ of the amplifier 50 is held by a holding circuit 78 in response to a trailing edge of an OFF signal from the pulse generator 74. A differential amplifier 82 generates a voltage signal $e_c$ corresponding to a difference between holding outputs $e_u$ and $e_d$ of the holding circuits 76 and 78. A discriminating section 84 further compares the level of the voltage signal $e_c$ of the differential amplifier 82 with a reference value $e_s$, thereby judging the position of a movable iron core of the solenoid.

Figure 1:
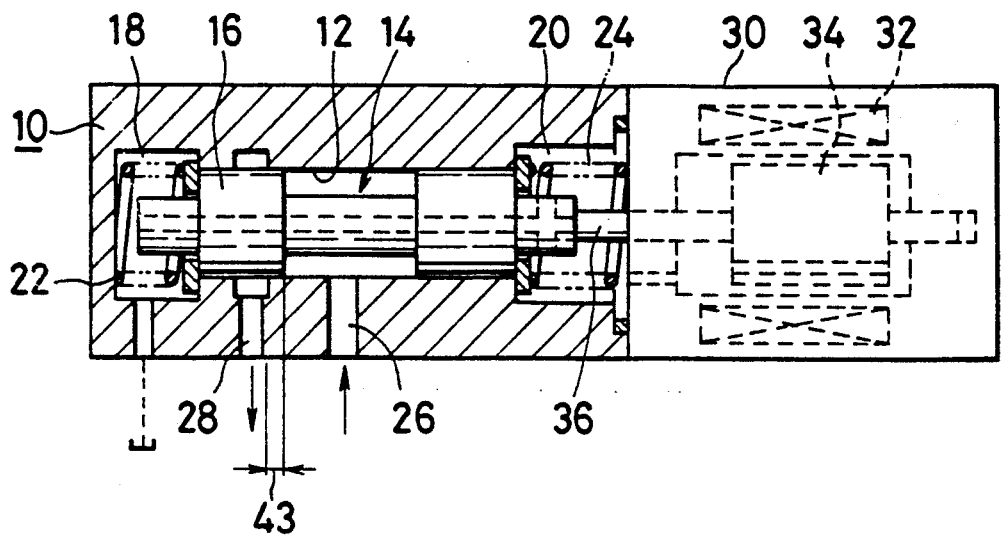
FIG. 1 is an explanatory diagram of a conventional electromagnetic valve.

The first embodiment relates to an apparatus for checking the presence or absence of the operation of the movable iron core after the solenoid has been energized. A check is made to see if the movable iron core 34 has reached the adsorbing position which is adsorbed by a fixed iron core by the energization of the solenoid 30 as shown in FIG. 1.

The operation of the first embodiment in FIG. 7 will now be described also with reference to time charts of FIGS. 8A to 8J.

First, when the ON command to make the solenoid operative is set to "H" at time $t_1$ as shown in FIG. 8A, the switch control section 66 turns on the switch 68. An exciting current starts to flow in the coil 32 from the DC power source 46. The voltage e according to the current value is generated across the resistor 44.

The output voltage $e_1$ which is obtained by amplifying the detection voltage e by the amplifier 50 changes as shown in FIG. 8B.

On the other hand, the timer 70 is activated by the ON command at time $t_1$. After the elapse of the set time $TM_1$ of the timer, the timer output as an OFF command is set to "H" as shown in FIG. 8C. The timer time $TM_1$ is set to a value which is slightly longer than a time which is required until the voltage $e_1$ is saturated.

When the output of the timer 70 is set to "H" at time $t_2$, the gate circuit 72 opens the gate and accepts the check command of a predetermined time width $TM_2$ and supplies the check command. The pulse generator 74 is made operative at leading time point $t_2$ of the check command and generates the OFF signal of a pulse width $TM_3$ as shown in FIG. 8E.

The OFF signal of the pulse width $TM_3$ is set to a short time width such that the movable iron core hardly moves even if the solenoid is deenergized by shutting out the power supply to the coil 32.

The holding circuit 76 is simultaneously set at leading time point $t_2$ of the check command to thereby hold the voltage $e_1$. The holding circuit 78 is set through an inverter 80 at leading time point $t_3$ of the OFF signal to thereby hold the voltage $e_1$.

Therefore, the holding output $e_u$ of the holding circuit 76 is set to a saturation level $e_{u0}$ from time $t_2$ as shown in FIG. 8F.

When the OFF signal is generated from the pulse generator 74 and is set to "H", the switch control section 66 turns off the switch 68 for only the period of time of the pulse width $TM_3$. Therefore, the current flowing in the coil 32 suddenly decreases toward a holding current due to a self accumulated energy. The current detection voltage $e_1$ corresponding to the value of the current flowing in the coil 32 drops as shown in FIG. 8B. When the OFF signal is returned to the "L" (low) level at time $t_3$ after the elapse of the period of time $TM_3$, the switch 68 is again turned on and the current flowing in the coil 32 again increases and is soon returned to the original state. Thus, the detection voltage $e_1$ also rises and is returned to the saturation level.

An output of the inverter 80 is set to "H" at trailing time point $t_3$ of the OFF signal, thereby allowing the holding circuit 78 to hold the detection voltage $e_1$ at that time. Therefore, the holding output $e_d$ in the holding circuit 78 is set to a saturation level $e_{d0}$ as shown in FIG. 8G.

Consequently, the output $e_c$ of the differential amplifier 82 when the solenoid has been deenergized is expressed by $$e_c = e_u - e_d = e_{u0} - e_{d0}$$

as shown in FIG. 8H.

The discriminating section 84 compares the differential voltage $e_c$ with the reference value $e_s$, thereby judging the position of the movable iron core of the solenoid.

At this time, as shown on the normal side in each of FIGS. 8A to 8J, if the movable iron core has normally operated and is located at the adsorbing position, a level of the differential voltage $e_c$ is lower than the reference value $e_s$ ($e_c < e_s$) as shown on the normal side in FIG. 8H. The discriminating section 84 doesn't generate an abnormality detection signal $e_0$ as shown on the normal side in FIG. 8I. $T_1$ and $T_2$ in FIG. 8J denote time lags of the operation of the movable iron core.

On the other hand, if the movable iron core doesn't normally operate and remains at the initial position as shown on the abnormal side in each of FIGS. 8A to 8J, the level of the differential voltage $e_c$ is higher than the reference value $e_s$ ($e_c \geq e_s$) at time $T_{11}$ as shown in FIG. 8H. The discriminating section 84 generates the pulse-shaped abnormality detection signal $e_0$ as shown in FIG. 8I.

After that, if the check command is turned off at time $t_4$ in the normal state and at time $t_{13}$ in the abnormal state, the holding circuits 76 and 78 are reset, all of the signals $e_u$, $e_d$, and $e_c$ are set to 0, and the apparatus waits for the input of the next check command.

When the check command is again supplied at time $t_5$, the solenoid is deenergized for a period of time between $t_5$ and $t_6$ and the discrimination is executed for a period of time between $t_5$ and $t_7$.

As mentioned above, the operating state can be checked many times during the operation of the solenoid.

In the above embodiment, the timer 70 is immediately made operative by the ON command and, after the elapse of the set time $TM_1$, the gate circuit 72 is opened. However, it is also possible to operate in a manner such that after the ON command has been supplied, the detection voltage $e_1$ of the value of the current flowing in the coil 32 is monitored and the timer 72 is made operative when the detection voltage $e_1$ has reached a preset value.

In the case where the inductance of the coil 32 is large or the like, it will be certain to make the timer 70 operative when the detection current has exceeded a reference value rather than the case of setting the time $TM_1$ from the start of the current supply. The timer set time $TM_1$ may be also set to 0 in such a case.

Figure 2:
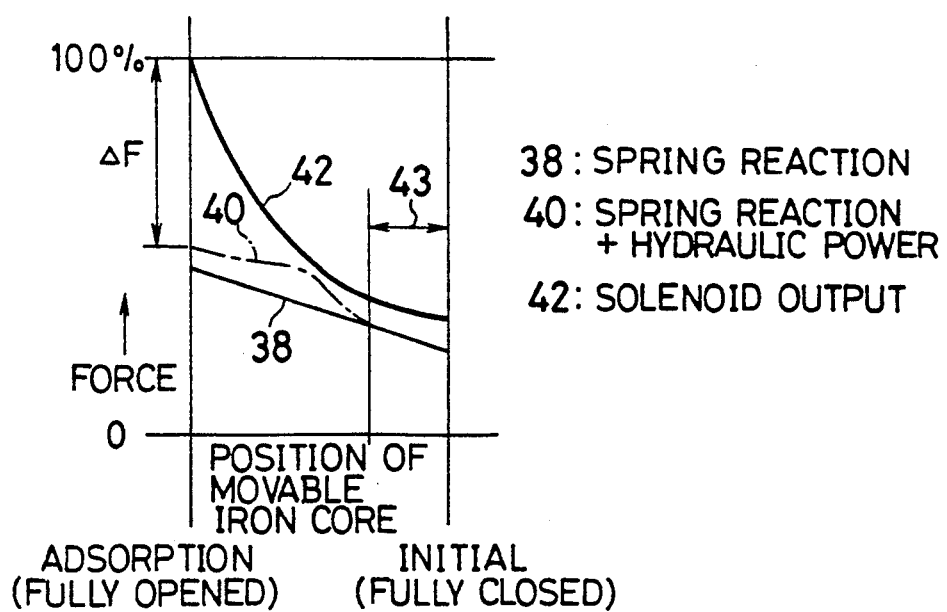
FIG. 2 is a characteristic graph showing changes of a spring reaction force between the fully opened position and the fully closed position of the electromagnetic valve in FIG. 1, a force which is obtained by adding a hydraulic power to the spring reaction force, and a solenoid output.

On the other hand, when the solenoid is energized, the movable iron core is attracted to the fixed iron core (pole face) and is moved while pressing a spool or the like against the force which is obtained by adding a hydraulic power to the spring force and is adsorbed to the fixed iron core as described in FIGS. 1 and 2. However, in order to hold the adsorbing state, the solenoid power is generally fairly larger than the force which is obtained by adding the hydraulic power to the spring force.

Therefore, even if the current flowing in the coil 32 decreases due to the deenergization for a short period of time, the movable iron core can be held at the adsorbing position so long as the solenoid power lies within a range larger than the force obtained by adding the hydraulic power to the spring force. On the other hand, even if the adsorption of the movable iron core has been cancelled at a moment, no problem occurs so long as such a state lies within a range of no problem as a whole system including the valve. Accordingly, the pulse width $TM_3$ of the OFF signal which is generated from the pulse generator 74 is set in consideration of the above point.

Figure 9A:
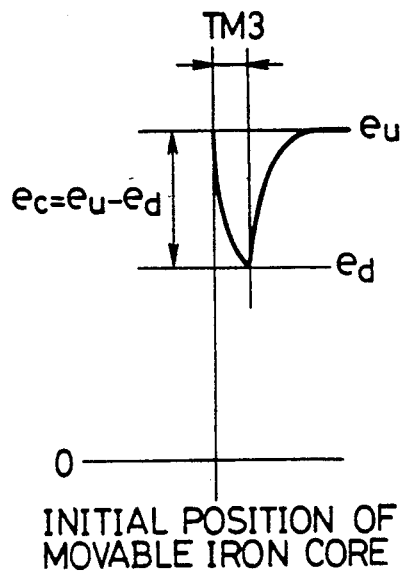
FIG. 9A is a signal waveform diagram showing a change in current detection voltage when the solenoid has temporarily been deenergized at the initial position of a movable iron core.
Figure 9B:
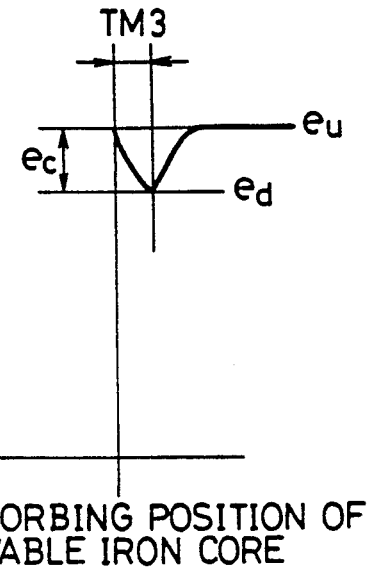
FIG. 9B is a signal waveform diagram showing a change in current detection voltage when the solenoid has temporarily been deenergized at the operating position (adsorbing position) of the movable iron core.

FIGS. 9A and 9B show a difference is a current response waveform flowing in the coil 32 when the solenoid has temporarily been deenergized for a period of time of the pulse width $TM_3$, that is, the voltage response waveform which is detected by the current detecting resistor 44 in dependence on the position of the movable iron core.

Figure 10:
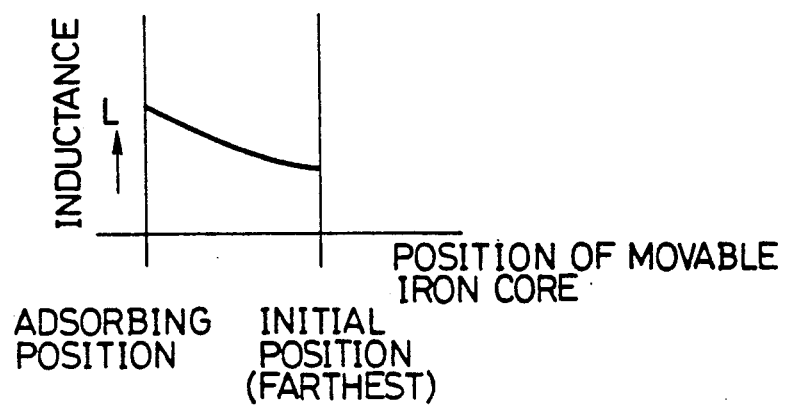
FIG. 10 is a characteristic graph showing a change in inductance of a coil between the initial position and the absorbing position of the solenoid.

As shown in FIG. 10, an inductance L of the coil 32 is smallest when the movable iron core is located at the initial position (position which is farthest from the fixed iron core) and is maximum when the movable iron core is located at the adsorbing position (position where the movable iron core is closely adhered to the fixed iron core). The inductance L continuously changes between the minimum and maximum values.

A change amount (dropout amount) of the voltage waveform when the solenoid has temporarily deenergized differs in dependence on the inductance L. As shown in FIG. 9A, when the movable iron core is located at the initial position, the inductance is small, so that the voltage waveform largely drops due to the temporary deenergization. On the other hand, when the movable iron core is located at the adsorbing position as shown in FIG. 9B, the inductance is large, so that the dropout amount of the voltage waveform due to the temporary deenergization is small.

Therefore, by detecting a differential voltage $$e_c = e_u - e_d$$

shown in the change amount of the voltage waveform by the deenergization and comparing with the reference value $e_s$, the position of the movable iron core can be judged.

Although the embodiment has been described above with respect to the discrimination between two initial and adsorbing positions, if the differential voltage $e_c$ is compared with a plurality of reference values of different levels, the positions at a plurality of stages of the movable iron core can be also detected. The resolution in the position detection is raised, the accuracy is improved, and a degree of abnormality or normality can be detected.

Figure 11:
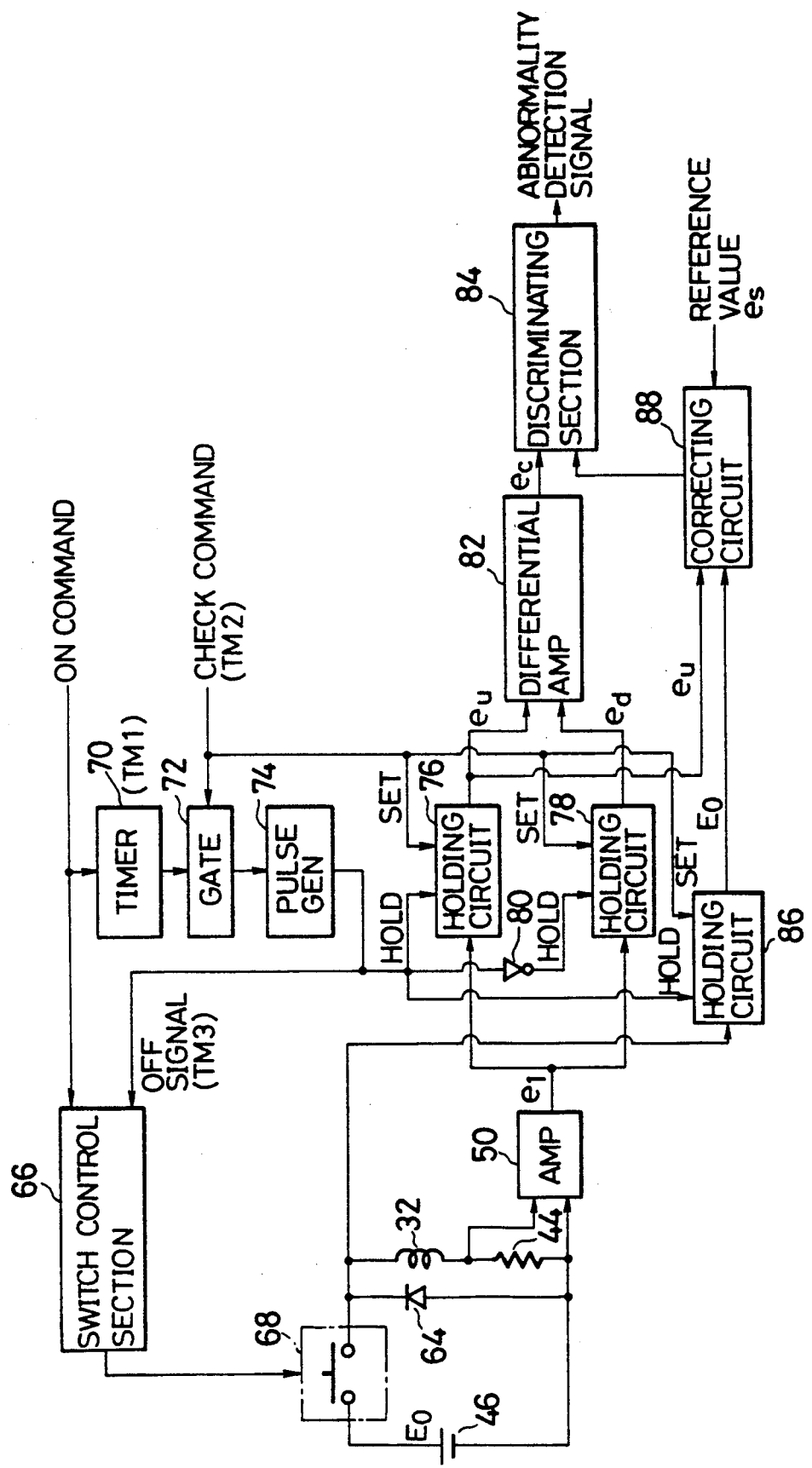
FIG. 11 is a circuit block diagram showing the second embodiment of the invention.

On the other hand, if the differential voltage $e_c$ is detected in a stepless manner, the position of the movable iron core can be continuously measured FIG. 11 is a circuit block diagram showing the second embodiment of the invention.

As compared with the first embodiment of FIG. 5, the second embodiment is characterized in the provision of a holding circuit 86 and a correcting circuit 88 to correct the reference value $e_s$.

This is because the reference value $e_s$ is corrected in correspondence to a change in current value which is saturated or is close to the saturation due to an increase in temperature of the coil or a fluctuation of the power source voltage to thereby obtain a correct detection point.

The holding circuit 86 receives a supply voltage $E_0$ of the DC power source 46 when the switch 68 is ON. The holding circuit 86 is set by a leading edge of the check command and starts to retrieve data. The holding circuit 86 holds the voltage $E_0$ as input data by a leading edge of the OFF signal from the pulse generator 74 and supplies to the correcting circuit 88.

At the same time, the holding value $e_u$ of the holding circuit 78, that is, the voltage $e_u$ according to the value of the current flowing in the coil 32 in a stationary state after the operation of the solenoid is also supplied to the correcting circuit 88.

The correcting circuit 88 corrects the reference value $e_s$ in accordance with the values of the input signals $E_0$ and $e_u$ and sends the corrected value to the discriminating section 84.

A response characteristic of the current flowing in the coil 32 when the switch 68 has been turned on is expressed by the following equation $$i = (E_0/R)(1 - e^{-(R/L)t})$$

where,
R: resistance value which is obtained by adding a value of the resistor 44 to a value of an internal resistance of the coil 32
L: inductance of the coil 32

Therefore, by holding the power source voltage $E_0$ just before the coil current is shut off and the voltage $e_u$ corresponding to a stationary current I at that time, the resistance value R of the coil 32 becomes known from $$R = E_0/I$$

and the reference value $e_s$ can be corrected so as to trace a fluctuation of the resistance value R. By the correction of the reference value $e_s$, the accuracy of the discrimination of the position of the movable iron core based on the differential voltage $e_c$ by the discriminating section 84 can be raised.

Figure 12:
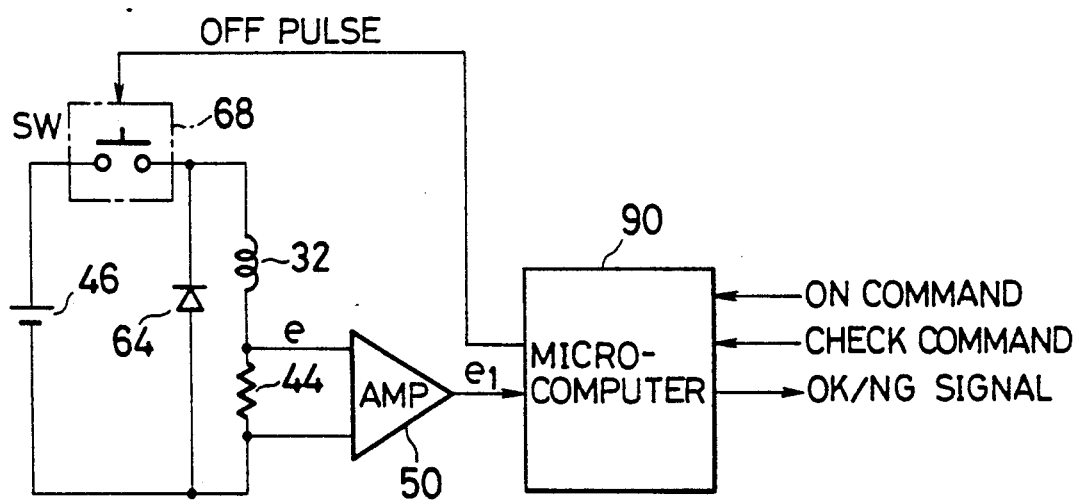
FIG. 12 is a circuit block diagram showing the third embodiment of the invention.
Figure 13:
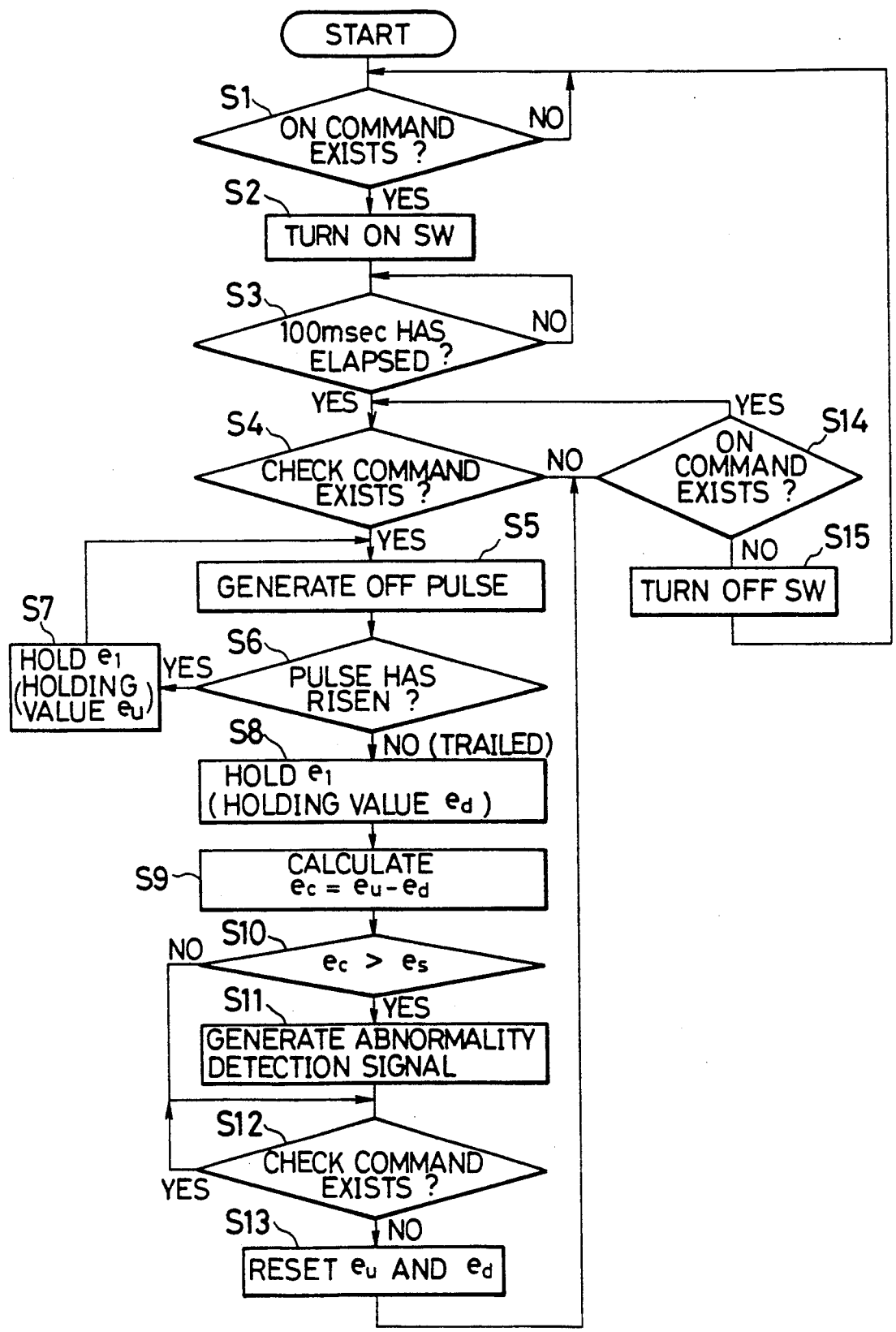
FIG. 13 is a flowchart showing processes by a microcomputer in FIG. 9.

FIG. 12 is a circuit block diagram showing the third embodiment of the invention using a microcomputer. FIG. 13 shows a processing flowchart of the microcomputer.

In FIG. 12, a microcomputer 90 receives the ON command and check command and on/off controls the switch 68 and converts the output voltage $e_1$ of the amplifier 50 representative of the value of the current flowing in the coil 32 into a digital value by an A/D converting section provided in the microcomputer and checks the digital value. When an abnormal operation of the solenoid is detected, the microcomputer 90 generates an abnormality detection signal.

In the embodiment, since an external sequencer manages the timings for the ON command and check command, interlocking means between them is unnecessary.

The processes by the microcomputer 90 in FIG. 12 will now be explained hereinbelow with reference to the flowchart of FIG. 13.

When the processing routine is first started, a check is made in step S1 to see if the ON command has been supplied or not. If YES, the switch 68 is turned on in step S2, thereby supplying an exciting current to the coil 32. In the next step S3, a check is made to see if a predetermined time, e.g., 100 msec corresponding to a time which is required for the operation of the solenoid has elapsed or not. If YES, step S4 follows and a check is made to see if the check command has been supplied or not.

If it is determined in step S14 that there is no ON command before the check command is supplied, step S15 follows and the switch 68 is turned off, thereby shutting out the current supply to the coil 32. The processing routine is returned to step S1 and the supply of the next ON command is waited.

If the check command has been supplied after the elapse of 100 msec in step S4, step S5 follows and an OFF pulse having a predetermined short pulse width is generated and the switch 68 is turned off for only such a period of time.

If it is determined in step S6 that the OFF pulse has been set to the high "H" level, the output voltage $e_1$ from the amplifier 50 is held in step S7 and the holding value is set to $e_u$. If the OFF pulse has been set to the low "L" level, step S8 follows and the voltage $e_1$ is held and the holding value is set to $e_d$.

In the next step S9, a calculation of $$e_c = e_u - e_d$$

is executed. The differential signal $e_c$ is compared with the reference value $e_s$ in step S10. If $e_c > e_s$, it is decided that the movable iron core doesn't move, so that the processing routine advances to step S11 and the abnormality detection signal is generated. On the other hand, if $e_c \leq e_s$, no signal is generated In step S12, a check is made to see if there is a check command or not If there is no check command, the holding values $e_u$ and $e_d$ are reset in step S13 and the processing routine is returned to step S4. In step S14, a check is again made to see if the ON command has been supplied or not. If YES, a check is made in step S4 to see if the next check command has been supplied or not. If there is no ON command, step S15 follows and the switch 68 is turned off and the apparatus waits for the input of the next ON command in step S1.

A wired logic circuit from digital elements can also be used in place of the microcomputer 90.

Figure 14:
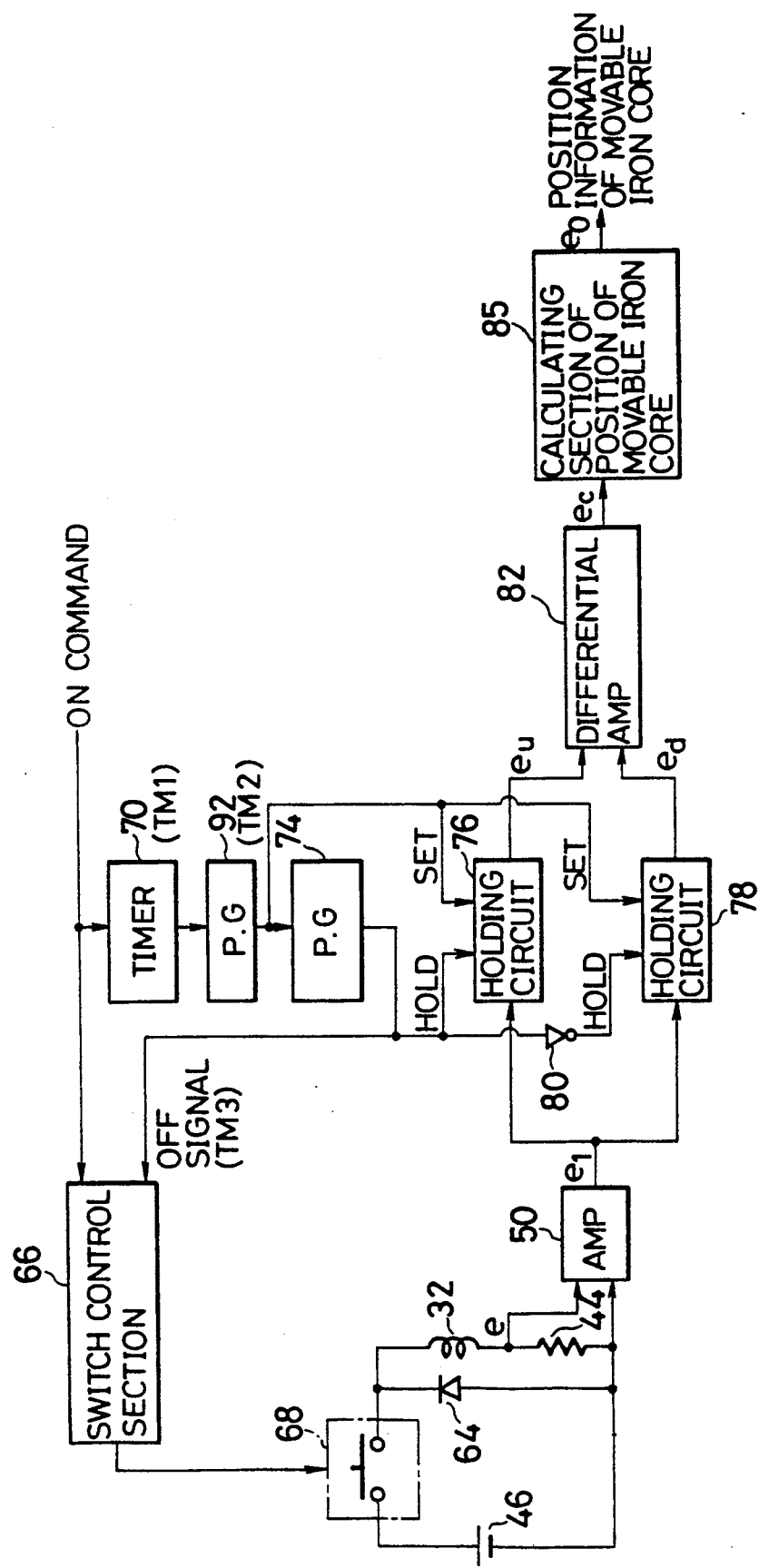
FIG. 14 is a circuit block diagram showing the fourth embodiment of the invention.

FIG. 14 is a circuit block diagram showing the fourth embodiment of the invention and the same portions as those in the first embodiment of FIG. 7 are designated by the same reference numerals and their descriptions are omitted here.

In the fourth embodiment, after the solenoid has been energized, the operation is automatically periodically checked at a predetermined time width and the result is generated as an analog value.

The fourth embodiment in FIG. 14 differs from the first embodiment in FIG. 7 only with respect to the provision of a pulse generator 92 to generate a check command pulse in place of the gate circuit 72 such that the input of the check command from the outside becomes necessary, and the provision of a movable iron core position calculating section 85 in place of the discriminating section 84 such that movable iron core position information is generated by an analog signal.

The operation of the fourth embodiment will now be described also with reference to time charts of FIGS. 15A to 15E.

Figure 15:
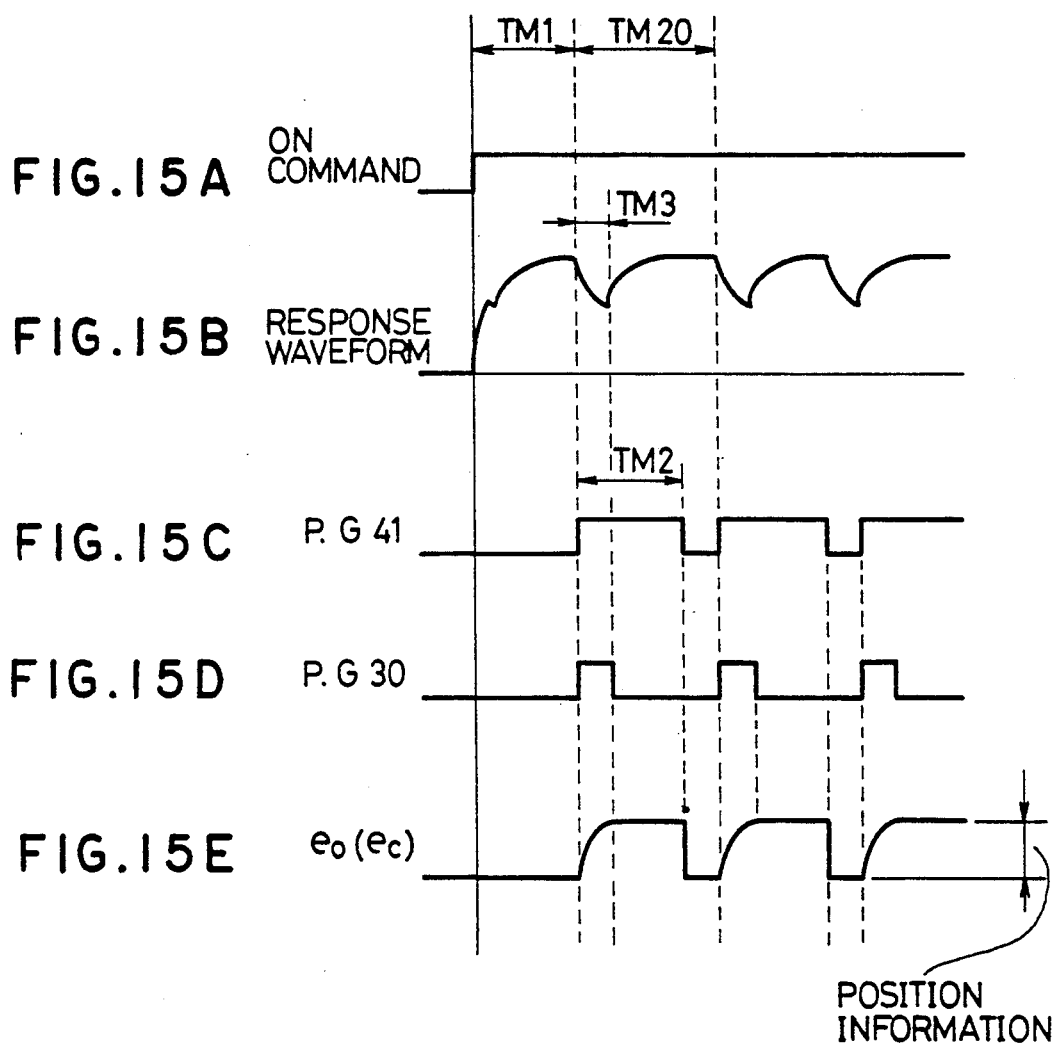
FIGS. 15A to 15E are time charts showing signal waveforms in respective sections in FIG. 14.

When the ON command is supplied from the outside as shown in FIG. 15A, the switch control section 66 turns on the switch 68 and starts the current supply to the coil 32 of the solenoid from the power source 46 and makes the timer 70 operative.

The timer 70 makes the pulse generator 92 operative after the elapse of the set time $TM_1$. As shown in FIG. 15C, the pulse generator 92 generates a check command pulse having a pulse width of $TM_2$ and a period of $TM_{20}$.

The holding circuits 76 and 78 are set in response to a leading edge of the check command pulse and the fetching of the data is started and the pulse generator 74 is also made operative.

Thus, the pulse generator 74 generates an OFF signal pulse having a pulse width of $TM_3$ and a period of $TM_{20}$. The switch control section 66 turns off the switch 68 for only the period of time $TM_3$, thereby temporarily deenergizing the solenoid.

At this time, the response waveform of the current flowing in the coil 32 is detected as a voltage $e_1$ by the resistor 44 and amplifier 50. The waveform at this time is as shown in FIG. 15B.

The holding circuit 76 holds the voltage $e_1$ just before the switch 68 is turned off and the holding value is set to $e_u$. The holding circuit 78 holds the voltage $e_1$ just before the switch 68 is again turned on and the holding value is set to $e_d$.

The difference $e_c$ between the holding values $e_u$ and $e_d$ is calculated by the differential amplifier 82. Movable iron core position information $e_a$ as shown in FIG. 15E is calculated by the calculating section 85 on the basis of the difference $e_c$ and is generated.

Subsequently, the holding circuits 76 and 78 are reset in response to a trailing edge of the check command pulse from the pulse generator 92 and the check of the first time is finished. However, since the pulse generator 92 periodically generates the check command pulses at a period of $TM_{20}$, the next check is also soon executed and the movable iron core position information $e_a$ is periodically generated.

Figure 16:
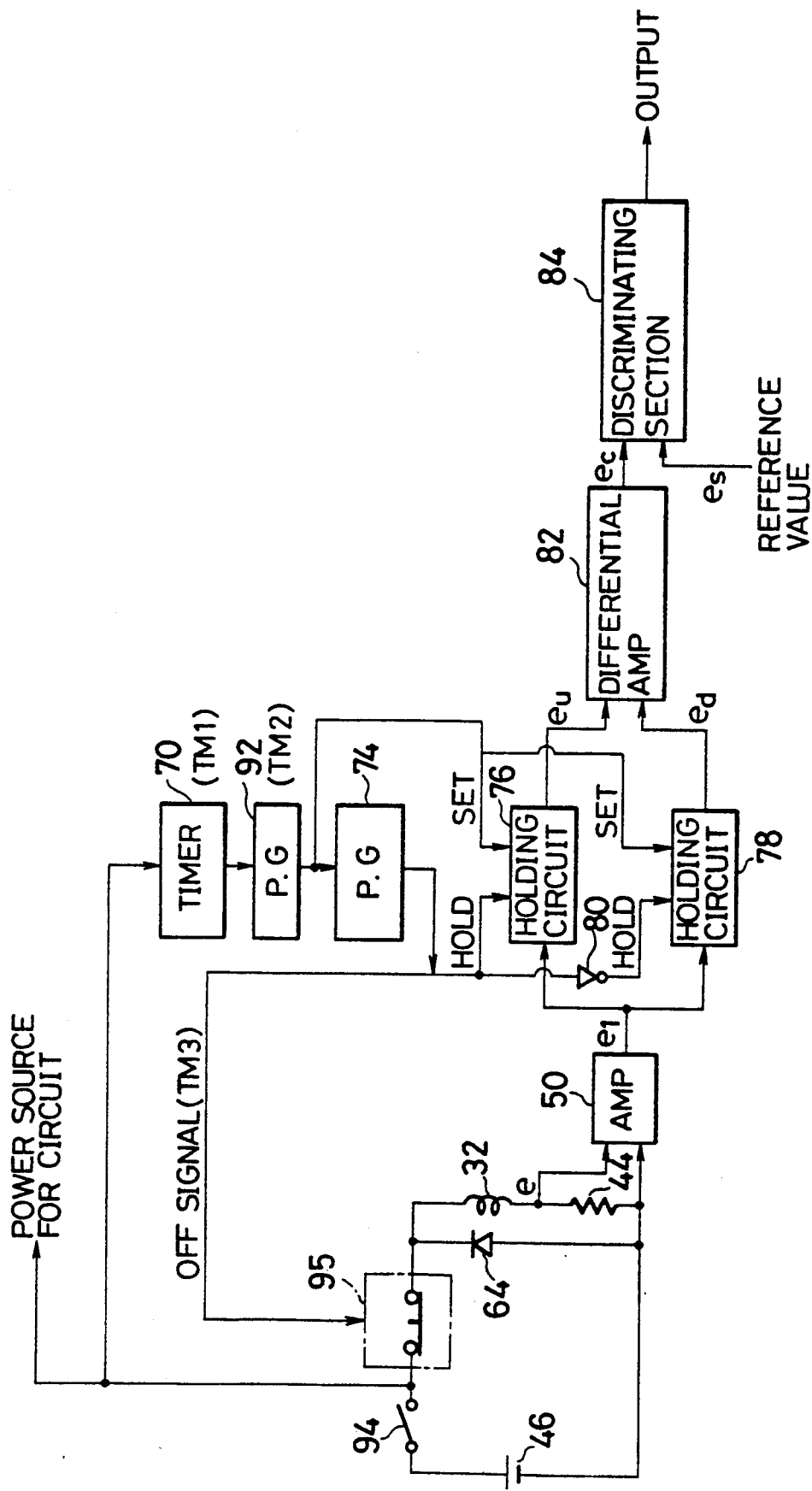
FIG. 16 is a circuit block diagram showing the fifth embodiment of the invention.

FIG. 16 is a circuit block diagram showing the fifth embodiment of the invention and the same parts and components as those shown in the fourth embodiment in FIG. 14 are designated by the same reference numerals and their descriptions are omitted here.

In the fifth embodiment, a main switch 94 to turn on/off the solenoid and a deenergizing switch 95 to check the operation of the solenoid are provided in place of the switch control section 66 and switch 68 in the fourth embodiment in FIG. 14, thereby enabling the apparatus to be used for the conventional simple system which doesn't use a sequencer or the like.

In the fifth embodiment, the discriminating section 84 is provided in a manner similar to the first embodiment in FIG. 7 in place of the movable iron core position calculating section 85 in FIG. 14.

According to the fifth embodiment, the ON command from the outside is unnecessary. When the main switch 94 is turned on, a current is supplied to the coil 32 to thereby energize the solenoid. The operation is periodically checked at a predetermined period (the same as $TM_{20}$ in FIG. 15A in the fourth embodiment) after the elapse of the predetermined time $TM_1$. Thus, if it is determined that the position of the movable iron core is abnormal (the movable iron core didn't operate), an abnormality detection signal is generated.

Figure 17:
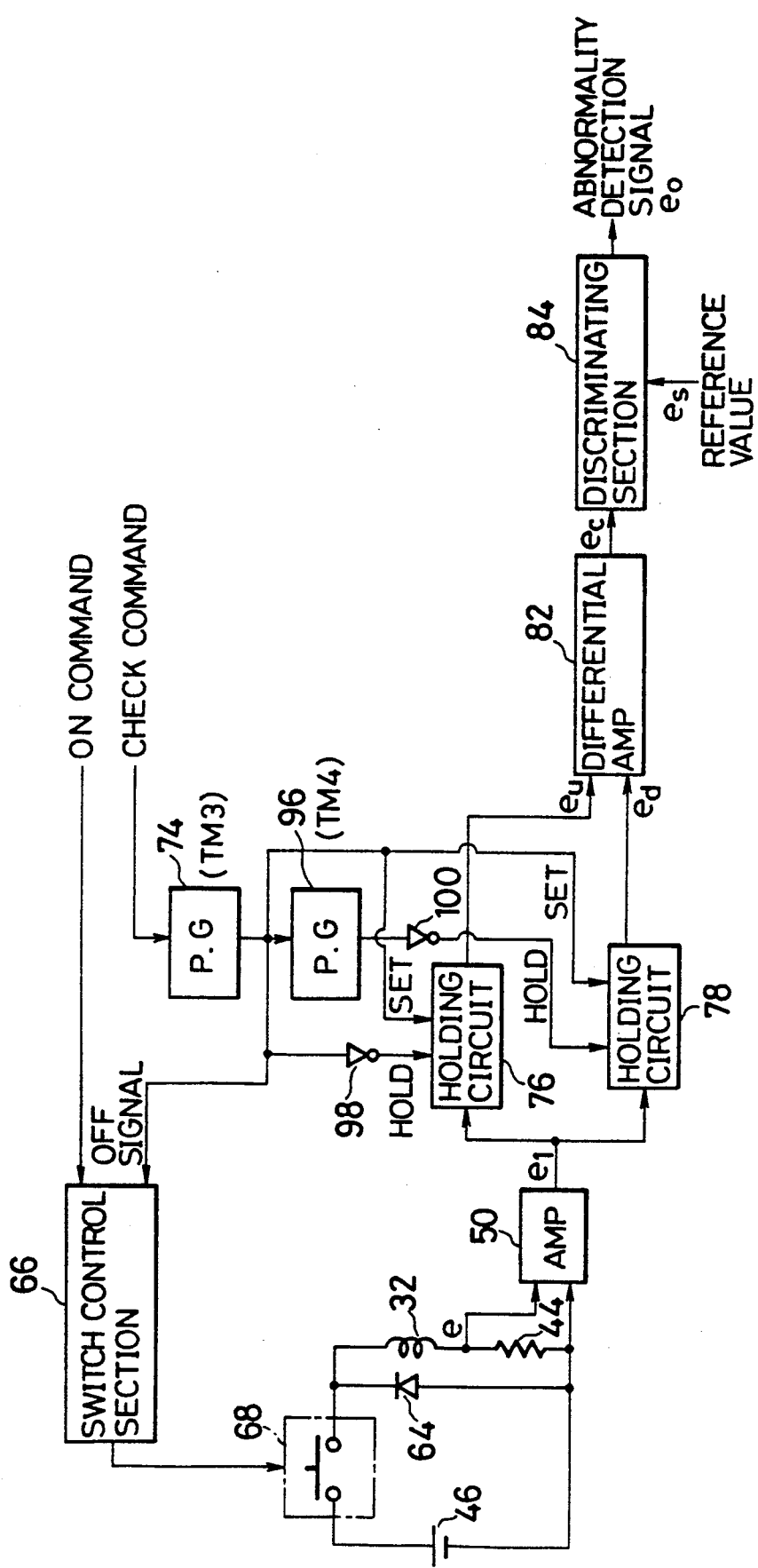
FIG. 17 is a circuit block diagram showing the sixth embodiment of the invention.

FIG. 17 is a circuit block diagram showing the sixth embodiment of the invention and the same parts and components as those shown in the first embodiment in FIG. 7 are designated by the same reference numerals and their descriptions are omitted here.

The sixth embodiment differs from the first embodiment in FIG. 7 with respect to the elimination of the timer 70 and gate circuit 72, and with respect to the provision of a pulse generator 96 for generating a detection pulse of a pulse width $TM_4$ and an inverter 98 for inverting the OFF signal which is generated from the pulse generator 74 and for using as a holding signal of the holding circuit 76 and an inverter 100 for inverting a detecting pulse which is generated from the pulse generator 96 and for using as a holding signal of the holding circuit 78.

In the sixth embodiment, a coil current waveform when the solenoid is temporarily deenergized is used and a leading waveform after completion of the deenergization of the predetermined time width ($TM_3$) is checked.

The operation of the sixth embodiment in FIG. 17 will now be described with reference to time charts of FIGS. 18A to 18E. After the solenoid has been energized by turning on the switch 68 by the ON command, when the check command is supplied, the pulse generator 74 generates the OFF signal of the pulse width $TM_3$. The switch control section 66 turns off the switch 68 for only the period of time of the OFF signal, thereby temporarily deenergizing the solenoid. The switch 68 is again turned on after the elapse of the time $TM_3$.

Figure 18:
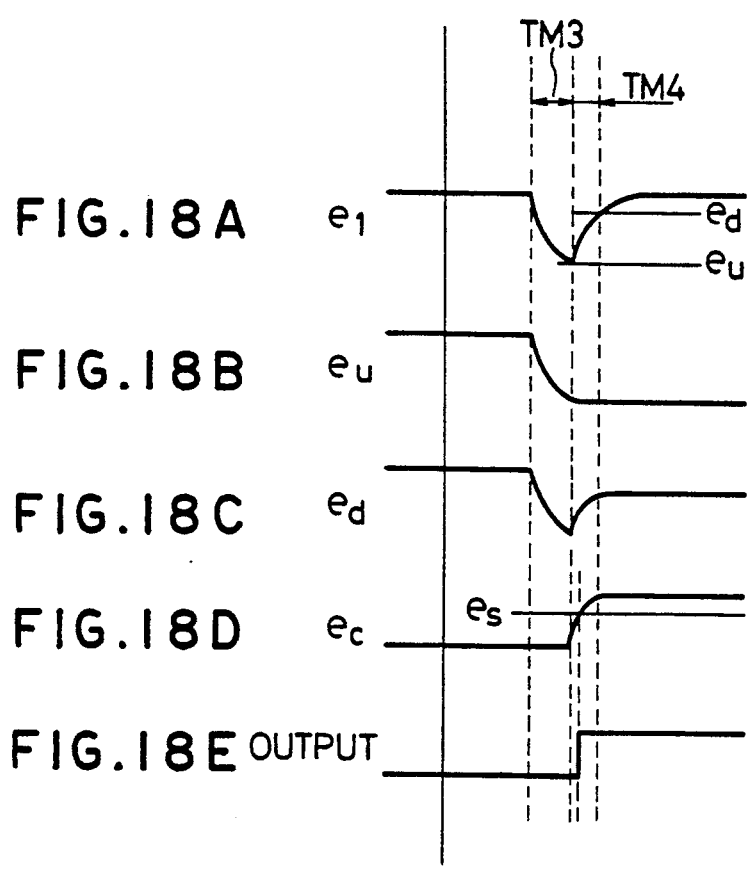
FIGS. 18A to 18E are time charts showing signal waveforms in respective sections in FIG. 17.

Consequently, a waveform of the output voltage $e_1$ of the amplifier 50 corresponding to the current waveform flowing in the coil 32 is as shown in FIG. 18A.

The holding circuit 76 holds the lowest drop value of the voltage $e_1$ as shown in FIG. 18B in response to the trailing edge of the OFF signal. The holding value is set to $e_u$.

The pulse generator 96 generates a detecting pulse of the pulse width $TM_4$ from the above time point. In response to the trailing edge of the detecting pulse, the holding circuit 78 holds the rising voltage $e_1$ as shown in FIG. 18C. The holding value is set to $e_d$.

The differential amplifier 82 generates the signal $e_c$ shown in FIG. 18D and having the level corresponding to the difference between the voltages $e_u$ and $e_d$. The discriminating section 84 compares the signal $e_c$ with the reference value $e_s$. When $e_c > e_s$, the discriminating section 84 generates the abnormality detection signal $e_0$ at the H level as shown in FIG. 18E.

The sixth embodiment is suitable in the case where a fluctuation of the coil resistance, power source voltage, or the like is small. In the above case as well, the accuracy can be raised by correcting the reference value $e_s$ in a manner similar to the second embodiment in FIG. 11.

Figure 19:
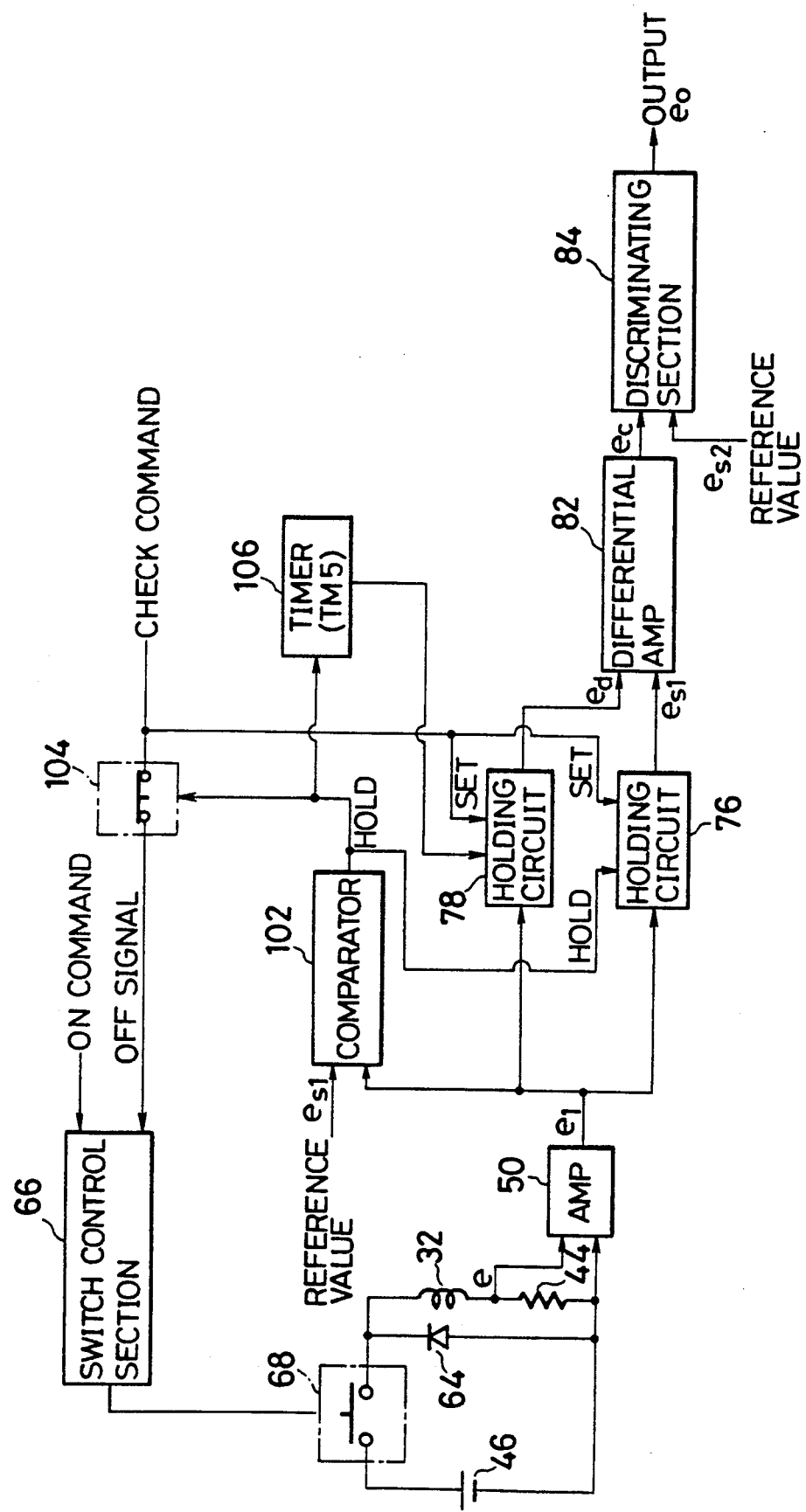
FIG. 19 is a circuit block diagram showing the seventh embodiment of the invention.

FIG. 19 is a circuit block diagram showing the seventh embodiment of the invention and the same parts and components as those shown in the first embodiment in FIG. 7 are designated by the same reference numerals and their descriptions are omitted here.

Figure 20A:
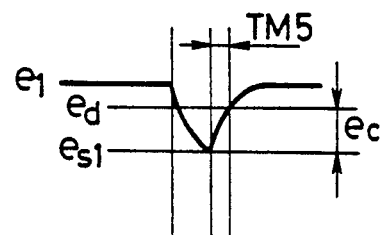
FIGS. 20A to 20B are time charts showing signal waveforms in respective sections in FIG. 19.
Figure 20B:
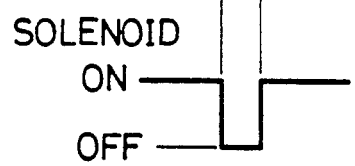

In the 7th embodiment, the check command is used as an OFF signal by passing through a normally closed switch 104. After the solenoid has been deenergized, when the output voltage $e_1$ of the amplifier 50 has dropped to a reference value $e_{s1}$ as shown in FIG. 20A, the normally closed switch 104 is turned off by an output of a comparator 102, the solenoid is again turned on as shown in FIG. 20B, and the input voltage $e_1 = e_{s1}$ at that time point is held by the holding circuit 76.

At the same time, the timer 106 operates and generates a pulse after the elapse of the set time $TM_5$, thereby allowing the holding circuit 78 to hold the voltage $e_1$ which is increasing. The holding value is set to $e_d$.

The differential amplifier 82 generates the signal $e_c$ according to the difference between the voltages $e_{s1}$ and $e_d$. The discriminating section 84 compares the signal $e_c$ with the reference value $e_s$ to thereby judge the position of the movable iron core. If $e_c < e_s$, consequently, the discriminating section 84 generates an abnormality detection signal.

According to the seventh embodiment, the checking precision is improved more than that in the case of the sixth embodiment in FIG. 17. On the other hand, the accuracy can further be improved by correcting the reference values $e_{s1}$ and $e_s$ as shown in the second embodiment in FIG. 11.

Figure 21:
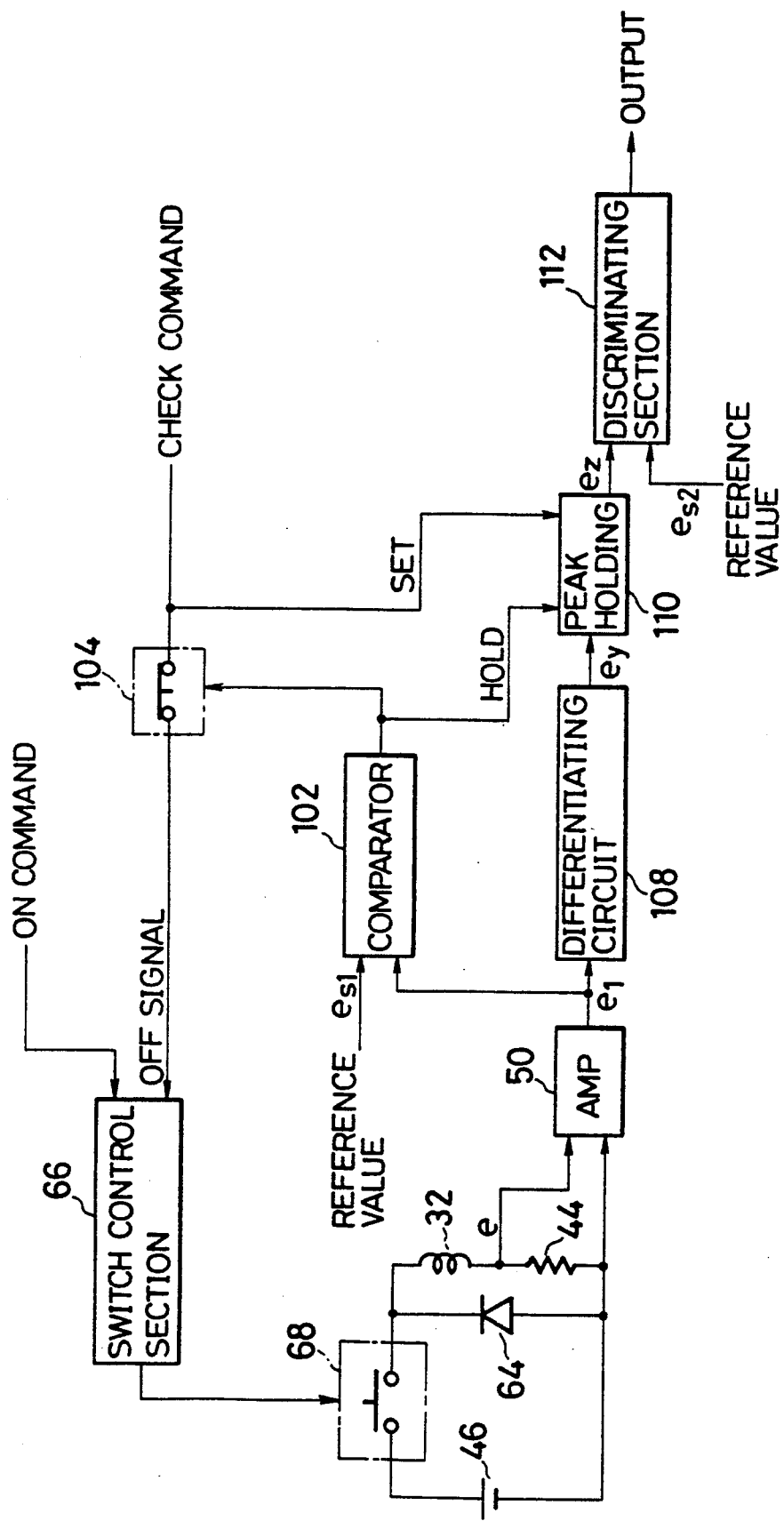
FIG. 21 is a circuit block diagram showing the eighth embodiment of the invention.

Although the above first to seventh embodiments have fundamentally been based on a method of detecting a change in magnitude of the current value in a unit time, a time-dependent gradient of the current can be also detected as shown in the eighth embodiment of FIG. 21.

The operation of the eighth embodiment will now be described with reference to waveform diagrams of FIGS. 22A to 22G.

After the switch 68 has been turned off by the check command, when the output voltage $e_1$ of the amplifier 50 has dropped to the reference value $e_{s1}$, the normally closed switch 104 is turned off by the output of the comparator 102 and the switch 68 is again turned on. The above operations are the same as those in the seventh embodiment shown in FIG. 19.

In the eighth embodiment, the output voltage $e_1$ of the amplifier 50 is always differentiated by a differentiating circuit 108 and a peak value of a differentiation signal $e_y$ is held by a peak holding circuit 110 as shown in FIG. 22G.

A holding value $e_z$ of the differentiation signal $e_y$ is compared with a reference value $e_{s2}$ by a discriminating section 112. If $e_z > e_{s2}$, the discriminating section 112 generates an abnormality detection signal $e_0$.

In the eighth embodiment, since a current response waveform is of the primary delay type, there is the same relation.

Although the eighth embodiment relates to the detecting method of checking when the switch 68 is again turned on, the inclination of the current response waveform can be also checked just after the deenergization as shown in the first to seventh embodiments.

FIG. 23 is a circuit diagram showing only the portions near the current supplying section to the coil 32 in the ninth embodiment of the invention.

According to the ninth embodiment, the deenergization of the solenoid upon switching from ON to OFF of the switch 68 is rapidly executed. The switch 68 has ordinarily been switched to the side of a varistor 114 as shown in the diagram. In the ordinary on/off operation by the ON command, the solenoid is promptly deenergized through the varistor 114. Only when the checking operation is executed by turning off the switch 68 by the check command, a change-over switch 116 is switched to the side of the diode 44, thereby allowing the solenoid to be gently deenergized.

Figure 24:
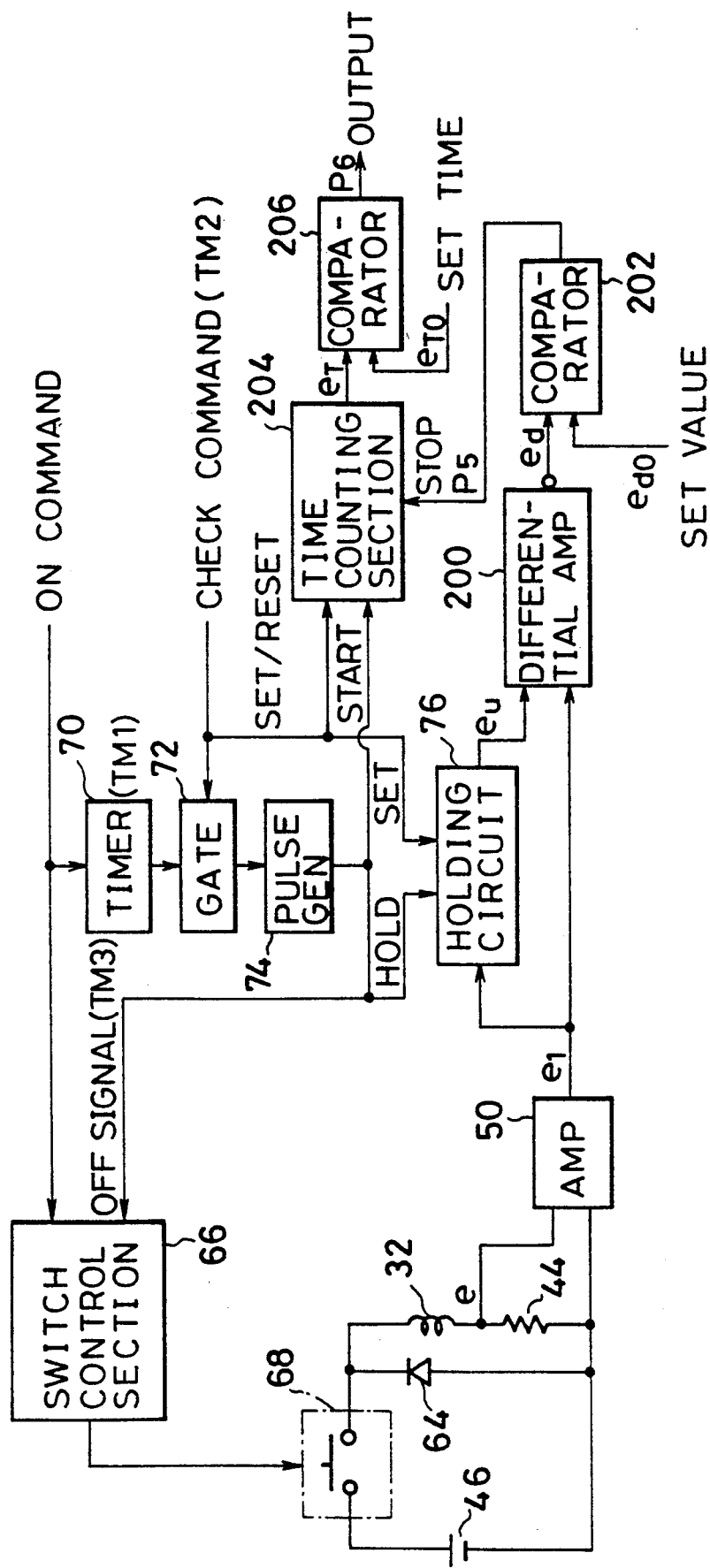
FIG. 24 is a circuit block diagram showing the tenth embodiment of the invention.

FIG. 24 is a circuit block diagram showing the tenth embodiment of the invention and the same parts and components as those shown in the first embodiment in FIG. 7 are designated by the same reference numerals and their descriptions are omitted here.

In the tenth embodiment, after the solenoid has been energized, a time when a change amount of the waveform of the current flowing in the coil 32 when the solenoid has temporarily been deenergized by shutting off the current supply to the coil 32 has reached a predetermined amount is measured, thereby checking the operating state.

Therefore, the output signal $e_1$ of the amplifier 50 according to the current of the coil 32 by the current detecting resistor 44 is held by the holding circuit 76 in response to the leading edge of the OFF signal from the pulse generator 74. A differential amplifier 200 generates a voltage signal $e_d$ corresponding to the difference between the holding output $e_u$ of the holding circuit 74 and the output voltage $e_1$ of the amplifier 50 during the deenergization. The voltage signal $e_d$ from the differential amplifier 200 is compared with a preset reference value $e_{d0}$ by a comparator 202. When $e_d \geq e_{d0}$, the comparator 202 generates a high "H" level signal.

A time counting section 204 starts the time counting operation in response to the leading edge of the OFF signal from the pulse generator 74 and stops the time counting operation in response to the leading edge of an output signal of the comparator 202, thereby obtaining a measurement value $e_T$.

The measurement value $e_T$ measured by the time counting section 204 is compared with a set value $e_{T0}$ corresponding to a preset reference time by a comparator 206. When $e_T > e_{T0}$, the comparator 206 generates a signal at the "H" level indicating that the solenoid has normally operated.

The operation of the tenth embodiment will now be described also with reference to time charts of FIGS. 25A to 25J.

First, when the ON command to make the solenoid operative is set to "H" at time $t_1$ as shown in FIG. 23A, the switch control section 66 turns on the switch 68, the exciting current starts to flow in the coil 32 from the DC power source 46, and a detection voltage e according to the current value is generated across the resistor 44.

Figure 25:
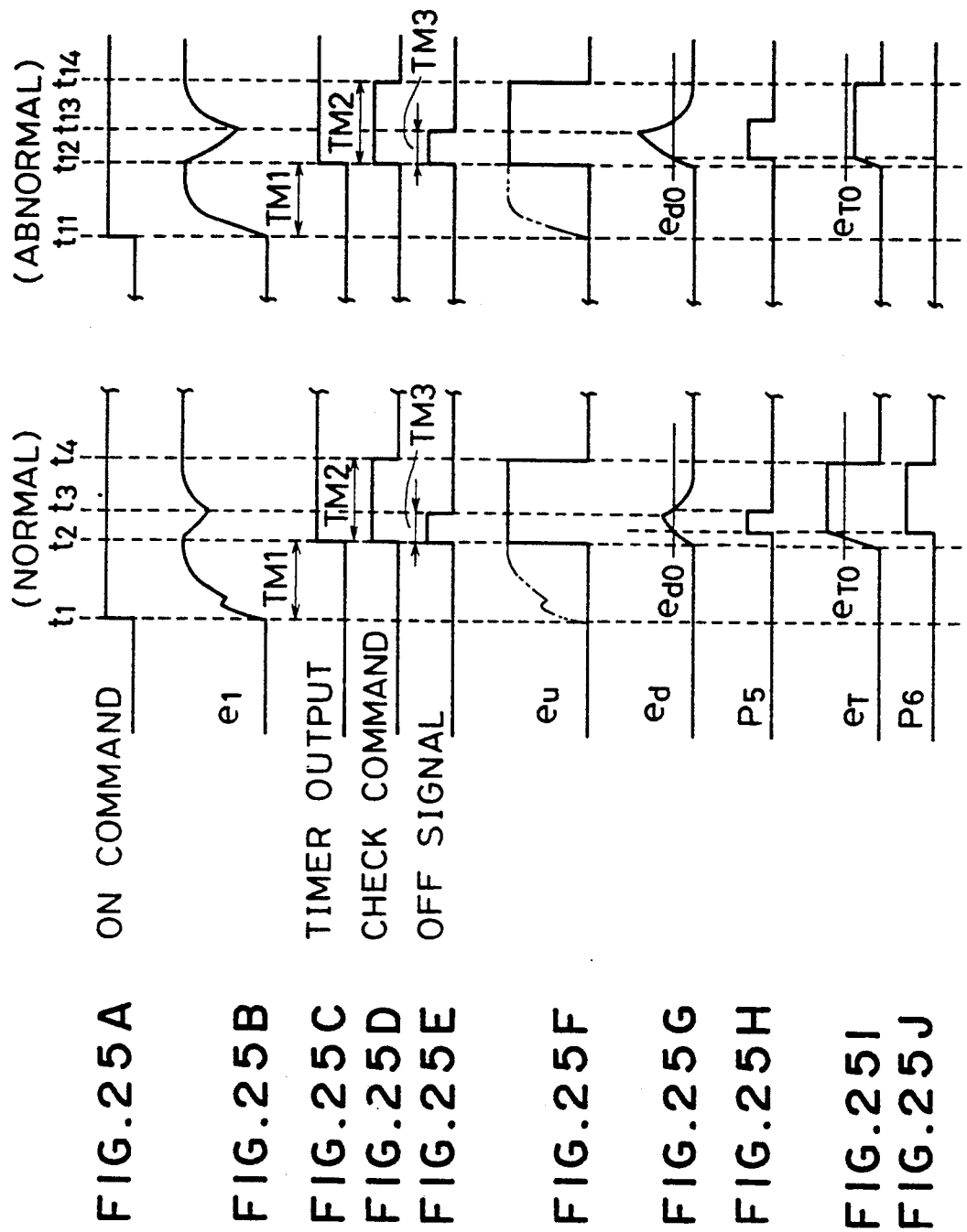
FIGS. 25A to 25J are time charts showing signal waveforms in respective sections in FIG. 24.

The generation voltage e of the resistor 44 is amplifier by the amplifier 50 and the output voltage $e_1$ changes as shown in FIG. 25B.

On the other hand, the timer 70 is made operative by the ON command. After the elapse of the set timer time $TM_1$, the output signal of the timer 70 is set to "H" as shown in FIG. 25C.

Therefore, the gate circuit 72 opens the gate and accepts the check command of the predetermined time width $TM_2$ and outputs the same. The pulse generator 74 is made operative at leading time point $t_2$ of the check command and generates the OFF signal of the pulse width $TM_3$ as shown in FIG. 25E.

When the OFF signal is generated and is set to "H", the switch control section 66 turns off the switch 68 for only the period of time of the pulse width $TM_3$. Therefore, the current flowing in the coil 32 suddenly decreases because it is constructed by only the holding current due to the self accumulated energy. The detection voltage $e_1$ according to the current value drops as shown in FIG. 25B and becomes minimum at trailing time point $t_3$ of the OFF signal.

The pulse width $TM_3$ of the OFF signal is set to a short time width such that the movable iron core hardly moves even if the solenoid has been deenergized by shutting off the power supply to the coil 32.

The holding circuit 76 is set at leading time point $t_2$ of the check command, thereby immediately holding the voltage $e_1$ at that time point in response to the leading edge of the OFF signal. Therefore, the holding output $e_u$ of the holding circuit 76 is set to the saturation level from time $t_2$ as shown in FIG. 25F.

The resetting of the time counting section 204 is cancelled and set at leading time point $t_2$ of the check command, thereby immediately starting the time counting operation in response to the leading edge of the OFF signal.

After that, the differential amplifier 200 generates the voltage signal $e_d$ corresponding to the difference between the holding output $e_u$ of the holding circuit 76 and the output voltage $e_1$ of the amplifier 50 as shown in FIG. 25G. The voltage signal $e_d$ is compared with the reference value $e_{d0}$ by the comparator 202. When $e_d \geq e_{d0}$, the comparator 202 generates an "H" signal as shown in FIG. 25H.

The time counting operation of the time counting section 204 is stopped in response to the leading edge of the output signal of the comparator 202. Consequently, the time measurement value $e_T$ by the time counting section 204 is as shown in FIG. 25I. The measurement value $e_T$ is compared with a reference value $e_{T0}$ corresponding to the reference time by the comparator 206. If $e_T > e_{T0}$, an output signal $P_6$ is set to "H" as shown in FIG. 25J, thereby indicating that the movable iron core has correctly been adsorbed.

If $e_T \leq e_{T0}$ as shown in a time interval between $t_{11}$ a $t_{14}$, an output $T_6$ is held to "L" as shown in FIG. 25J, thereby indicating an abnormal state in which the movable iron core is not adsorbed.

When the check command trails at time $t_4$ of the time width $TM_2$, the holding value $e_u$ of the holding circuit 76 and the measurement value $e_T$ of the time counting section 204 are reset. The output signal $P_6$ of the comparator 206 is also returned to "L" from "H".

When the check command is again supplied after that, the same operations as those mentioned above are repeated and the operating state can be checked at any time and an arbitrary number of times during the operation of the solenoid.

As shown in FIG. 10, the inductance L of the coil 32 changes in a manner such that it is smallest when the movable iron core is located at the initial position (position which is farthest from the fixed iron core) and that it is maximum when the movable iron core is located at the adsorbing position (position which is closely adhered to the fixed iron core). Therefore, a change amount (dropout amount) of the voltage waveform upon deenergization differs depending on the inductance L. When the movable iron core is located at the initial position, the inductance is small as shown in FIG. 9A, so that such a change amount largely drops. On the other hand, when the movable iron core is located at the adsorbing position, the inductance is large as shown in FIG. 9B, so that the dropout amount $e_c$ is small.

Therefore, by measuring a time which is required for the current response waveform to change by only a predetermined value $e_{d0}$ at the time of the trailing of the response waveform of the current flowing in the coil 32 due to the temporary deenergization or at the time of the releading after the deenergization, the position of the movable iron core can be judged by the time measurement value because such a time differs depending on the position of the movable iron core in a manner such that the time is short when the movable iron core is located at the initial position and the time is long when the movable iron core is located at the adsorbing position.

Although the tenth embodiment in FIG. 24 has been described with respect to the example in which two positions of the initial position and adsorbing position are discriminated, if the time measurement value $e_T$ by the time counting section 204 is compared with a plurality of set time reference values of different lengths, positions of a plurality of stages of the movable iron core can be also detected, a resolution of the position detection rises, a precision is improved, and a degree of abnormality or normality can be detected.

If the measurement value $e_T$ is generated in a stepless manner, the position of the movable iron core can be also continuously measured.

Figure 26:
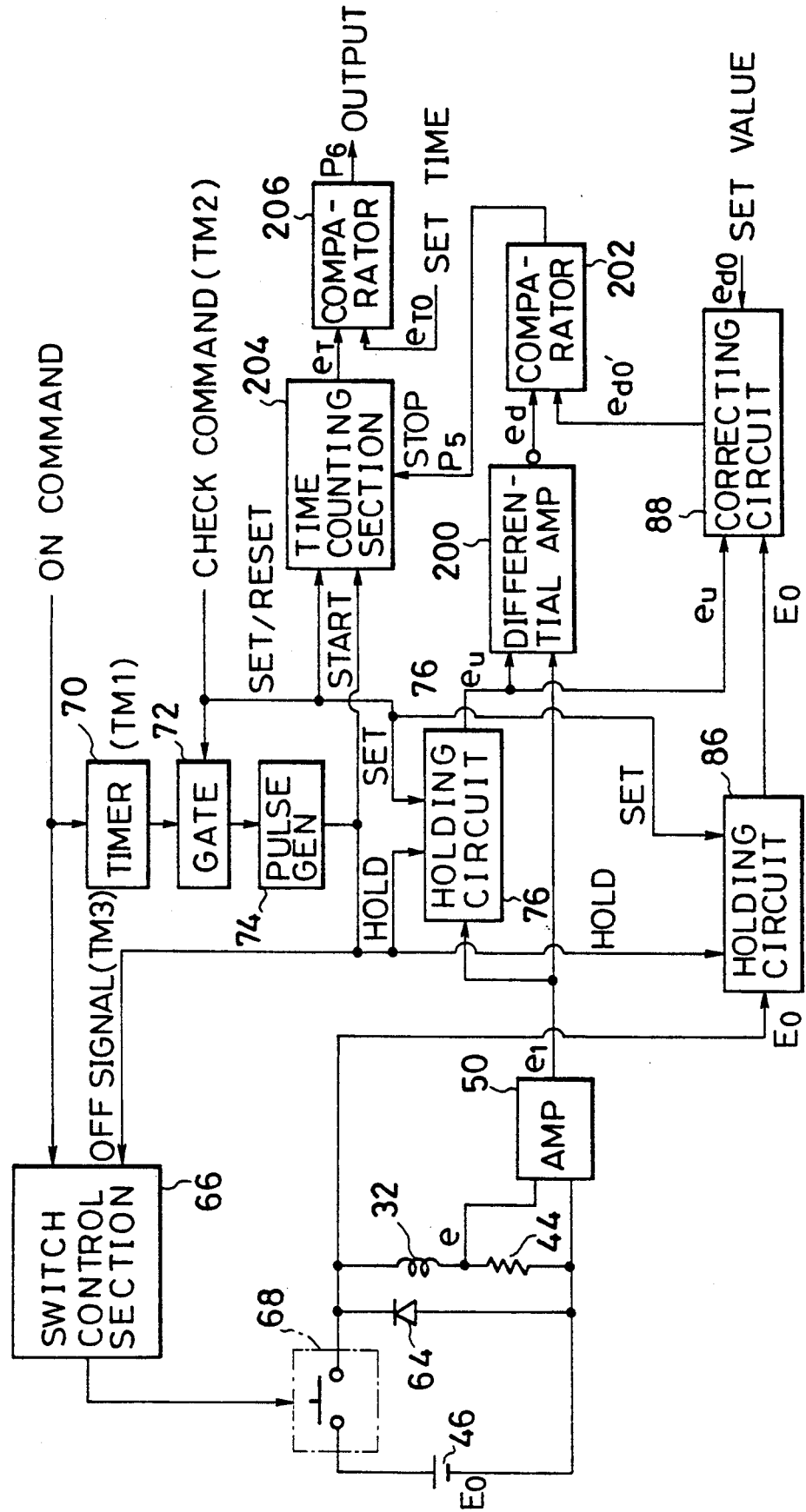
FIG. 26 is a circuit block diagram showing the eleventh embodiment of the invention.

FIG. 26 is a circuit block diagram showing the eleventh embodiment of the invention and the same parts and components as those shown in the tenth embodiment in FIG. 24 are designated by the same reference numerals and their descriptions are omitted here.

According to the eleventh embodiment, the holding circuit 86 and correcting circuit 88 to correct the reference value $e_{d0}$ are additionally provided to the tenth embodiment in FIG. 24. The constructions and operations of the holding circuit 86 and correcting circuit 88 are the same as those in the second embodiment in FIG. 11. The set value $e_{d0}$ can be corrected in correspondence to a change in current value due to an increase in temperature of the coil 32 or a fluctuation of the power source voltage and the correct detection point can be obtained.

Figure 27:
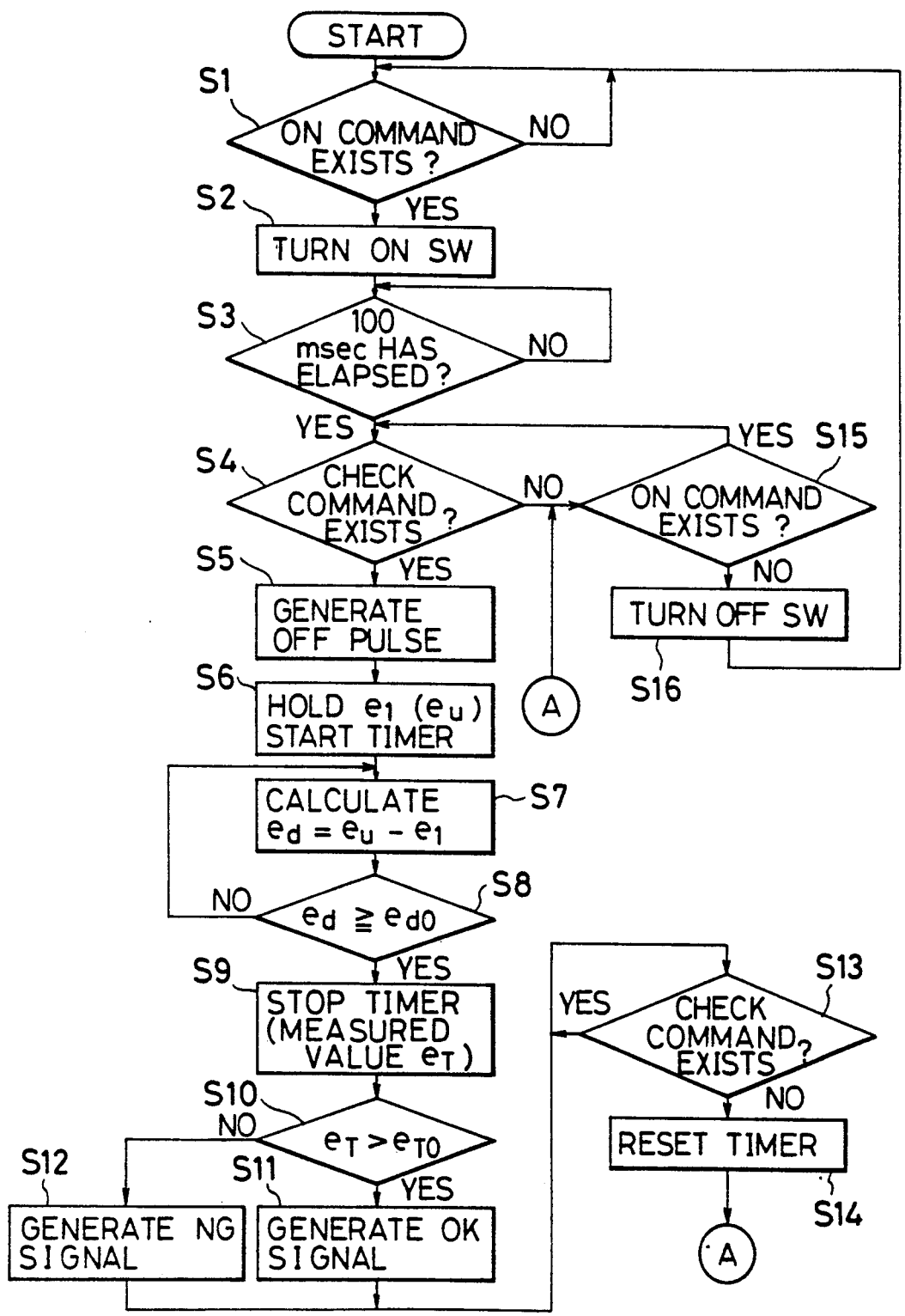
FIG. 27 is a flowchart showing the tenth embodiment of the invention in the case of using a microcomputer.

FIG. 27 shows a flowchart of the processes shown in the tenth embodiment in FIG. 24, to check the operating state of the solenoid such that the time which is required until the current waveform during the deenergization reaches the predetermined value has been measured, which are executed by the same microcomputer 90 as that shown in the third embodiment in FIG. 12.

In FIG. 27, when the processing routine is started, a check is made in step S1 to see if the ON command has been supplied or not. If YES, the switch 68 is turned on in step S2 and the exciting current is supplied to the coil 32. In the next step S3, a check is made to see if a predetermined time, for instance, 100 msec which is required for the movement of the movable iron core of the solenoid has elapsed or not. If YES, step S4 follows and a check is made to see if the check command has been supplied or not.

If it is determined that there is no ON command in step S15 before the check command is supplied in step S4, the processing routine advances to step S16 and the switch 68 is turned off and the current supply to the coil 32 is shut off. Thereafter, the processing routine is returned to step S1 and the apparatus waits for the input of the next ON command.

If it is determined in step S4 that the check command has been supplied after the elapse of 100 msec, step S5 follows and the OFF pulse of a predetermined short pulse width is generated and the switch 68 is turned off only for the period of time of the generation of the OFF pulse.

In step S6, the A/D conversion value of the output voltage $e_1$ from the amplifier 50 is held in response to the leading edge of the OFF pulse and the holding value $e_u$ is obtained. Further, the time counting operation by the internal timer is started.

In the next step S7, a calculation of $e_d = e_u - e_1$ is executed. The result of the calculation is compared with the set value $e_{d0}$ in step S8. The above calculation and comparison are repeated until $e_d \geq e_{d0}$.

If $e_d = e_{d0}$ is determined in step S8, step S9 follows and the time counting operation by the timer is stopped and the measurement value $e_T$ is obtained. The measurement value $e_T$ is compared with the reference time $e_{T0}$ in step S10. Thus, if $e_T > e_{T0}$, step S11 follows and it is determined that the movable iron core of the solenoid has correctly been adsorbed, so that a normality signal OK is generated. If NO in step S10, step S12 follows and it is decided that the movable iron core is not adsorbed, so that an abnormality signal NG is generated.

After that, a check is made in step S13 to see if the check command has been supplied or not. If NO, the measurement value $e_T$ of the timer is reset in step S14 and the processing routine is returned to step S15 and the presence or absence of the ON command is checked. If YES, the apparatus waits for the input of the next check command in step S4. If there is no ON command in step S15, the switch 68 is turned off in step S16 and the apparatus waits for the input of the next ON command in step S1.

Figure 28:
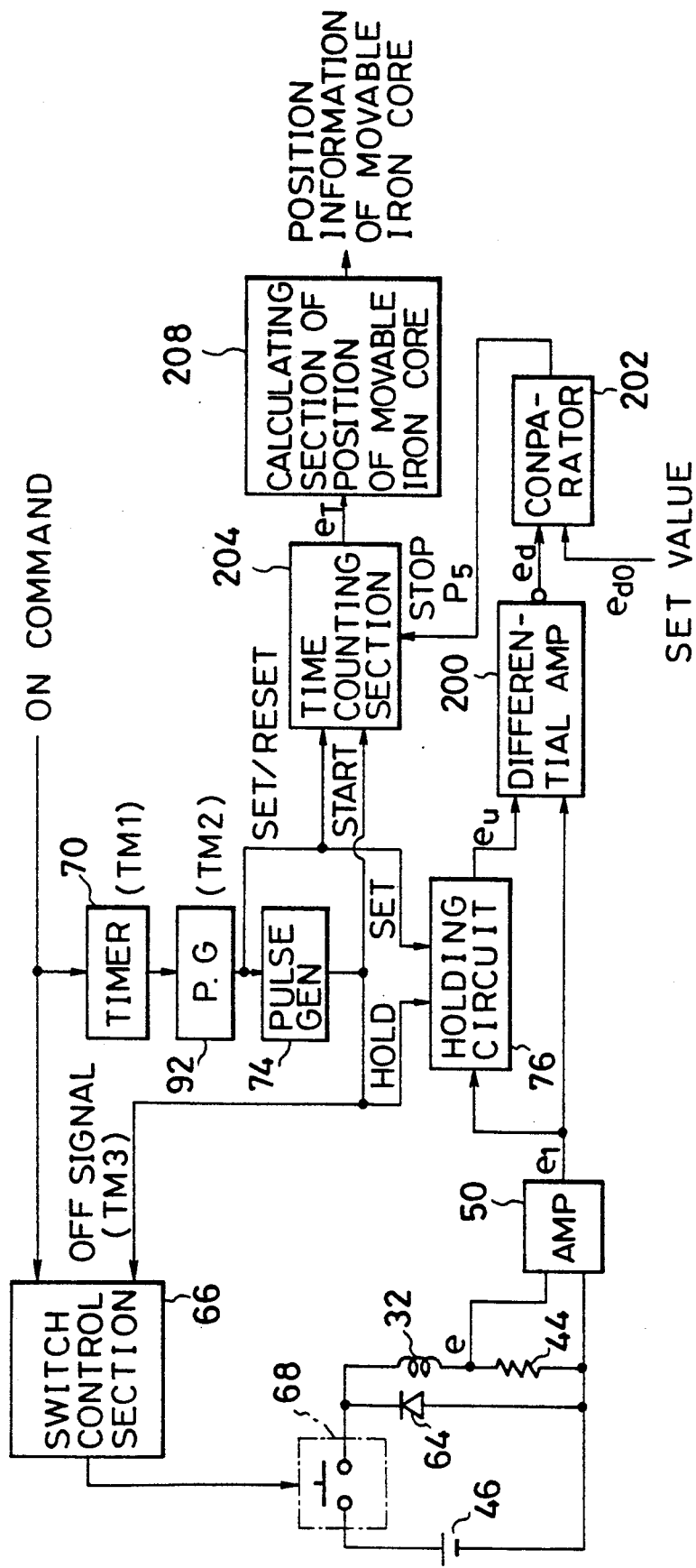
FIG. 28 is a circuit block diagram showing the twelfth embodiment of the invention.

FIG. 28 is a circuit block diagram showing the twelfth embodiment of the invention and the same parts and components as those in the tenth embodiment in FIG. 24 are designated by the same reference numerals and their descriptions are omitted here.

In the 12th embodiment, after the solenoid has been energized, the operation is automatically periodically checked at a predetermined time width and the result is generated as an analog value.

In FIG. 28, the 12th embodiment differs from the 10th embodiment in FIG. 24 only with respect to the provision of the pulse generator 92 to generate a check command pulse in place of the gate circuit 72 such that the input of the check command from the outside is made unnecessary and the provision of a movable iron core position calculating section 208 in place of the comparator 206 such that movable iron core position information is generated as an analog signal.

According to the 12th embodiment, when the ON command is supplied from the outside, the switch control section 66 turns on the switch 68, thereby starting the current supply to the solenoid coil 32 from the power source 46 and also making the timer 70 operative.

The timer 70 makes the pulse generator 92 operative after the elapse of the set time $TM_1$. The pulse generator 92 generates a check command pulse of a pulse width $TM_2$ at a predetermined period.

In response to the leading edge of the check command pulse, the holding circuit 76 is set and the data retrieval is started and the pulse generator 74 is also made operative.

Therefore, the pulse generator 74 generates the OFF signal pulse having a width $TM_3$ and a period $TM_{20}$. The switch control section 66 turns off the switch 68 for only the period of time $TM_3$, thereby temporarily deenergizing the solenoid.

At this time, the response waveform of the current flowing in the coil 32 is detected as a voltage $e_1$ by the current detecting resistor 44 and amplifier 50. The voltage $e_1$ just before the switch 68 is turned off is held by the holding circuit 76. During the decrease in voltage $e_1$, a time which is required until the voltage $e_d = e_u - e_1$ is equal to the reference value $e_{d0}$ is measured by the time counting section 204 and is supplied to the movable iron core position calculating section 208. The position information of the movable iron core of the solenoid is calculated and generated.

Subsequently, in response to the trailing edge of the check command pulse from the pulse generator 92, the holding circuit 76 and time counting section 204 are reset and the checking process of one time is finished. However, since the pulse generator 92 periodically generates check command pulses at the period $TM_{20}$, the next checking process is soon again executed and the movable iron core position information is periodically generated. The operation by the pulse generator 74 is fundamentally the same as that in the fourth embodiment in FIG. 14.

Figure 29:
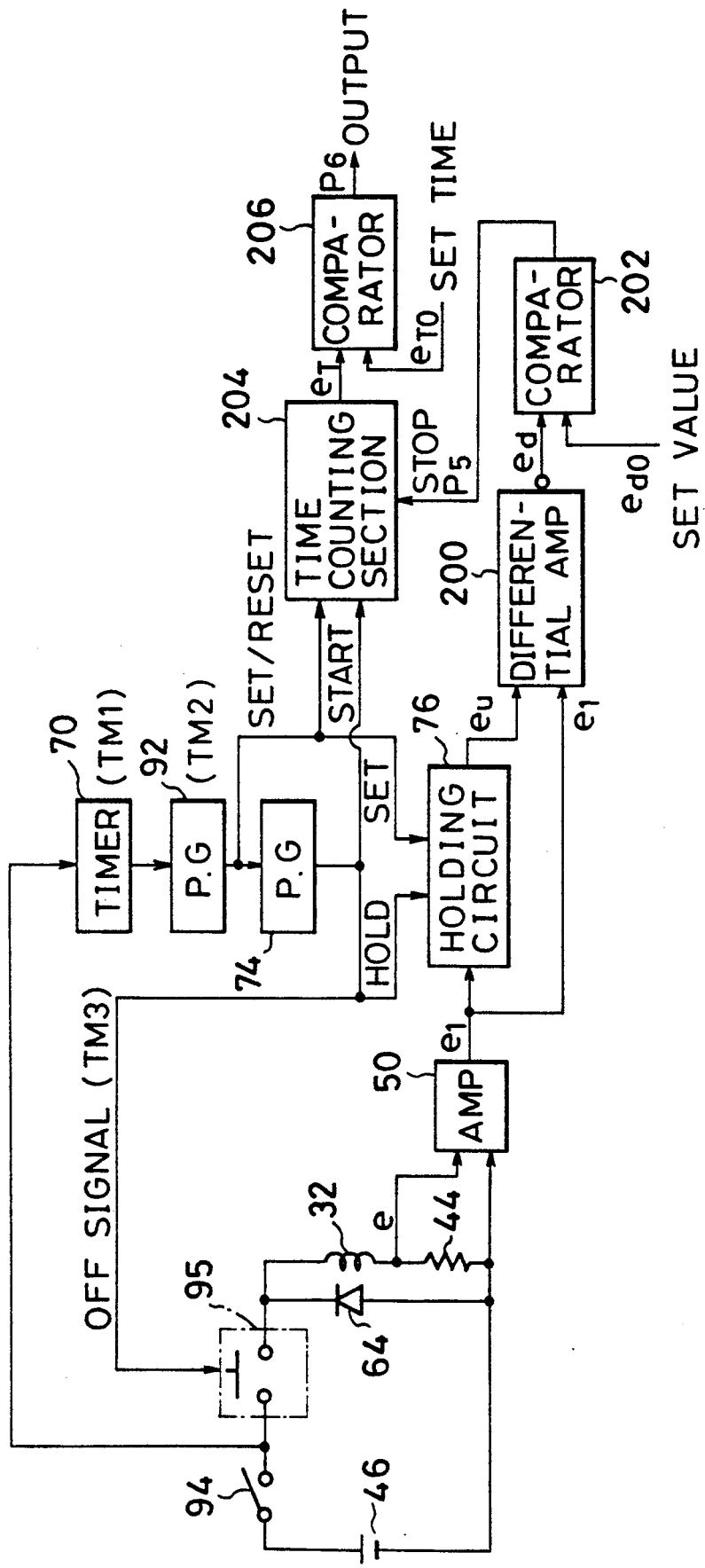
FIG. 29 is a circuit block diagram showing the thirteenth embodiment of the invention.

FIG. 29 is a circuit block diagram showing the thirteenth embodiment of the invention and the same parts and components as those shown in the 12th embodiment in FIG. 28 are designated by the same reference numerals and their descriptions are omitted here.

In the 13th embodiment, the main switch 94 to turn on/off the solenoid and the deenergizing switch (normally closed switch) 95 to check the operation are separately provided, thereby enabling the apparatus to be used in the conventional simple system which doesn't use a sequencer or the like.

The 13th embodiment differs from the 12th embodiment in FIG. 28 with respect to the elimination of the switch control section 66, the provision of the main switch 94 and deenergizing switch 95 and the provision of the comparator 206 in place of the movable iron core position calculating section 208 in a manner similar to the 10th embodiment in FIG. 24.

According to the 13th embodiment, there is no need to input the ON command from the outside. When the main switch 94 is turned on, a current is supplied to the coil 32 to thereby energize the solenoid. The operation in association with the temporary deenergization of the solenoid is periodically checked at a predetermined period $TM_{20}$ after the elapse of the predetermined time $TM_1$. A signal indicative of the operating state of the solenoid is generated. A characteristic portion of the 13th embodiment in FIG. 29 is substantially the same as that in the fifth embodiment in FIG. 16.

Figure 30:
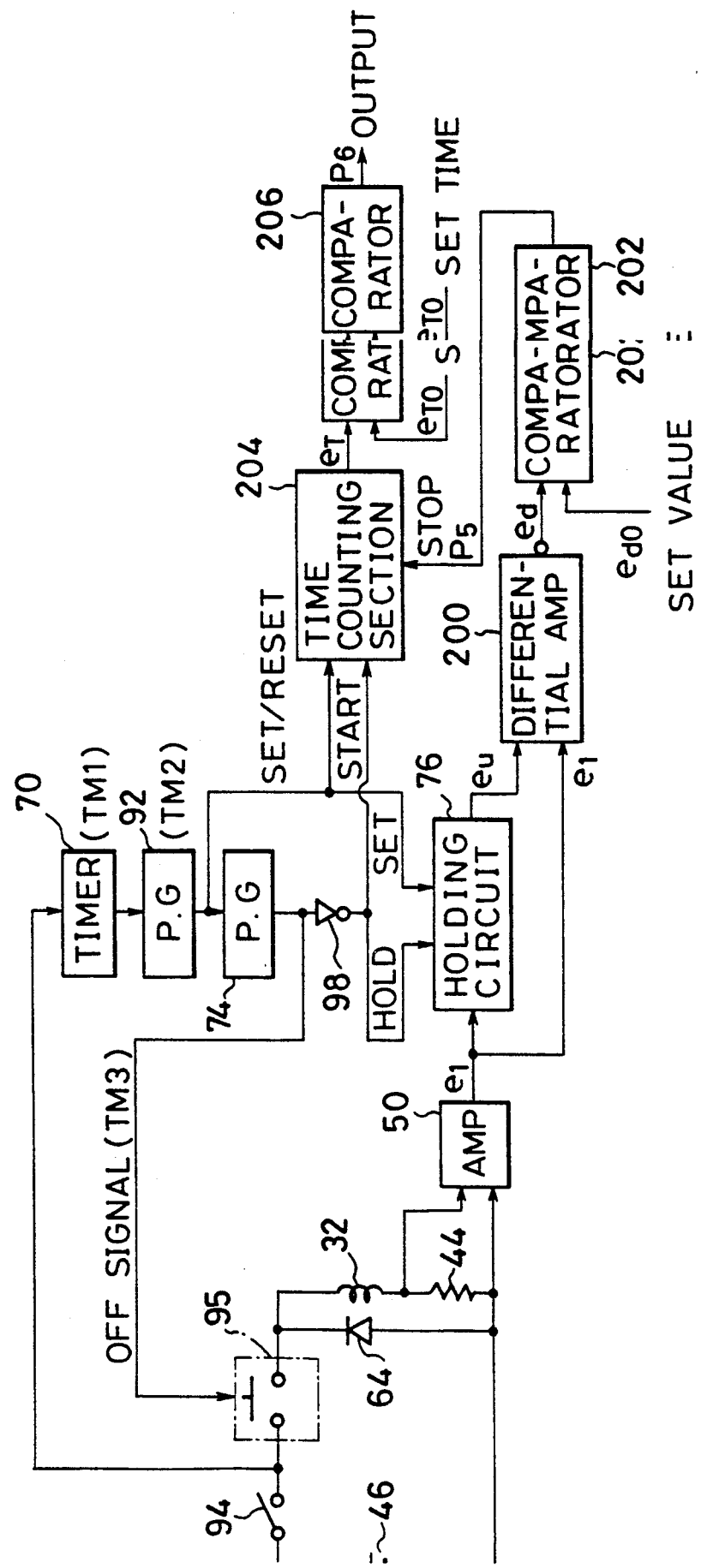
FIG. 30 is a circuit block diagram showing the fourteenth embodiment of the invention.

FIG. 30 is a circuit block diagram showing the fourteenth embodiment of the invention and the same parts and components as those in the 13th embodiment in FIG. 29 are designated by the same reference numerals and their descriptions are omitted here.

The 14th embodiment differs from the 13th embodiment in FIG. 29 in that the OFF signal which is generated by the pulse generator 74 is inverted by the inverter 98 and is used as a holding signal of the holding circuit 76 and a start signal of the time counting section 204 and that the differential amplifier 200 operates only for a period of time when the check command is at the "H" level and the OFF signal is at the "L" level and generates the voltage $e_d = e_1 - e_u$.

According to the 14th embodiment, the coil current waveform when the power source is again turned on after the solenoid was temporarily deenergized is used and the leading waveform after the deenergization of a predetermined time width ($TM_3$) is checked.

Figure 31:
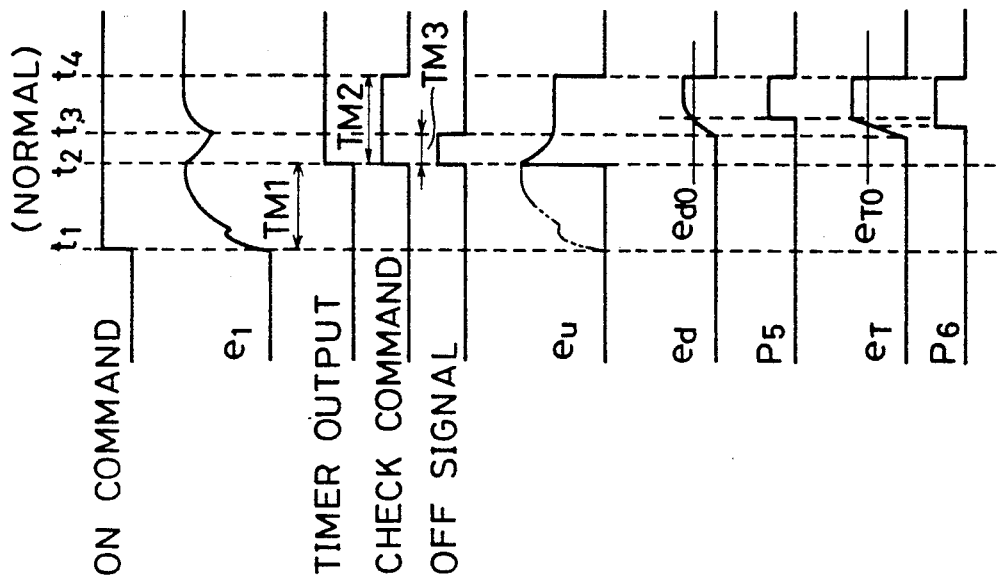
FIGS. 31A to 31J are time charts showing signal waveforms in respective sections in FIG. 30.

The operation will now be described with reference to time charts of FIGS. 31A to 31L. When the ON command is supplied at time $t_1$ as shown in FIG. 31A, the switch 68 is turned on to thereby make the solenoid operative. The output signal of the timer 70 is set to "H" as shown in FIG. 31C at time $t_2$ when the time $TM_1$ has elapsed, thereby making the pulse generator 92 operative.

Therefore, the pulse generator 92 generates a check command pulse of the pulse width $TM_2$ as shown in FIG. 31D. The pulse generator 74 generates an OFF signal of a pulse width $TM_3$ as shown in FIG. 31E.

Consequently, the output voltage $e_1$ of the amplifier 50 corresponding to the waveform of the current flowing in the coil 32 changes as shown in FIG. 31B.

On the other hand, the holding circuit 76 is set at leading time point $t_2$ of the check command and the data fetching is started. The time counting section 204 is set (the reset state is cancelled), thereby setting the apparatus into a standby mode.

Subsequently, the voltage $e_1$ at that time point is held by the holding circuit 76 at time $t_3$ when the OFF signal from the pulse generator 92 trails.

The holding output $e_u$ of the holding circuit 76, therefore, is set to the lowest level due to the deenergization as shown in FIG. 31F.

After that, the differential amplifier 200 generates the voltage signal $e_d$ according to ($e_1 - e_u$) as shown in FIG. 31G. The signal $e_d$ is compared with the reference value $e_{d0}$ by the comparator 202. When $$e_d \geq e_{d0},$$

the comparator 202 generates an "H" level output signal indicative of the normal state as shown in FIG. 31H.

The time counting operation of the time counting section 204 is stopped in response to the leading edge to "H" of the output signal of the comparator 202. The time measurement value $e_T$ shown in FIG. 31I is compared with the signal $e_{T0}$ of the reference time by the comparator 206. If $e_T > e_{T0}$, the output signal $P_6$ shown in FIG. 31J is set to "H", thereby indicating that the movable iron core has correctly been adsorbed.

If $e_T \leq e_{T0}$ as shown in a time interval between $t_{11}$ to $t_{14}$ in FIGS. 31A to 31J, the output signal $P_6$ shown in FIG. 31J is held in the "L" level, thereby indicating an abnormal state in which the movable iron core is not adsorbed.

When the check command rises at time $t_4$ of the pulse width $TM_2$, the holding value $e_u$ of the holding circuit 76 and the measurement value $e_T$ of the time counting section 204 are reset, so that the "H" level output signal $P_6$ of the comparator 206 is reset to "L".

The above checking operations are repeated at a generating period of the check command pulse by the pulse generator 92 during the operation of the solenoid.

Figure 32:
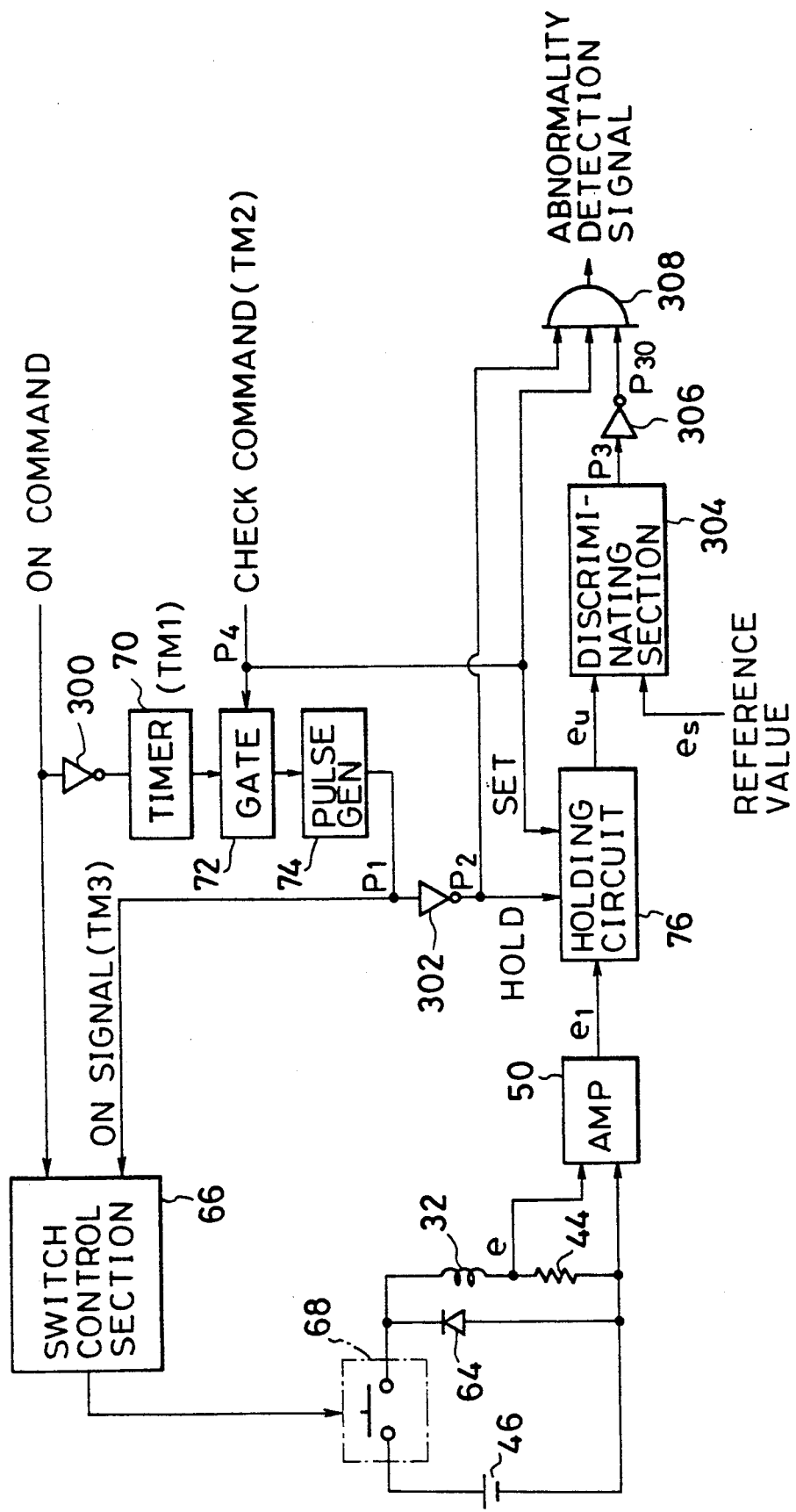
FIG. 32 is a circuit block diagram showing the fifteenth embodiment of the invention.

FIG. 32 is a circuit block diagram showing the fifteenth embodiment of the invention. The 15th embodiment is characterized in that the operating state is checked after deenergization of the turn-off of the solenoid.

In FIG. 32, the current detecting resistor 44 is serially connected to the solenoid coil 32. The diode 64 is further connected in parallel with the serial circuit. A current can be supplied to the serial circuit of the coil 32 and resistor 44 from the DC power source 46 through the switch 68 which is controlled by the switch control section 66. Upon current supply, the diode 64 is nonconductive because it is reversely biased. However, when the switch 68 is turned off, the current due to the energy accumulated in the coil 32 flows through the diode 64.

The ON command which is supplied from the outside is inverted by an inverter 300. When the ON command is stopped, the timer 70 is made operative and an output signal is generated after the elapse of the set time $TM_1$. The gate circuit 72 which accepts a check command $P_4$ and the pulse generator 74 to generate the ON signal $P_1$ by the check command $P_4$ which has passed through the gate circuit 72 are provided after the timer 70.

The terminal voltage $e$ of the resistor 44 according to the magnitude of the exciting current flowing in the coil 32 is amplified by the amplifier 50 and is given as an output signal $e_1$ to the holding circuit 76. The holding circuit 76 holds the output voltage $e_1$ in response to the trailing edge of the ON signal $P_1$. A discriminating section 304 is provided after the holding circuit 76. The discriminating section 304 compares the holding output $e_u$ with the reference value $e_s$ and generates a discrimination signal $P_3$. The discrimination signal $P_3$ is inverted by the inverter 306 and, after that, it is supplied to an AND circuit 308. The AND circuit 308 calculates the AND of the inverted signal of the discrimination signal $P_3$, the check command $P_4$, and an output signal $P_2$ of an inverter 302 and generates an abnormality detection signal.

The operation of the 15th embodiment in FIG. 32 will now be described also with reference to time charts of FIGS. 33A to 33J.

First, when the ON command to energize the solenoid is set to "L" at time $t_1$ as shown in FIG. 33A, the switch control section 66 turns off the switch 68. The current supply to the coil 32 from the DC power source 46 is shut off. The current continuously flows in the coil 32 and resistor 44 through the diode 64 for a short time by the energy accumulated in the coil 32. After that, the solenoid is completely deenergized.

The voltage $e$ according to a value of the current flowing in the coil 32 is generated across the resistor 44. The output voltage $e_1$ which has been amplified by the amplifier 50 changes as shown in FIG. 33B.

On the other hand, when the ON command is set to "L", an output signal of the inverter 300 is set to "H" and the timer 70 is made operative. After the elapse of the set timer time $TM_1$, the output signal of the timer 70 is set to "H" as shown in FIG. 33C. The timer set time $TM_1$ is set to a time which is slightly longer than the time which is required until the voltage $e_1$ is equal to 0.

When the output of the timer 70 is obtained, the gate circuit 72 opens the gate and accepts the check command P$_4$ of the predetermined time width TM$_2$ shown in FIG. 33D and generates it. The pulse generator 74 is made operative at leading time point t$_2$ of the check command P$_4$ and generates the ON signal P$_1$ of the pulse width TM$_3$ as shown in FIG. 33E.

The switch control section 66 turns on the switch 68 for only a period of time when the ON signal P$_1$ is at the "H" level, thereby temporarily energizing the solenoid by supplying the current to the coil 32 from the DC power source 46.

Therefore, the pulse width TM$_3$ of the ON signal P$_1$ is set to a short time width such that the movable iron core hardly moves even if the solenoid is energized by supplying the current to the coil 32.

At this time, the value of the current flowing in the coil 32 is detected by the voltage e which is generated across the resistor 44. The voltage e is amplified by the amplifier 50 and is supplied to the holding circuit 76. The holding circuit 76 is set at leading time point t$_2$ of the check command P$_4$, thereby starting the retrieval of the data.

An output signal of the inverter 302 is set to "H" as shown in FIG. 33F at trailing time point t$_3$ of the ON signal P$_2$. The holding circuit 76 holds the voltage e$_1$ at that time point. Therefore, the holding output e$_u$ of the holding circuit 76 is as shown in FIG. 33G.

The holding value e$_u$ corresponds to the change amount upon leading of the response waveform of the current flowing in the coil 32 by the energization of the period TM$_3$. The change amount is large as the inductance L of the coil 32 is small as will be explained hereinlater. Since the inductance L changes in accordance with the position of the movable iron core, the holding value e$_u$ indicates the position information of the movable iron core.

Accordingly, the holding value e$_u$ is compared with the reference value e$_s$ by the discriminating section 304, thereby judging the position of the movable iron core of the solenoid. If e$_u$ > e$_s$, the discrimination output P$_3$ is set to "H" as shown in FIG. 33H, thereby indicating that the movable iron core has correctly been returned to the initial position. If e$_u$ ≦ e$_s$, the discrimination output P$_3$ is set to "L", thereby indicating an abnormal state in which the movable iron core is not returned to the initial position but remains at the adsorbing position.

In the embodiment, further, the AND of an output P$_{30}$ which is obtained by inverting the discrimination output P$_3$ by the inverter 306 and is shown in FIG. 33I, the check command P$_4$, and the output signal P$_2$ of the inverter 302 is calculated by the AND circuit 308, thereby generating an abnormality detection signal shown in FIG. 33J.

Therefore, as shown on the normal side in a time interval between t$_1$ and t$_4$, if the movable iron core has correctly been returned to the initial position, the abnormality detection signal in FIG. 33J is not generated (L level). On the other hand, as shown in a time interval between t$_{11}$ and t$_{14}$, in an abnormal state in which the movable iron core is not correctly returned but remains at the adsorbing position, the pulse-shaped abnormality detection signal (H level) is generated.

After that, if the check command is turned off at time t$_4$ or t$_{14}$, the holding circuit 76 is reset and the holding output e$_u$ is set to 0, In the case of time t$_{14}$, the abnormality detection signal is not also generated and the apparatus waits for the input of the next check command.

When the check command is again supplied after that, the solenoid is again energized for a short time as mentioned above and the position of the movable iron core is checked.

As mentioned above, when the solenoid is off, the position of the movable iron core can be checked any time and an arbitrary number of times.

In the above embodiment, when the ON command is not supplied, the timer 70 is soon made operative and the gate circuit 72 is opened after the elapse of the set time TM$_1$. However, it is also possible to construct the apparatus in a manner such that after the input of the ON command was stopped, the detection voltage e$_1$ of the value of the current flowing in the coil 32 is monitored and when the voltage e$_1$ drops to a preset value (it can be also set to the zero level), the timer 70 is made operative.

When the inductance L of the coil 32 is large or the like, it is certain to make the timer 70 operative by monitoring the actual current rather than the case of setting the time TM$_1$ from the time point of the shut-off of the current supply. In such a case, the timer set time TM$_1$ may be also set to 0.

On the other hand, as described in FIGS. 1 and 2, when the solenoid 30 is energized, the movable iron core 34 is attracted to the fixed iron core (pole face) and moves while pressing the spool 14 or the like against the force which is obtained by adding the hydraulic power to the spring force of the spring 22 and is adsorbed to the fixed iron core. However, even if the solenoid is energized by supplying the current to the coil 32 for only a very short time, the movable iron core doesn't move so long as the solenoid force lies within a range which doesn't exceed the spring force until the start of the opening of the valve. Even if the movable iron core has momentarily finely moved in the adsorbing direction, no problem occurs if such a movement amount is within a range such that there is no problem as a whole system. It is, therefore, necessary to set the pulse width TM$_3$ of the ON signal to temporarily energize the solenoid in consideration of the above point.

Figure 34A:
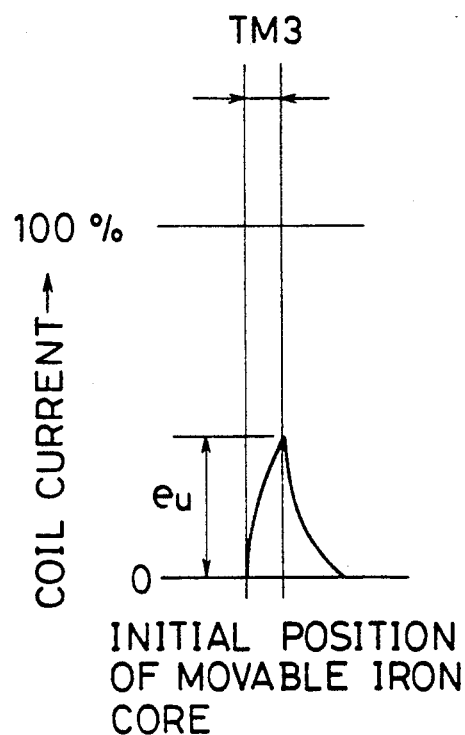
FIG. 34A is a signal waveform diagram showing a change in current detection voltage when the solenoid has temporarily been energized at the initial position of the movable iron core.
Figure 34B:
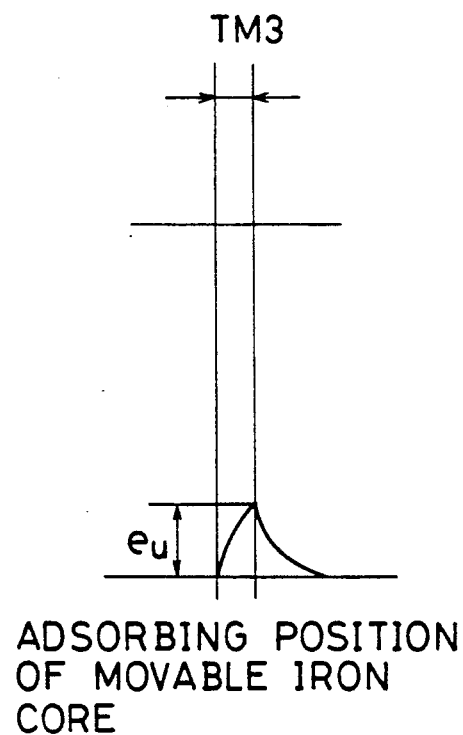
FIG. 34B is a signal waveform diagram showing a change in current detection voltage when the solenoid has temporarily been energized at the operating position (adsorbing position) of the movable iron core.

FIGS. 34A and 34B are waveform diagrams showing a difference by the position of the movable iron core of the response waveform of the current flowing in the coil 32 due to the temporary energization of the solenoid for the pulse width TM$_3$, that is, of the voltage response waveform which is detected by the resistor 44.

As shown in FIG. 10, the inductance L of the coil 32 changes in a manner such that it is smallest when the movable iron core is located at the initial position (position which is farthest from the fixed iron core) and such that it is largest when the movable iron core is located at the adsorbing position (position which is closedly adheredly to the fixed iron core).

The change amount (leading amount) of the voltage waveform upon energization difers due to the inductance L. The inductance L is small when the movable iron core is located at the initial position, so that the coil current largely rises as shown in FIG. 34A. On the other hand, when the movable iron core is located at the adsorbing position, the inductance is large, so that the rising amount is small as shown in FIG. 34B.

Therefore, by detecting the voltage e$_u$ corresponding to the change amount of the current waveform and by comparing with the reference value e$_s$, the position of the movable iron core can be judged.

Although the 15th embodiment in FIG. 32 has been described with respect to the example in which two positions of the initial position and adsorbing position are discriminated, if the change amount $e_u$ is compared with a plurality of reference values of different levels, the positions of a plurality of stages of the movable iron core can be also detected. A resolution of the position detection rises, an accuracy is improved, and a degree of abnormality or normality can be detected.

If the change amount $e_u$ is detected in a stepless manner, the position of the movable iron core can also be continuously measured.

FIG. 35 is a circuit block diagram showing the sixteenth embodiment of the invention.

The 16th embodiment is characterized in that holding circuits 310 and 312 and a correcting circuit 314 for correcting the reference value $e_s$ are added to the 15th embodiment shown in FIG. 32.

Those circuits are provided in order to obtain a correct detection point by correcting the reference value $e_s$ in correspondence to a change in current value due to an increase in temperature of the coil or a fuctuation of the power source voltage.

The holding circuit 310 is set in response to the leading edge of the ON command and starts the retrieval of a supply voltage $E_0$ from the DC power source 46 as input data. When the ON command is set to "L", the holding circuit 310 holds the supply voltage $E_0$ in response to the leading edge of an output signal of the inverter 300 and supplies the same to the correcting circuit 314.

On the other hand, the holding circuit 312 is also set in response to the leading edge of the ON command and starts to retrieve the detection voltage $e_1$ from the amplifier 50 as input data. When the ON command is set to "L", the holding circuit 312 holds the detection voltage $e_0$ as $e_{u0}$ in response to the leading edge of the output of the inverter 300 and supplies to the correcting circuit 314. The holding output $e_{u0}$ is set to a voltage according to the value of the current flowing in the coil 44 in the stationary state upon operation of the solenoid.

The correcting circuit 314 corrects the reference value $e_s$ which has been received in accordance with the values of the voltages $E_0$ and $e_{u0}$ held in the holding circuits and generates a correction reference value $e_{s0}$ to the discriminating section 304.

A response characteristic of the current flowing in the coil 44 when the switch 68 is turned on is expressed by the following equation.

$$i = (E_0/R)(1 - e^{-(R/L)t})$$

where,
R: synthesized resistance value of the internal resistance value of the coil 32 and the resistance value of the resistor 44
L: inductance of the coil 32

Therefore, by holding the power voltage $E_0$ just before the current supply to the coil is shut off and the voltage $e_{u0}$ corresponding to the stationary current I at that time, the value of R becomes known from $R = E_0/I$. The reference value $e_s$ is corrected in accordance with fluctuations and the precision of the discrimination of the movable iron core by the discriminating section 304 can be raised.

Although the above embodiment has been described with respect to the case where the solenoid is momentarily energized in a complete deenergized state of the solenoid and the position of the movable iron core is checked, it is also obviously possible to energize the solenoid so as to supply the current toward 100% from an incomplete deenergized state, for instance, from a state in which the current of about 50% is flowing in the coil 32. In such a case, the position of the movable iron core can be measured from a change amount of the momentary exciting current waveform which changes from 50% toward 100%. In the above case, the solenoid is energized for a short time width such that the movable iron core hardly moves.

Figure 36:
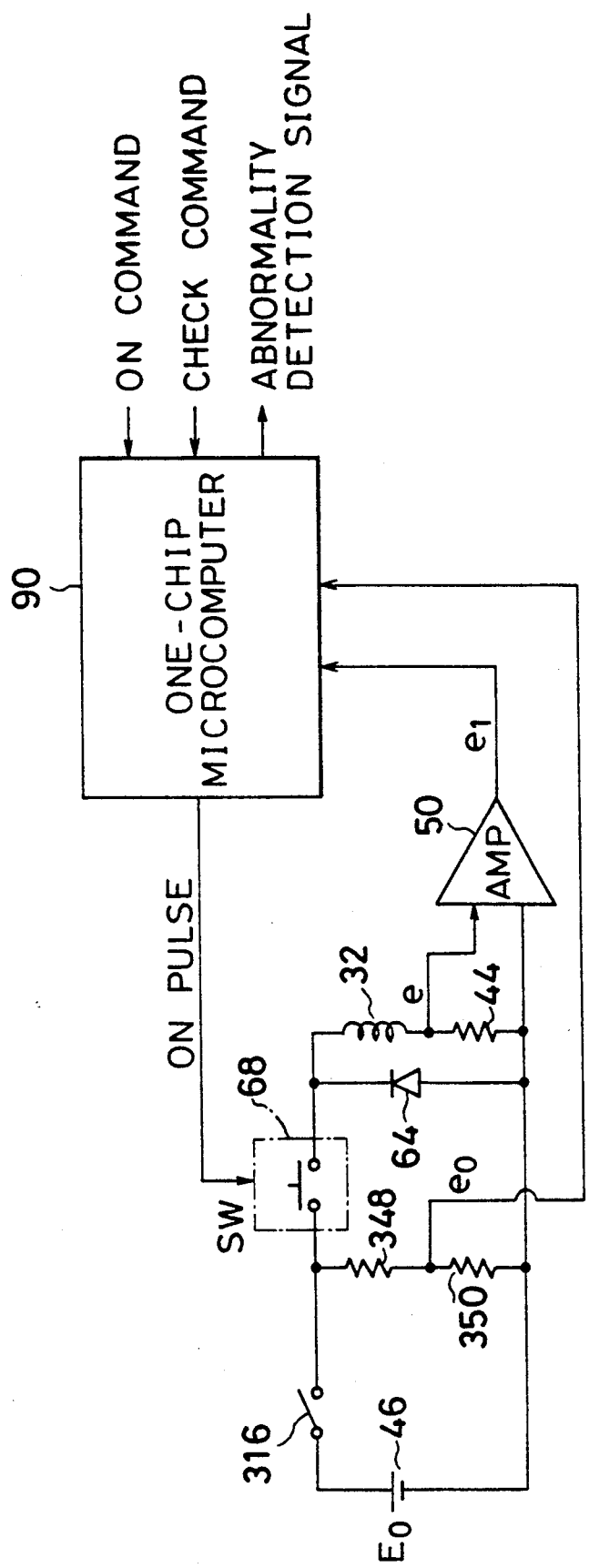
FIG. 36 is a circuit block diagram showing the seventeenth embodiment of the invention.
Figure 37:
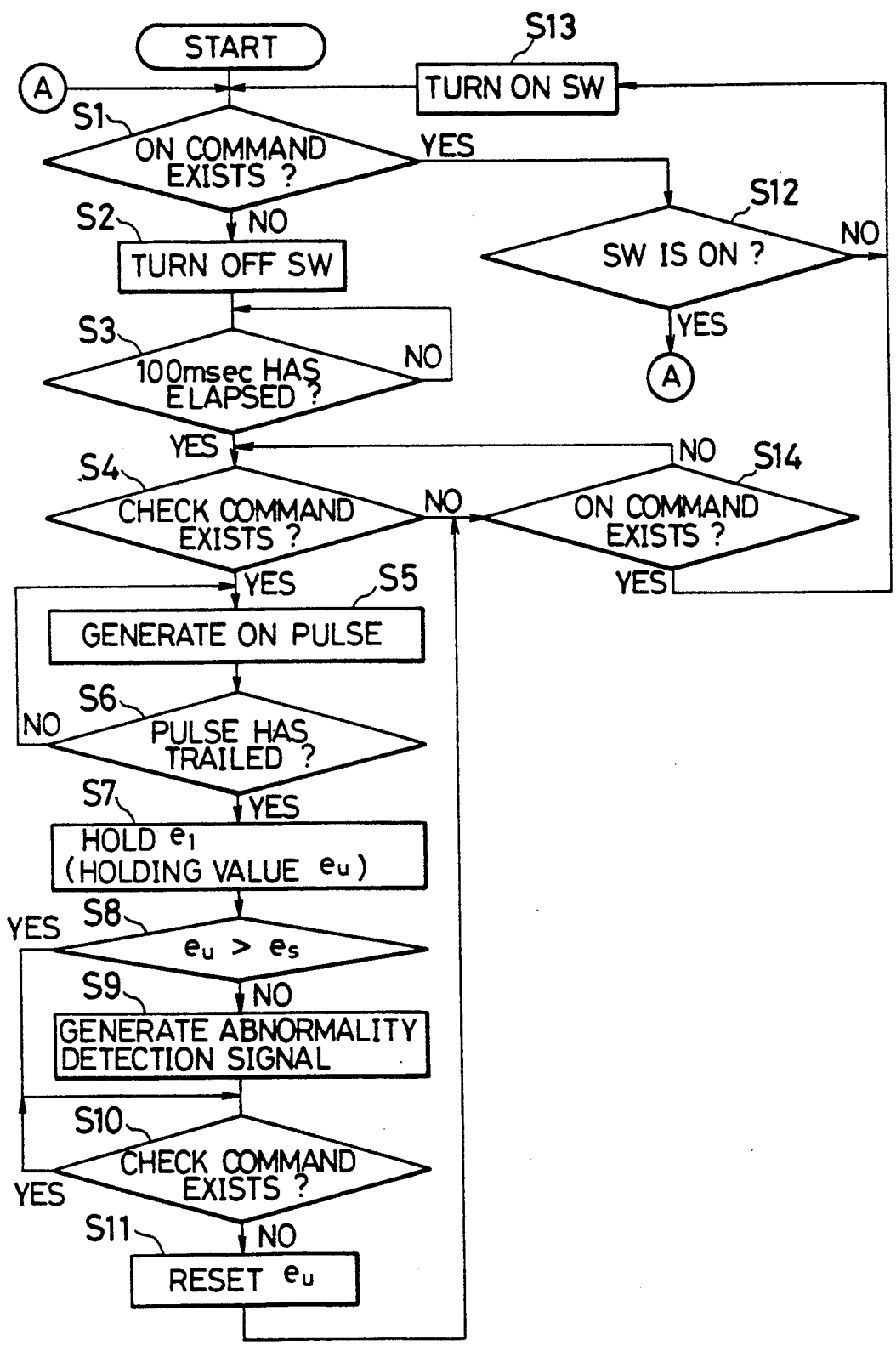
FIG. 37 is a flowchart showing processes in the seventeenth embodiment of the invention in the case of using a microcomputer in FIG. 36.

FIG. 36 is a circuit block diagram showing the 17th embodiment of the invention using the microcomputer 90. FIG. 37 shows a processing flowchart of the microcomputer 90.

The microcomputer 90 receives the ON command and check command and on/off controls the switch 68. The output voltage $e_1$ of the amplifier 50 is converted into the digital value by an A/D converting section provided in the microcomputer 90 and is discriminated. When the microcomputer 90 detects an abnormality of the operation of the solenoid, it generates an abnormality detection signal.

In the 17th embodiment, to execute the same correction of the reference value as that shown in FIG. 32, voltage dividing resistors 348 and 350 are connected in parallel with the power source 46 through a main switch 316. A voltage $e_0$ at a voltage dividing point is supplied to the microcomputer 90.

The main switch 316 is a manual switch which is always set to ON while the solenoid is being used.

The processes by the microcomputer 90 will now be described with reference to the flowchart of FIG. 37. It is now assumed that the reference value $e_s$ is not corrected.

When the processing routine is started, a check is first made in step S1 to see if the ON command has been supplied or not. If YES, a check is made in step S12 to see if the switch 68 has been set to ON or not. If the switch 68 is ON in step S12, the processing routine is returned to the first step S1. However, if the switch 68 is OFF, the switch 68 is turned on in step S13 and the processing routine is returned to the first step S1.

If the supply of the ON command is shut off to deenergize the solenoid, a check is made in step S3 to see if a set time, for instance, 100 msec which is equal to or longer than the time which is required for the movable iron core to return after the turn-off of the power source after the switch 68 had been turned off has elapsed or not. If YES, step S4 follows and the apparatus waits for the input of the check command.

If the presence of the ON command is decided in step S14 before the check command is supplied in step S4, the processing routine advances to step S13 and the switch 68 is turned on and the current is supplied to the coil 32.

When the check command has been supplied in step S4, an ON pulse of a predetermined short pulse width is generated in step S5, thereby temporarily turning on the switch 68.

If the ON pulse has trailed in step S6, step S7 follows and the A/D conversion value of the output voltage $e_1$ from the amplifier 50 is held as a holding value $e_u$. The holding value $e_u$ is compared with the reference value $e_s$ in step S8.

If $e_u > e_s$ as a result of the comparison in step S8, it is determined that the movable iron core has correctly been returned, so that no signal is generated. If $e_u \leq e_s$, it is decided that the movable iron core has not returned, so that an abnormality detection signal is generated in step S9.

A check is now made in step S10 to see if the check command has been supplied or not. If NO, the holding value $e_u$ is reset in step S11 and the processing routine is returned to step S14 and the presence or absence of the ON command is again checked. If there is no ON command, the apparatus waits for the input of the check command in step S4. If the ON command has been supplied, the switch 68 is turned on in step S13 and the processing routine is returned to the first step S1.

The case of correcting the reference value $e_s$ will now be described.

The microcomputer 90 retrieves the division voltage $e_0$ by the resistors 348 and 350 as information of the power source voltage $E_0$ and supplies the current of a low output level such that the movable iron core hardly moves even upon deenergization of the solenoid to the coil 32. The microcomputer 90 calculates a coil resistance by the mean supply voltage and mean detection current at that time, thereby correcting the reference value $e_s$ in accordance with the coil resistance.

For instance, the switch 68 is on/off controlled by a PWM signal whose frequency is fairly higher than the frequency of the ON signal upon checking and whose ON-duty has been fixed to about 1%. When the switch 68 is turned off, the value of the current flowing in the OFF state of the switch 68 changes due to the coil resistance so long as the power source voltage is constant. The detection voltage $e_1$ changes. Consequently, a fluctuation of the coil resistance value can be detected.

A temperature measuring device or the like can be also used. A wired logic circuit by digital elements can be also used in place of the microcomputer 90 in the 17th embodiment.

Figure 38:
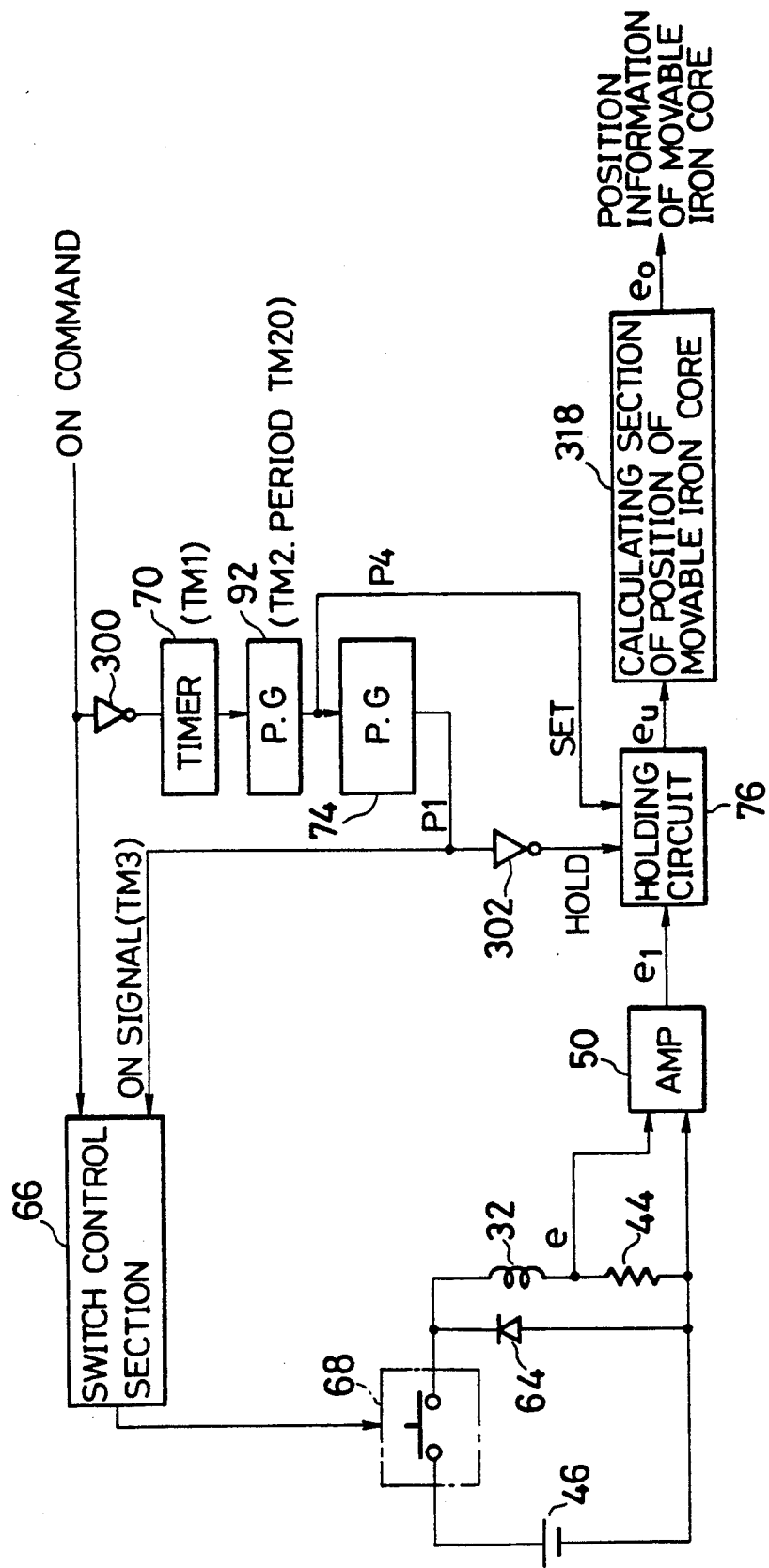
FIG. 38 is a circuit block diagram showing the eighteenth embodiment of the invention.

FIG. 38 is a circuit block diagram showing the 18th embodiment of the invention and the same parts and components as those shown in the 15th embodiment in FIG. 32 are designated by the same reference numerals and their descriptions are omitted here.

In the 18th embodiment, after the solenoid has been turned off, the position of the movable iron core is automatically periodically checked at a predetermined time width. The result is generated as an analog value.

The 18th embodiment in FIG. 38 differs from the 15th embodiment in FIG. 32 only with respect to the provision of the pulse generator 92 to generate a check command pulse in place of the gate circuit 70 such that the input of the check command from the outside is made unnecessary and the provisions of a movable iron core position calculating section 318 in place of the discriminating section 304 such that the movable iron core position information is generated as an analog signal.

According to the 18th embodiment, when the ON command is not supplied, the switch control section 66 turns off the switch 68 and shuts off the current supply to the solenoid coil 32 from the power source 46 and makes the timer 70 operative by an output of the inverter 300.

The timer 70 makes the pulse generator 92 operative after the elapse of the set time $TM_1$. The pulse generator 92 generates a check command pulse $P_4$ having a pulse width $TM_2$ and a period $TM_{20}$ as shown in FIG. 33D.

In response to the leading edge of the check command pulse $P_4$, the holding circuit 76 is set and the data retrieval is started and the pulse generator 74 is also made operative.

The pulse generator 74 generates the ON signal $P_1$ having a pulse width $TM_3$ and a period $TM_{20}$. The switch control section 66 turns on the switch 68 for only a period of time $TM_3$, thereby temporarily energizing the solenoid.

The holding circuit 76 holds the detection voltage $e_1$ just before the switch 68 is turned off. The holding value $e_u$ is supplied to the movable iron core position calculating section 318, by which the movable iron core position information $e_a$ is calculated and generated.

When the check command pulse $P_4$ from the pulse generator 92 trails, the holding circuit 76 is reset and the checking process of one time is finished. However, since the pulse generator 92 periodically generates the check command pulse $P_4$ at a period $TM_{20}$, the next checking process is immediately again executed and the movable iron core position information $e_a$ is periodically generated.

Figure 39:
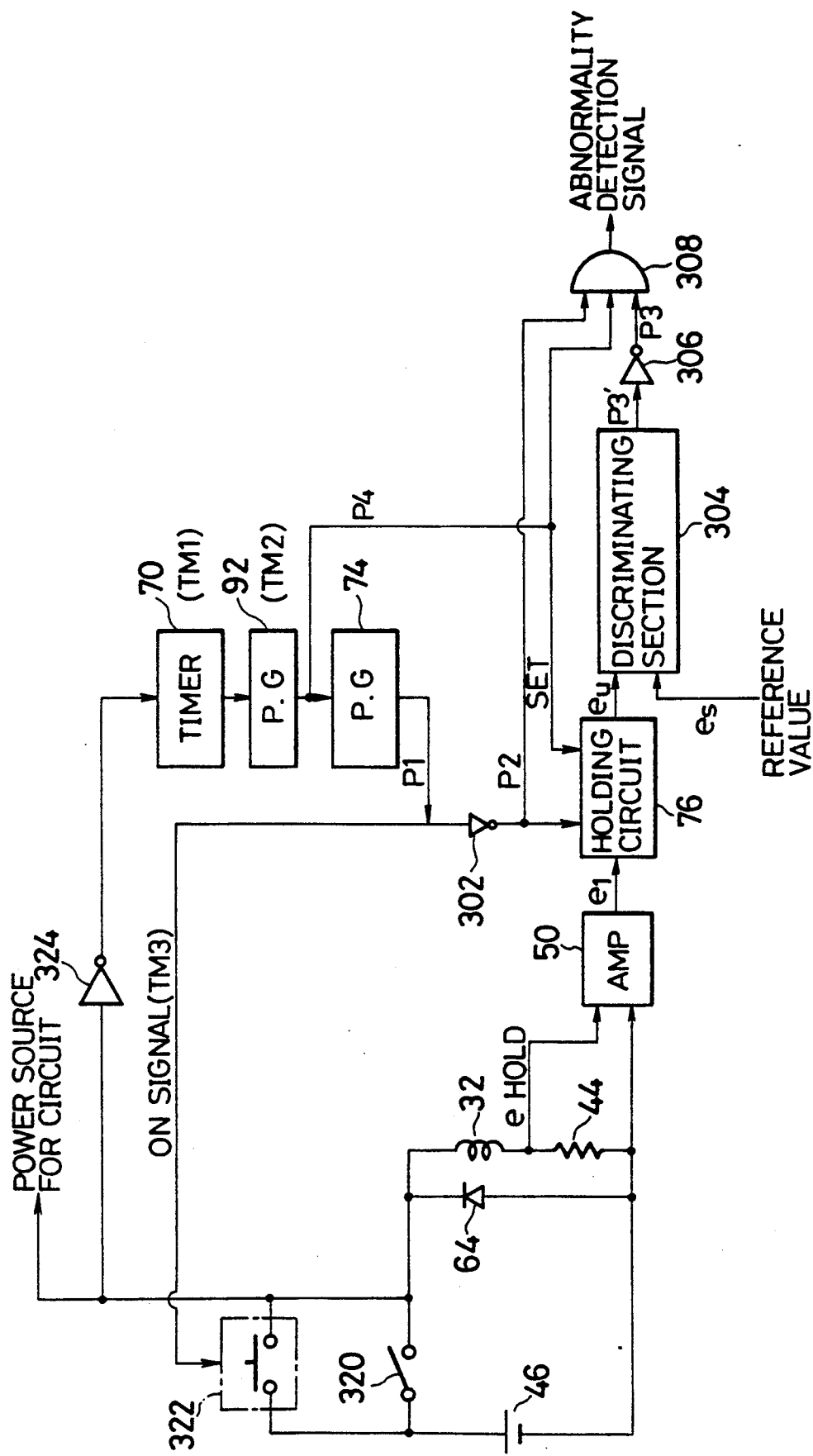
FIG. 39 is a circuit block diagram showing the nineteenth embodiment of the invention.

FIG. 39 is a circuit block diagram showing the 19th embodiment of the invention and the same parts and components as those shown in the embodiments in FIGS. 32 and 38 are designated by the same reference numerals and their descriptions are omitted here.

According to the 19th embodiment, a main switch 320 to turn on/off the solenoid and a deenergizing switch (normally closed switch) 322 for checking are separately connected in parallel, thereby enabling the apparatus to be used in the conventional simple control system which doesn't use a sequencer or the like.

The 19th embodiment in FIG. 39 differs from the 18th embodiment in FIG. 38 in that the main switch 320 and deenergizing switch 322 are provided and the switch control section 66 is made unnecessary in that the power source voltage which is supplied to the coil 32 is transmitted through an inverter 324 and an output of the inverter 324 is used as a start signal for the timer 70 and, further, in that the discriminating section 304, inverter 306, and AND circuit 308 are provided in a manner similar to the 15th embodiment in place of the movable iron core position calculating section 318.

According to the 19th embodiment, there is no need to supply the ON command and check command from the outside. When the main switch 320 is turned on, the current is supplied to the coil 32, thereby making the solenoid operative. When the main switch 320 is turned off, the timer 70 is made operative and the deenergizing switch 322 is periodically turned on only for a period of time $TM_3$ at a predetermined period $TM_{20}$ after the elapse of a predetermined time $TM_1$, thereby instantaneously supplying the current to the coil 32.

A change amount of the current waveform when the current has momentarily been supplied to the coil 32 is held by the holding circuit 76 and is detected. The discriminating section 304 judges the position of the movable iron core. At this time, if the position of the movable iron core is abnormal, the AND circuit 308 generates an abnormality detection signal.

Figure 40:
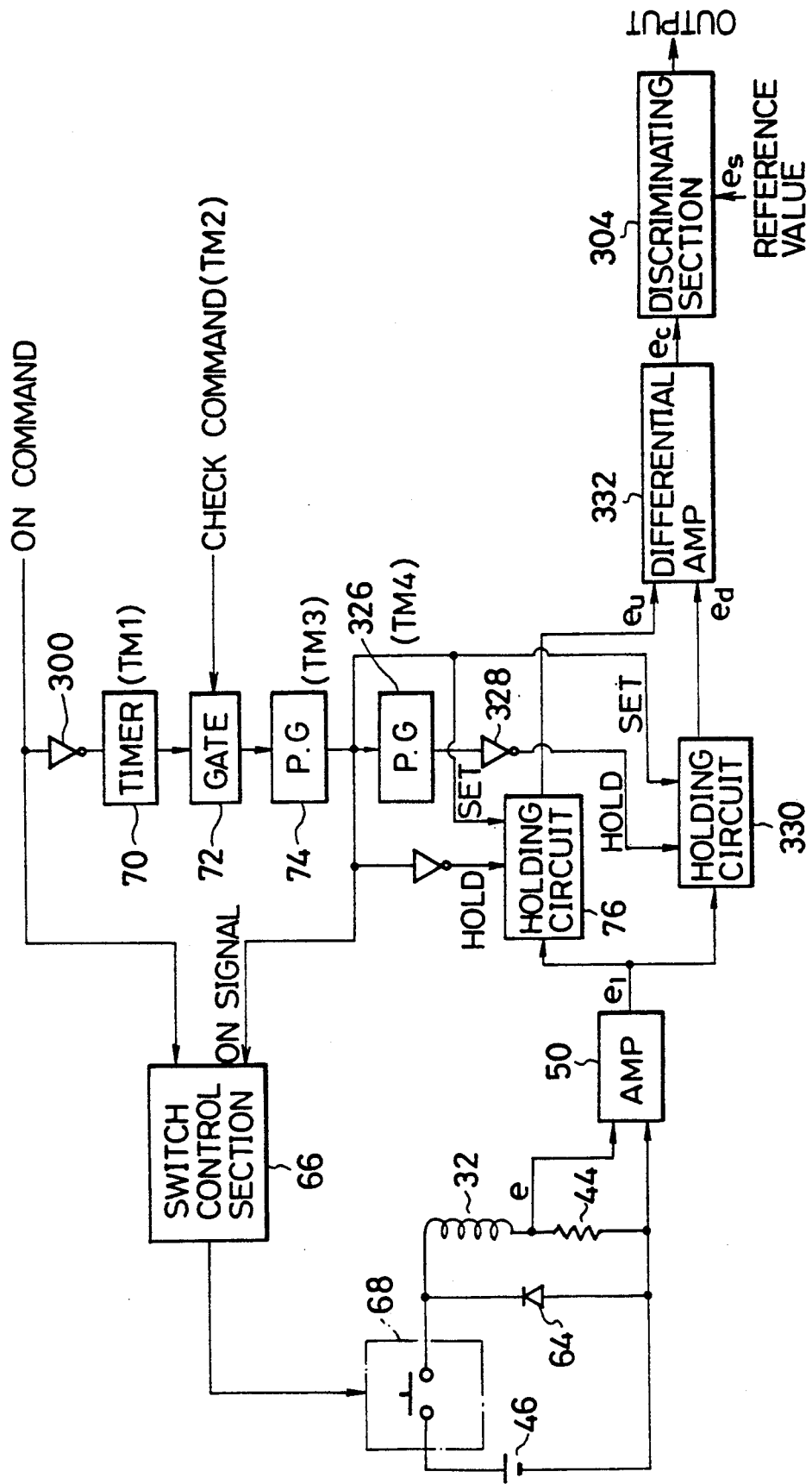
FIG. 40 is a circuit block diagram showing the twentieth embodiment of the invention.

FIG. 40 is a circuit block diagram showing the 20th embodiment of the invention and the same parts and components as those shown in the 15th embodiment in FIG. 32 are designated by the same reference numerals and their descriptions are omitted here.

The 20th embodiment in FIG. 40 differs from the 15th embodiment in FIG. 32 with respect to the provision of a pulse generator 326 to generate a detecting pulse of a pulse width $TM_4$, an inverter 328 to invert an output of the pulse generator 326, a holding circuit 330 to hold a detection voltage $e_1$ by an output of the inverter 328, and a differential amplifier 332 to calculate a difference between the holding values of the two holding circuits 76 and 330.

The 20th embodiment relates to an example in which the position of the movable iron core is checked by using a trailing waveform of the coil current just after the solenoid has been energized for a short time.

The checking operation of the 20th embodiment in FIG. 40 will now be described with reference to time charts of FIGS. 41A to 41E.

After the switch control section 66 turned off the switch 68 after the input of the ON command from the outside had been stopped, when the check command is supplied after the elapse of the set time $TM_1$ of the timer 70, the pulse generator 74 generates an ON signal of the pulse width $TM_3$ at time $t_1$. The switch control section 66 turns on the switch 68 for only a period of time of the generation of the ON signal, thereby temporarily energizing the solenoid.

At this time, the output voltage $e_1$ of the amplifier 50 corresponding to the waveform of the current flowing in the coil 32 is as shown in FIG. 41A.

When the ON signal rises at time $t_2$, the holding circuit 76 holds the peak value $e_u$ of the voltage $e_1$ as shown in FIG. 41B.

The pulse generator 326 generates a detecting pulse of a pulse width $TM_4$ from time point $t_2$. The holding circuit 330 holds the decreasing voltage $e_1$ as shown in FIG. 41C at trailing time point $t_4$ and the holding value is set to $e_d$.

The differential amplifier 332 generates a signal $e_c$ shown in FIG. 41D and having the level corresponding to a difference between the holding voltages $e_u$ and $e_d$ of the holding circuits 76 and 330. The discriminating section 304 compares the signal $e_c$ with the reference value $e_s$. If $e_c > e_s$, the discriminating section 304 generates an H level signal at a timing of time $t_3$ as shown in FIG. 41E. The H level signal is an OK signal indicating that the movable iron core has correctly been returned to the initial position.

If the movable iron core of the solenoid remains at the absorbing position or is stopped on the way of the returning motion, the holding voltage $e_d$ doesn't largely drop and the signal $e_c$ decreases. Thus, a relation of $e_c > e_s$ is not obtained but the output signal of the discriminating section 304 is set to the L level. Such an L level signal is an abnormality detection signal indicating that the movable iron core has not correctly returned.

The 20th embodiment is suitable for the case where a fluctuation of the coil resistance value, power source voltage, or the like is small. In this case as well, by correcting the reference value $e_s$ in a manner similar to the 16th embodiment in FIG. 35, the accuracy can be raised.

FIG. 42 is a circuit block diagram showing the 21st embodiment of the invention and the same parts and components as those shown in the 20th embodiment in FIG. 40 are designated by the same reference numerals and their descriptions are omitted here.

In the 21st embodiment, the check command is transmitted through a normally closed switch 336 and is used as an ON signal. After the solenoid has been turned on as shown in FIG. 43A, when the output voltage $e_1$ of the amplifier 50 has risen to the reference value $e_{s1}$ as shown in FIG. 43B, the normally closed switch 336 is turned off by an output of a comparator 334, thereby turning off the solenoid and allowing the holding circuit 76 to hold the input voltage $e_1$ upon turn-off of the solenoid as a voltage $e_{s1}$.

Simultaneously with the turn-off of the switch 336, a timer 338 is made operative and a pulse is generated after the elapse of a set time $TM_5$, thereby allowing the holding circuit 330 to hold the decreasing voltage $e_1$. The holding voltage is set to $e_d$.

The differential amplifier 332 generates the signal $e_c$ according to a difference between the holding voltages $e_{s1}$ and $e_d$ of the holding circuits 76 and 330. The discriminating section 304 compares the signal $e_c$ with the reference signal $e_{s2}$. If the result of the comparison is such that $e_c > e_{s2}$, the discriminating section generates an H level signal indicating that the movable iron core position is normal. If $e_c < e_{s2}$, an L level signal indicative of the abnormality is generated.

According to the 21st embodiment, the checking precision is improved relative to that in the case of the 20th embodiment in FIG. 40. By correcting the reference values $e_{s1}$ and $e_{s2}$, the checking precision can be further improved.

All of the above 15th to 21st embodiments are fundamentally characterized in that a change in magnitude of the current value in a unit time is detected. However, as in the 22nd embodiment shown in FIG. 44, it is also possible to judge the operation at the time of turn-off of the solenoid by detecting a trailing or leading inclination of the current waveform.

Figure 44:
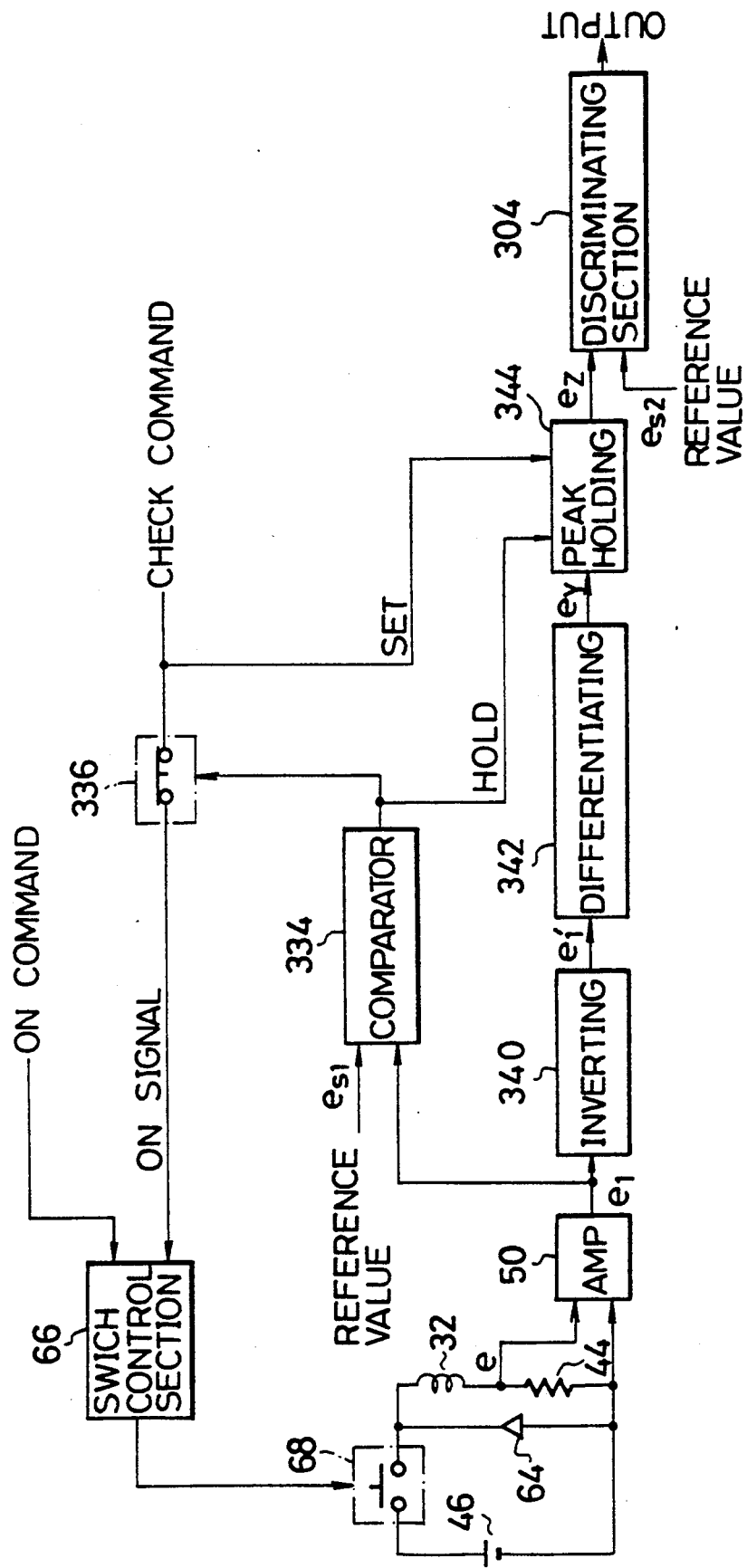
FIG. 44 is circuit block diagram showing the twenty-second embodiment of the invention.
Figure 45:
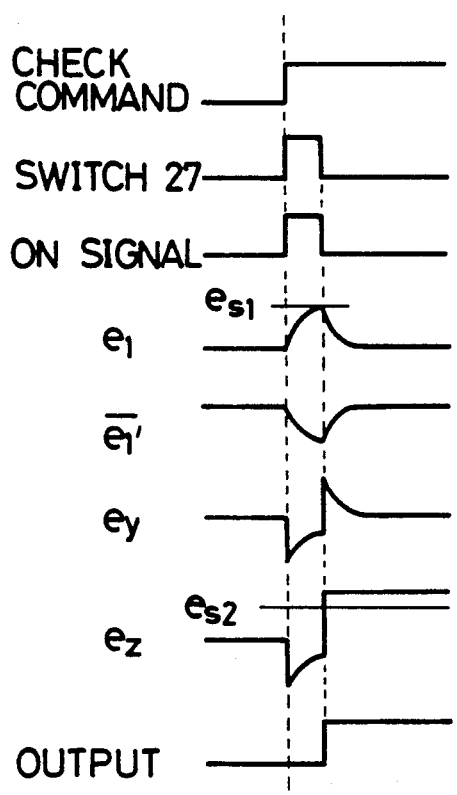
FIGS. 45A to 45H are time charts showing signal waveforms in respective sections in FIG. 44.

The checking operation according to the 22nd embodiment in FIG. 44 will now be described with reference to time charts showing signal waveforms in FIGS. 45A to 45H.

After the switch 68 was turned on by the check command, when the output voltage $e_1$ of the amplifier 50 rises until the reference value $e_{s1}$, the normally closed switch 336 is turned off by an output of the comparator 334 and the switch 68 is closed. The above operations are the same as those in the 21st embodiment in FIG. 42.

In addition to the above construction, according to the 22nd embodiment, after the output voltage $e_1$ of the amplifier 50 has been inverted by an inverting circuit 340, it is differentiated by a differentiating circuit 342 and a peak value of a differentiation waveform signal $e_y$ is held by a peak holding circuit 344 and the holding signal assumes $e_z$.

The holding signal $e_z$ is compared with the reference value $e_{s2}$ by the discriminating section 304. If $e_z > e_{s2}$, an H level normality signal indicating that the movable iron core has correctly been returned is generated from the discriminating section 304.

That is, if the movable iron core of the solenoid has been returned, the inductance of the coil 32 is small. Thus, when the current had been supplied to the coil 32 for a short time and the current supply has been shut off, the coil current rapidly trails and an inclination of the waveform is steep, so that the peak value of the differentiation waveform of the signal $e_1$ is high. Consequently, since the holding value $e_z$ of the differentiation waveform is also large, a relation of $e_z > e_{s2}$ is obtained.

On the other hand, if the movable iron core of the solenoid has not returned, the inductance of the coil 32 is large. Thus, when the current had been supplied to the coil 32 for a short time and the current supply has been shut off, the coil current slowly trails and an inclination of the differentiation waveform is gentle. Therefore, the holding value $e_z$ of the differentiation waveform is also small, so that the relation of $e_z > e_{s2}$ is not obtained.

Figure 46:
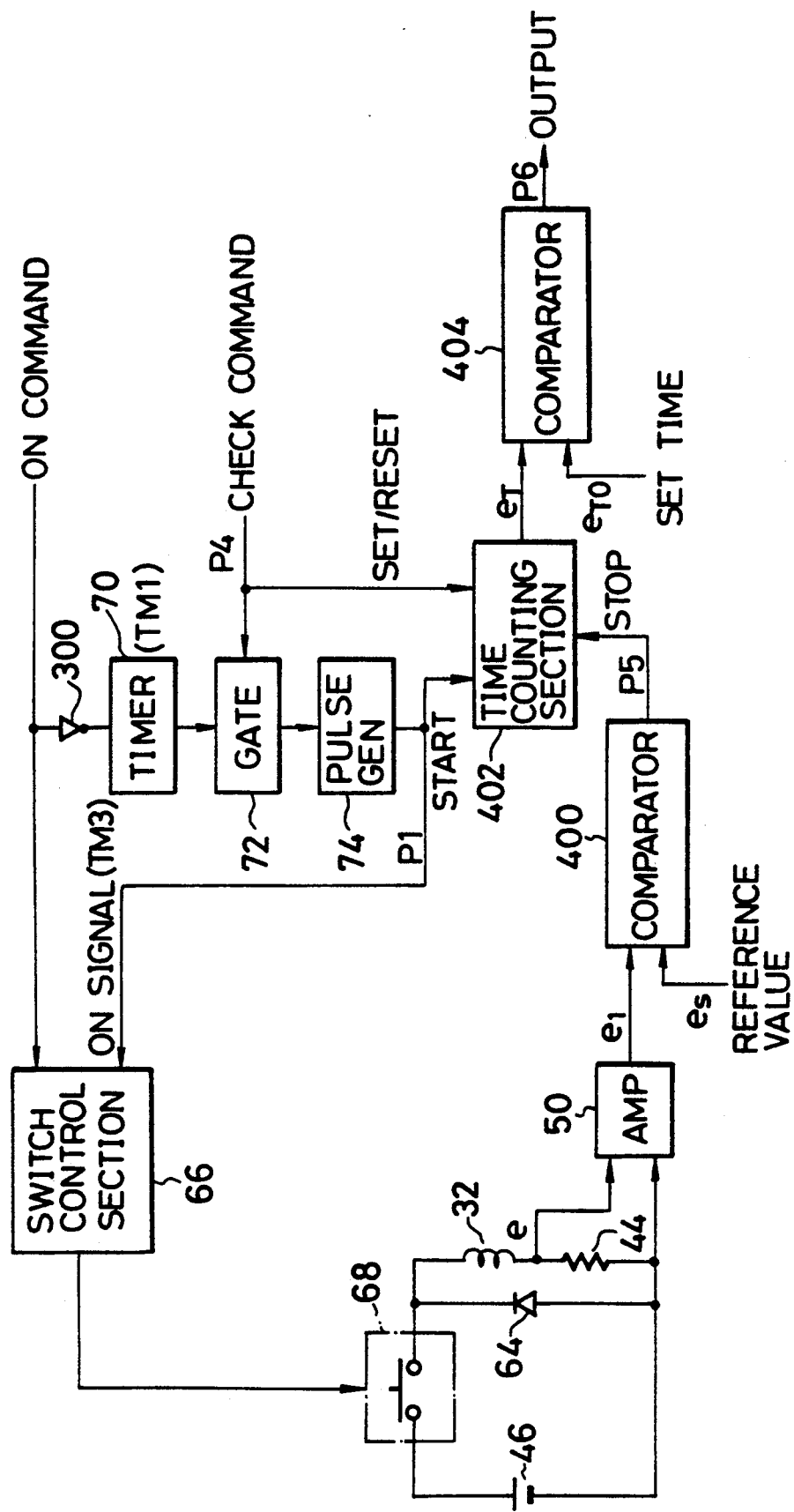
FIG. 46 is circuit block diagram showing the twenty-third embodiment of the invention.

FIG. 46 is a circuit block diagram of an apparatus to check the position of the movable iron core after the deenergization of the solenoid showing the 23rd embodiment of the invention.

In the 23rd embodiment, after the current supply to the solenoid coil has stopped, the current is supplied to the coil for only a short time such that the movable iron core hardly moves. The time which is required for the current flowing in the coil to change by only a predetermined value is measured, thereby discriminating whether the movable iron core has been returned to the correct position due to the deenergization of the solenoid or not.

In FIG. 46, circuit portions other than comparators 400 and 404 and a time counting section 402 are fundamentally the same as those in the 15th embodiment in FIG. 32 and are designated by the same reference numerals and their descriptions are omitted here. However, the inverter 302 shown in FIG. 32 is omited.

The detection voltage e of the current flowing in the coil 32 which has been detected by the resistor 44 is amplified by the amplifier 50. An amplified signal is generated from the amplifier 50 as an output voltage $e_1$. The comparator 400 compares the output voltage $e_1$ with the reference value $e_s$. When $e_1 > e_s$, an output signal $P_5$ of the comparator 400 is set to "H". The time counting section 402 is set in response to the leading edge of the check command from the outside and starts to count the time in response to the leading edge of the ON signal from the pulse generator 74. The time counting section 402 stops the measurement in response to the leading edge of the output signal $P_5$ of the comparator 400. That is, the time counting section 402 measures the time which is required until the current value reaches the reference value $e_s$ after the start of the current supply to the coil 32.

Further, the comparator 404 compares a measurement value $e_T$ of the time counting section 402 with a set time $e_{T0}$. When $e_T \geq e_{T0}$, an output signal $P_6$ of the comparator 404 is set to "L", thereby indicating that the movable iron core has been returned to the initial position which is farthest from the adsorbing position due to the deenergization of the solenoid. On the contrary, when $e_T > e_{T0}$, the output signal $P_6$ is set to "H", thereby indicating an abnormal state in which the movable iron core is located at the adsorbing position or on the way to the initial position and is not returned to the initial position due to the deenergization of the solenoid.

The operation of the 23rd embodiment in FIG. 46 will now be described with reference to time charts of FIGS. 47A to 47H.

Figure 47:
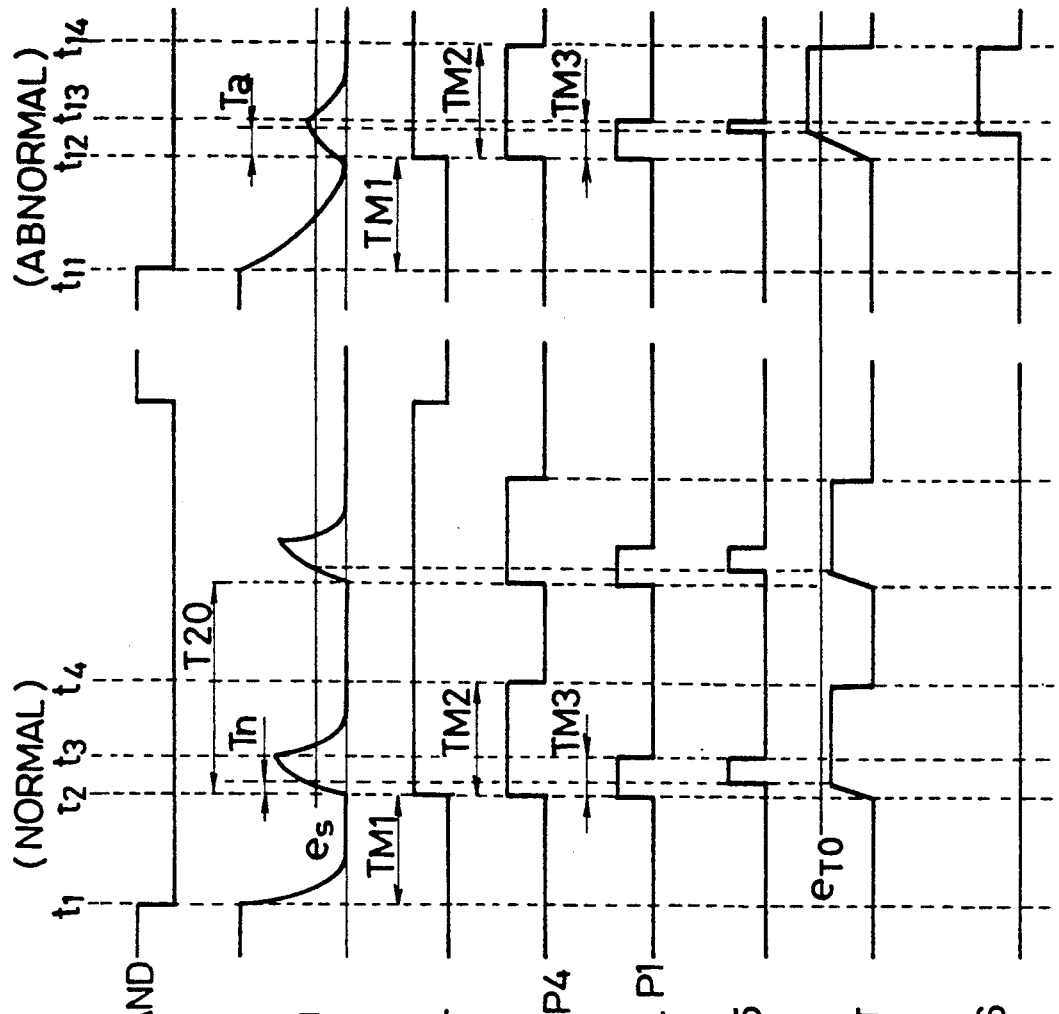
FIGS. 47A to 47H are time charts showing signal waveforms in respective sections in FIG. 46.

First, when the ON command to make the solenoid operative is set to "L" and cancelled as shown in FIG. 47A at time $t_1$, the switch control section 66 turns off the switch 68, so that the current supply to the coil 32 from the DC power source 46 is shut out. At this time, even if the switch 68 is turned off, the current continuously flows in the coil 32 and resistor 44 through the diode 64 for a short time by the energy accumulated in the coil 32. The solenoid is completely deenergized after that.

On the other hand, when the ON command is set to "L" at time $t_1$, the output signal of the inverter 300 is set to "H" and the timer 70 is made operative. As shown in FIG. 47C, the output signal of the timer 70 is set to "H" after the elapse of the set time $TM_1$. The timer time $TM_1$ is set to a value which is slightly longer than the time which is required until the voltage $e_1$ is equal to 0.

When the output signal of the timer 70 is set to "H", the gate circuit 72 is opened and accepts the check command $P_4$ of the predetermined time width $TM_2$ shown in FIG. 47D from the outside and generates the check command $P_4$. The pulse generator 74 is made operative at leading time point $t_2$ of the check command $P_4$ and generates the ON signal $P_1$ of the pulse width $TM_3$ as shown in FIG. 47E.

Only for a period of time when the ON signal $P_1$ is at the "H" level, the switch control section 66 turns on the switch 68 and the current is supplied to the coil 32 from the DC power source 46. The pulse width $TM_3$ is set to a short time width such that the movable iron core hardly moves even if the solenoid is temporarily energized by supplying the current to the coil 32.

The current flowing in the coil 32 is detected by the voltage e which is generated across the resistor 44 and is amplified by the amplifier 50. An amplified signal is supplied to the comparator 400 as an output voltage $e_1$ shown in FIG. 47B.

The time counting section 402 starts to measure the time at leading time point $t_2$ of the check command $P_4$.

Subsequently, when the output voltage $e_1$ of the amplifier 50 exceeds the reference value $e_s$, the output signal $P_5$ of the comparator 400 is set to "H" as shown in FIG. 47F, thereby stopping the time measuring operation of the time counting section 402 at leading time point of the output signal $P_5$.

Therefore, the value $e_T$ which is obtained by voltage converting the time measurement value by the time counting section 402 linearly increases as shown in FIG. 47G. The time which is required until the amplified output voltage $e_1$ changes by only the reference value $e_s$ is measured.

In the 23rd embodiment, the voltage converted value of the time is compared with the reference value. However, the measured time itself can be also compared. For instance, such a method can be realized by using a reference timer and a measuring timer. The above point shall also apply to the embodiments in FIGS. 48 to 52, which will be explained hereinlater.

The time measurement value $e_T$ by the time counting section 402 differs depending on the response current waveform of the coil 32. The measurement value $e_T$ is long since the inductance of the coil 32 is large. The value $e_T$ changes in accordance with the position of the movable iron core as shown in FIG. 10 of the coil 32, so that the time measurement value $e_T$ indicates the position information of the movable iron core.

Accordingly, the time measurement value $e_T$ by the time counting section 402 is compared with the set value $e_{T0}$ corresponding to the set time by the comparator 404. When the value $e_T$ exceeds the set value $e_{T0}$, the output signal $P_6$ is set to "H".

When the movable iron core of the solenoid has correctly been returned to the initial position, the measurement value $e_T$ of the time counting section 402 is small as shown on the normal side for a time interval between $t_1$ and $t_4$ in FIG. 47G. Therefore, the relation of $e_T > e_{T0}$ is not obtained. A discrimination output of the comparator 404 is held to "L" as shown on the normal side in FIG. 47H, thereby indicating the normal state of the movable iron core.

On the other hand, if the movable iron core is not returned to the initial position but remains at the adsorbing position, the measurement value $e_T$ is long as shown on the abnormal side for a time interval between $t_{11}$ and $t_{14}$ in FIG. 47G, so that $e_T > e_{T0}$. The discrimination output of the comparator 404 is set to "H" as shown on the abnormal side in FIG. 47H, thereby indicating the abnormal state.

Subsequently, when the check command P4 supplied from the outside is turned off at shown at time t4 or t14, the time counting section 402 is reset and the measurement value $e_T$ is equal to 0. The discrimination output signal P6 from the comparator 404 is also stopped and the apparatus waits for the input of the next check command.

In a manner similar to the above, each time the check command is supplied, the solenoid is temporarily energized and the position of the movable iron core is checked.

In the 23rd embodiment in FIG. 46, when the input of the ON command from the outside is stopped, the timer 70 is immediately made operative and the gate circuit 72 is opened after the elapse of the set time $TM_1$. However, it is also possible to construct the apparatus in a manner such that after the ON command has stopped, the detection voltage $e_1$ of the value of the current flowing in the coil 32 is monitored and the timer 70 is made operative when the detection voltage $e_1$ has dropped until a preset value (the preset value may be set to the zero level).

When the inductance L of the coil 32 is large or the like, it is certain to make the timer 70 operative by using an actual current as a reference rather than the case of setting the time $TM_1$ from the time point of the shut-off of the current supply. In such a case, the timer set time $TM_1$ can be also set to 0.

As a pulse width $TM_3$ for temporarily supplying the current to the coil 32, no problem occurs if the pulse width $TM_3$ lies within a range such that no problem occurs as a whole system even if the movable iron core has slightly momentarily moved in the adsorbing direction. Thus, the pulse width $TM_3$ of the ON signal is set so as to lie within such a range.

Further, the 23rd embodiment in FIG. 46 has been described with respect to the example in which two positions of the initial position and adsorbing position of the movable iron core are discriminated. However, by comparing the measurement value $e_T$ with a plurality of different set times, the positions of a plurality of stages of the movable iron core can be also discriminated. A resolution of the position discrimination rises, a precision is improved, and a degree of abnormality or normality can be detected.

If the measurement value $e_T$ is generated in a stepless manner, the position of the movable iron core can also be continuously measured.

Figure 48:
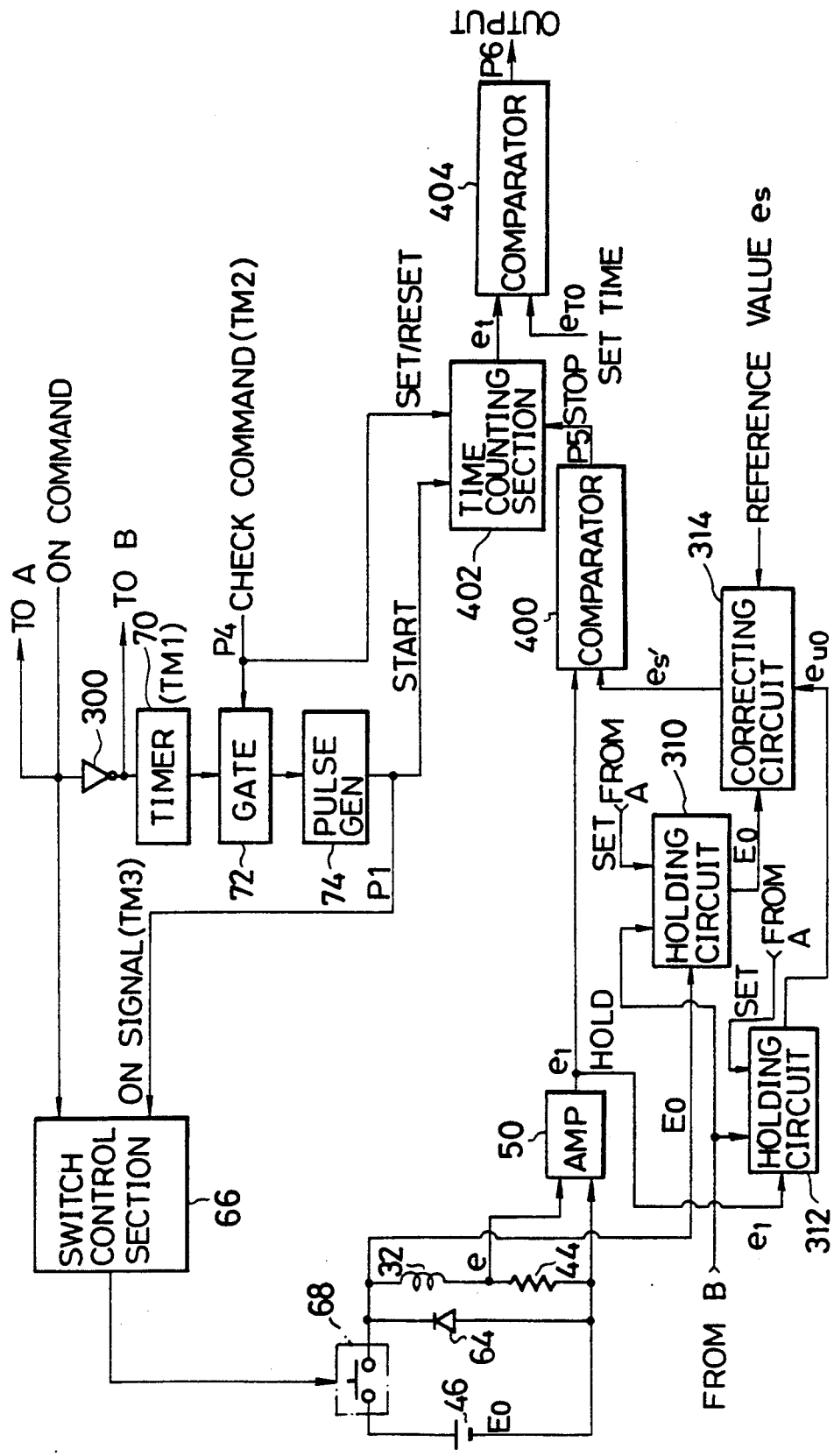
FIG. 48 is a circuit block diagram showing the twenty-fourth embodiment of the invention.

FIG. 48 is a circuit block diagram showing the 24th embodiment of the invention. According to the 24th embodiment, the holding circuits 310 and 312 and the correcting circuit 314 for correcting the reference value $e_s$ are additionally provided to the 23rd embodiment in FIG. 46.

Those circuits 310, 312, and 314 are provided to obtain a correct detection point by correcting the reference value $e_s$ in correspondence to a change in current value due to an increase in temperature of the coil 32 or a fluctuation of the power source voltage. The construction and operation of the 24th embodiment are substantially the same as those in the 16th embodiment in FIG. 35.

Although the embodiments shown in FIGS. 46 and 48 have been described with respect to the case where the solenoid is momentarily energized in the complete deenergized state of the solenoid and the position of the movable iron core is checked, it is also possible to energize the solenoid by supplying the current which directs toward 100% from the incomplete deenergized state, namely, from a state in which the current of about 50% is flowing in the coil 32. In such a case, the time which is required until the waveform of the momentary exciting current which directs from 50% toward 100% changes by a predetermined value is measured, thereby judging the position of the movable iron core.

Figure 49:
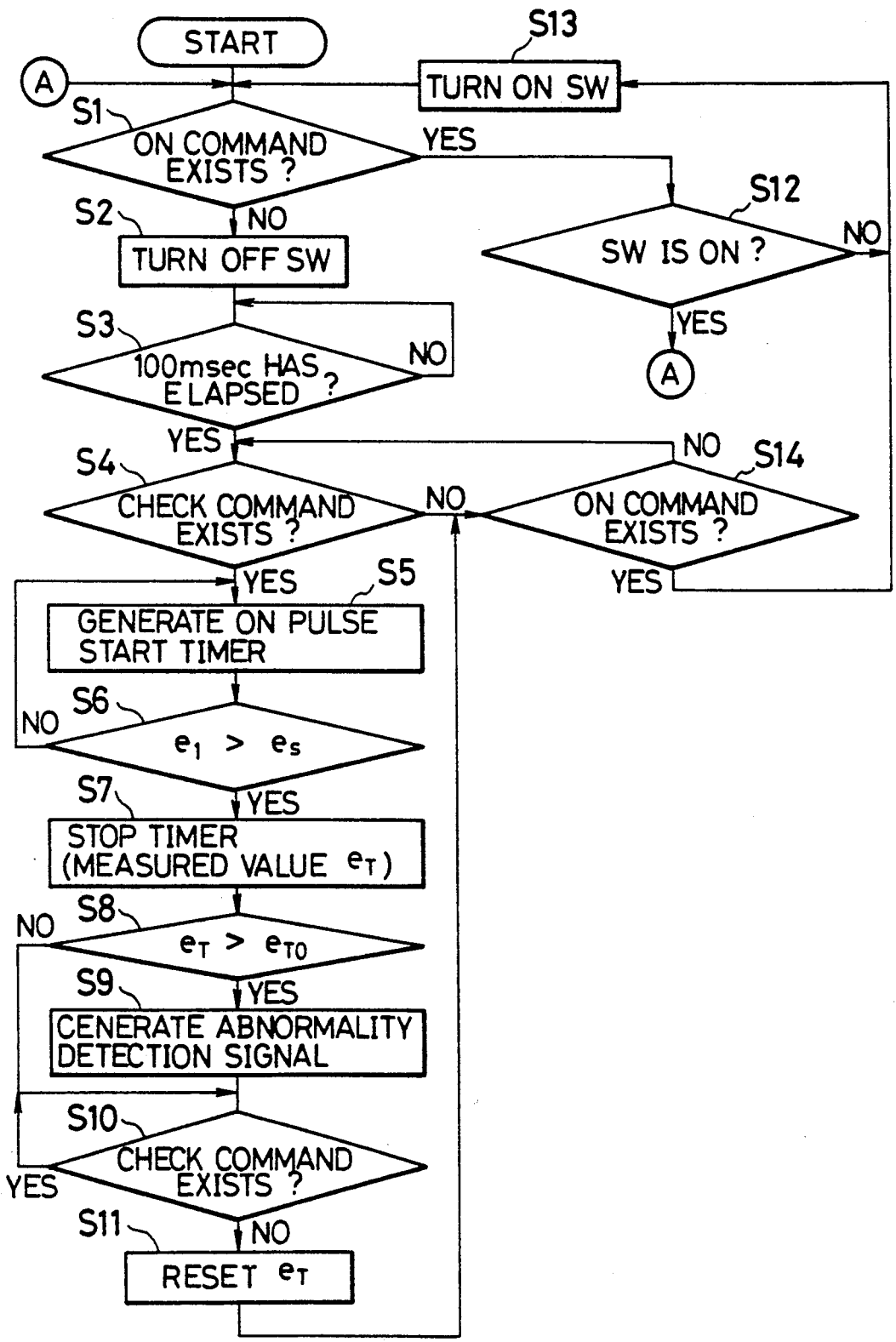
FIG. 49 is a flowchart showing processes of the twenty-fifth embodiment of the invention using a microcomputer in FIG. 36.

FIG. 49 is a processing flowchart in the 25th embodiment using the microcomputer shown in FIG. 36.

In FIG. 49, when the processing routine is started, a check is first made in step S1 to see if the ON command has been supplied from the outside or not. If the ON command is at the "H" level, step S12 follows and a check is made to see if the switch 68 has been turned on or not. If YES, the processing routine is returned to step S1. If the switch 68 is OFF, the switch 68 is turned on in step S13 and the solenoid is energized. The processing routine is returned to step S1.

When the input of the ON command from the outside is stopped in order to deenergize the solenoid, step S2 follows and the switch 68 is turned off and the current supply to the coil 32 is shut off. After that, a check is made in step S3 to see if the set time which is required to deenergize the solenoid, namely, to return the movable iron core, for instance, a time of 100 msec or longer has elapsed or not. If YES, step S4 follows and the apparatus waits for the input of the check command.

If there is no check command, the presence or absence of the ON command which is supplied from the outside is discriminated in step S14. If the ON command has been supplied, the switch 68 is again turned on in step S13 and the current is supplied to the coil 32.

If YES in step S14, step S5 follows and the ON pulse of a predetermined short pulse width is generated and the internal timer is made operative. Therefore, the switch 68 is turned on and the current is temporarily supplied to the coil 32 only for a period of time when the ON pulse is generated.

In subsequent step S6, the output voltage $e_1$ from the amplifier 50 is compared with the reference value $e_s$. When the output voltage $e_1$ exceeds the reference value $e_s$, step S8 follows.

In step S8, the timer is stopped and the time measurement value $e_T$ is obtained and compared with the set time $e_{T0}$. If $e_T \leq e_{T0}$, it is determined that the movable iron core has correctly been returned and no signal is generated. If $e_T > e_{T0}$, it is decided that the movable iron core has not returned and an abnormality detection signal is generated in step S9.

In step S10, a check is made to see if the check command has been supplied or not. If there is no check command, the measurement value $e_T$ of the timer is reset in step S11 and the processing routine is returned to step S14 and the presence or absence of the ON command is checked. If there is no ON command, the apparatus waits for the input of the next check command in step S4. If the ON command has been supplied, the switch 68 is turned on in step S13 and the processing routine is returned to step S1.

Although the processing routine in FIG. 49 has been described with respect to the example of the case where the reference value $e_s$ is not corrected, since the processes in the case of correcting the reference value are similar to those in the 17th embodiment in FIG. 36, their descriptions are omitted here.

Figure 50:
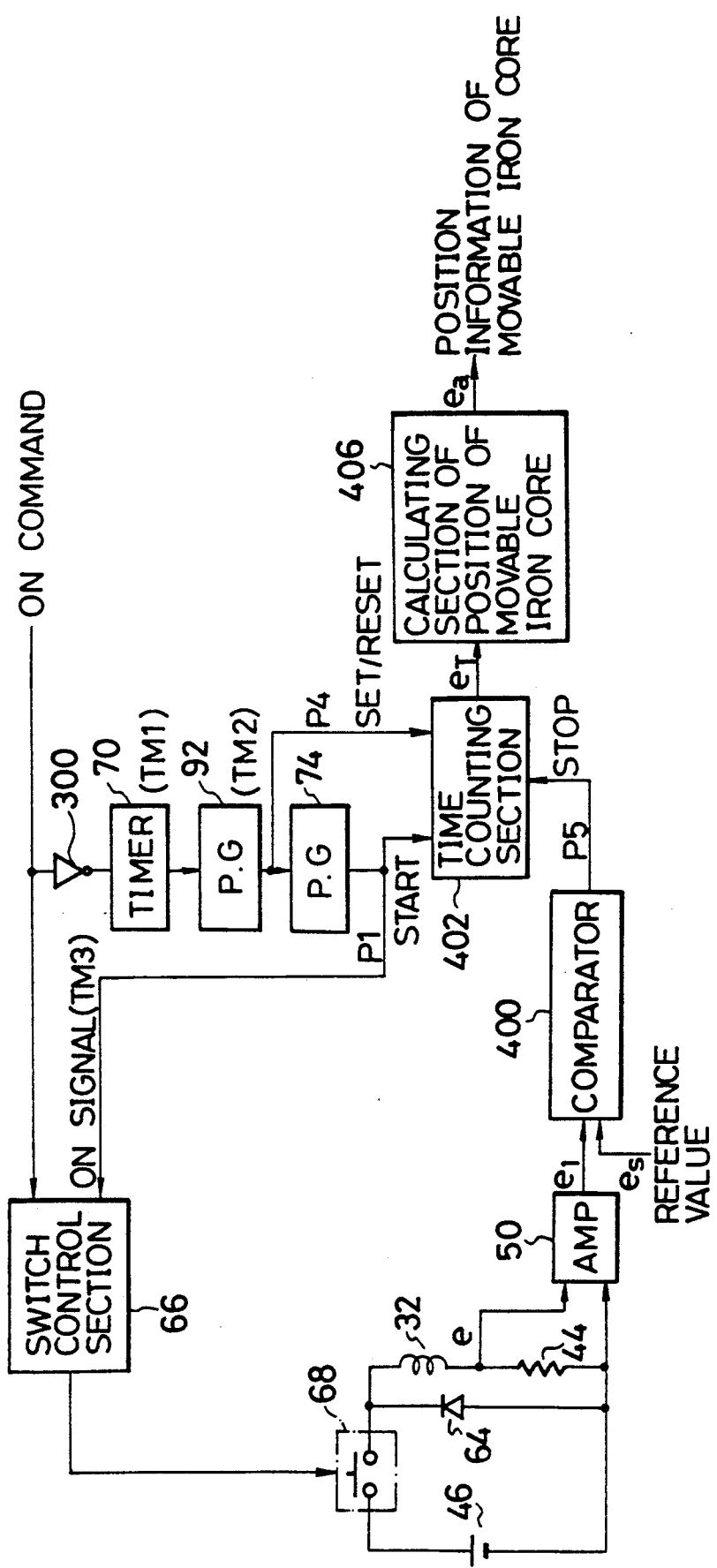
FIG. 50 is a circuit block diagram showing the twenty-sixth embodiment of the invention.

FIG. 50 is a circuit block diagram showing the 26th embodiment of the invention and the same parts and components as those shown in the 23rd embodiment in FIG. 46 are designated by the same reference numerals and their descriptions are omitted here.

In the 26th embodiment, after the solenoid has been turned off, the position of the movable iron core is automatically periodically checked at a predetermined time width and the result is generated as an analog value.

The 26th embodiment in FIG. 50 differs from the 23rd embodiment in FIG. 46 only in that the pulse generator 92 to generate a check command pulse is provided in place of the gate circuit 70 and the input of the check command from the outside is made unnecessary and in that a movable iron core position calculating section 406 is provided in place of the comparator 404 and movable iron core position information is generated by an analog signal.

According to the 26th embodiment, when the input of the ON command from the outside has stopped, the switch control section 66 turns off the switch 68, the current supply to the solenoid coil 32 from the power source 46 is shut off, and the timer 70 is made operative by the output of the inverter 300.

The timer 70 makes the pulse generator 92 operative after the elapse of the set time $TM_1$. The pulse generator 92 generates a check command pulse $P_4$ having a pulse width $TM_2$ and a period $TM_{20}$ as shown in FIG. 47D.

In response to the leading edge of the check command pulse $P_4$, the time counting section 402 is set and the pulse generator 74 is made operative.

Therefore, the pulse generator 74 generates the ON signal $P_1$ having a pulse width $TM_3$ and a period $TM_{20}$. The switch control section 66 turns on the switch 68 for only a period of time $TM_3$, thereby energizing the solenoid.

The time counting section 402 starts the time measuring operation in response to the leading edge of the ON signal $P_1$. When the output voltage $e_1$ of the amplifier 50 has exceeded the reference value $e_s$, the time measuring operation is stopped in response to the leading edge of the output signal $P_5$ of the comparator 400. The time measurement value $e_T$ of the time counting section 402 is supplied to the movable iron core position calculating section 406, by which the movable iron core position information $e_a$ is calculated and generated.

Subsequently, the time counting section 402 is reset in response to the trailing edge of the check command pulse $P_4$ from the pulse generator 94 and the checking process of one time is finished. However, since the pulse generator 94 periodically generates the check command pulse $P_4$ at a period $TM_{20}$, the next checking process is soon executed and the movable iron core position information $e_a$ is periodically generated.

Characteristic portions of the 26th embodiment of FIG. 50 are similar to those in the 18th embodiment of FIG. 38.

Figure 51:
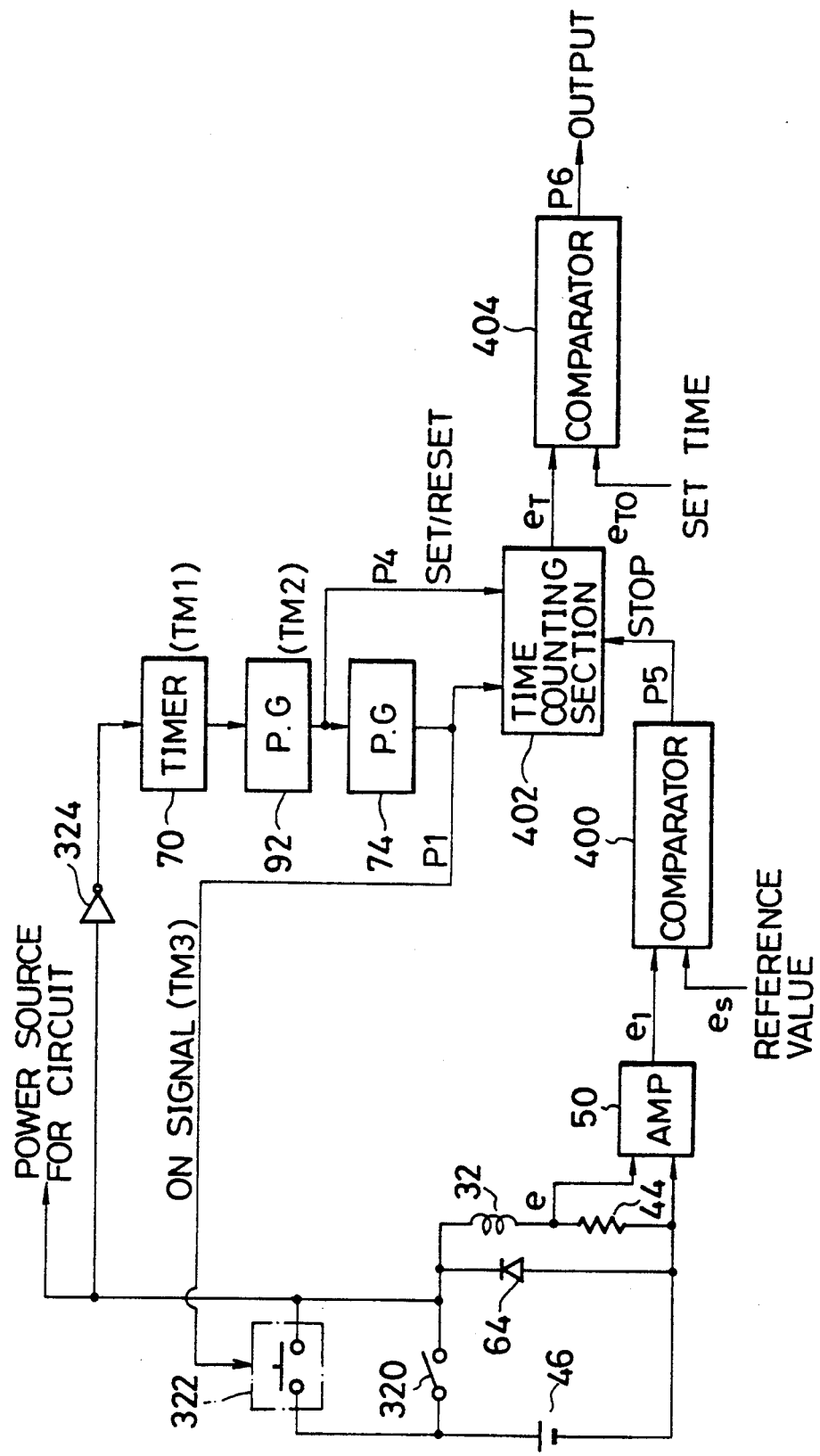
FIG. 51 is a circuit block diagram showing the twenty-seventh embodiment of the invention.

FIG. 51 is a circuit block diagram showing the 27th embodiment of the invention and the same parts and components as those shown in the embodiments of FIGS. 46 and 50 are designated by the same reference numerals and their descriptions are omitted here.

The 27th embodiment is characterized in that the main switch 320 to turn on/off the solenoid and the deenergizing switch 322 for checking are separately provided in parallel, thereby enabling the apparatus to be used in the conventional simple system which doesn't use a sequencer or the like.

The 27th embodiment in FIG. 51 differs from the 26th embodiment in FIG. 50 in that the switch control section 66 is further made unnecessary and in that the power source voltage which is supplied to the coil 32 is transmitted through the inverter 324 and is used as a start signal for the timer 70 and in that the comparator 404 is provided in a manner similar to the 23rd embodiment in FIG. 46 in place of the movable iron core position calculating section 404.

According to the 27th embodiment, the input of the ON command and check command from the outside are unnecessary. When the main switch 320 is turned on, the current is supplied to the coil 32 and the solenoid is made operative. When the main switch 320 is turned off, the timer 70 is made operative. After the elapse of the predetermined time $TM_1$, the switch 322 is periodically turned on for only the period of time $TM_3$ at the same period as the period $TM_{20}$ in the 26th embodiment in FIG. 50, thereby instantaneously supplying the current to the coil 32.

At this time, the time which is required until the response current waveform changes by only the reference value $e_s$ is measured by the time counting section 402. The measurement time $e_T$ is compared with the set time $e_{T0}$ by the comparator 404, thereby judging the position of the movable iron core. The above processes are similar to those in the 23rd embodiment in FIG. 46.

Figure 52:
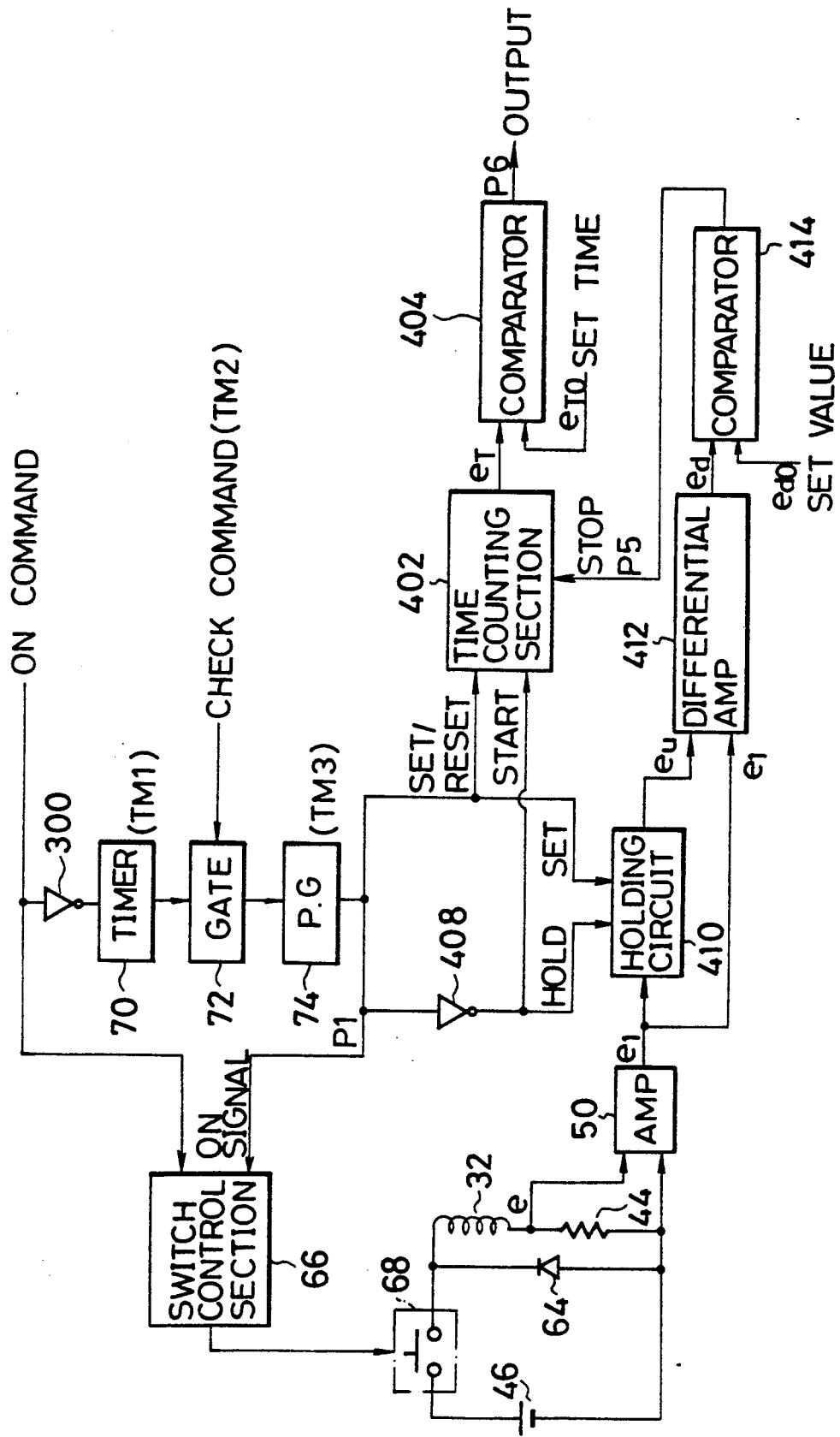
FIG. 52 is a circuit block diagram showing the twenty-eighth embodiment of the invention.

FIG. 52 is a circuit block diagram showing the 28th embodiment of the invention and the same parts and components as those shown in the 23rd embodiment in FIG. 46 are designated by the same reference numerals and their descriptions are omitted here.

The 28th embodiment in FIG. 52 differs from the 23rd embodiment in FIG. 46 with respect to a provision of an inverter 408 to invert the ON signal $P_1$, a holding circuit 410 which uses an inverted output of the inverter 408 as a holding signal, and a differential amplifier 412 to calculate a difference between the holding value $e_u$ of the holding circuit 410 and the output voltage $e_1$ of the amplifier 50. A comparator 414 to compare an output $e_d$ of the differential amplifier 412 and the set value $e_{d0}$ is provided in place of the comparator 400.

In the 28th embodiment, the position of the movable iron core is checked by using a trailing waveform of the coil current just after the solenoid was energized for a short time.

The operation will be described with reference to time charts of FIGS. 53A to 53F. When the check command is supplied after the elapse of the set time $TM_1$ of the timer 70 after the switch control section 66 had turned off the switch 68 after the input of the ON command had been stopped, the pulse generator 74 generates the ON signal of a pulse width $TM_3$. The switch control section 66 turns on the switch 68 for only the period $TM_3$ and energizes the solenoid.

Therefore, a waveform of the output voltage $e_1$ of the amplifier 50 corresponding to the waveform of the current flowing in the coil 32 is as shown in FIG. 53A.

In response to the trailing edge of the ON signal, the holding circuit 410 holds the peak value of the voltage $e_1$ as shown in FIG. 53B and the holding value is set to $e_u$. The time counting section 402 starts the time counting operation.

After that, the differential amplifier 412 generates the signal $e_d$ shown in FIG. 53C and having the level corresponding to a difference between the holding value $e_u$ of the holding circuit 410 and the output voltage $e_1$ of the amplifier 50. The comparator 414 compares the signal $e_d$ with the set value $e_{d0}$. If $e_d > e_{d0}$, the comparator 414 sets the output signal $P_5$ to "H" as shown in FIG. 53D.

When the output signal $P_5$ of the comparator 414 is set to "H", the time counting section 402 stops the time counting operation and the measurement value $e_T$ shown in FIG. 53E is derived. The measurement value $e_T$ is compared with the set time $e_{T0}$ by the comparator 404. If $e_T \leq e_{T0}$ as shown on the normal side in FIG. 53F, the discrimination output signal $P_6$ is held at the "L" level. However, if $e_T > e_{T0}$ as shown on the abnormal side in FIG. 53F, the discrimination output signal $P_6$ is set to "H", thereby indicating the abnormality.

The 28th embodiment is suitable for the case where a fluctuation in coil resistance, power source voltage, or the like is small.

In the 28th embodiment in FIG. 52 as well, the accuracy can be raised by correcting the set value $e_{d0}$ in a manner similar to the 24th embodiment in FIG. 48.

The invention is not limited to the foregoing embodiments but incorporates various modifications of the embodiments which can be easily performed. If the valve is a valve using a solenoid, it is not limited by an application.

What is claimed is:

1. A method of checking the operation of a solenoid having a coil and a movable iron core, said method comprising:

a first step of activating a switch device to cause a solenoid driving circuit to supply current to the coil to thus energize the solenoid, the driving circuit including a resister connected in series to the coil and a diode connected in parallel to the series connected coil and resister;

a second step of temporarily deactivating the switch device to temporarily cease the supply of current to the coil to thus temporarily deenergize the solenoid, the switch device being deactivated for a relatively short time period such that an effect on a movement of the movable iron core is minimal;

a third step of detecting a current flow within the resistor of the driving circuit while the switch device is temporarily deactivated in said second step; and, a fourth step of comparing the current flow detected in said third step with a predetermined reference indicative of a position of the movable iron core to thereby check the operation of the solenoid.

2. A method as claimed in claim 1, wherein said third step includes detecting a differential current between a value of the current flow within the resistor upon deactivating the switch device in said second step and upon reactivating the switch at the expiration of the relatively short time period, and wherein said fourth step includes comparing the detected differential current with a predetermined reference value and determining that an abnormality exists when the differential current exceeds the predetermined reference value.

3. A method as claimed in claim 2, further comprising a step of determining a resistance of the coil based on a voltage applied to the coil and a current flowing through the coil while the solenoid is energized, and a step of correcting the predetermined reference value based on the determined resistance of the coil.

4. A method as claimed in claim 1, wherein said third step includes detecting a differentiation value denoting an amount of change per unit time of the current flow within the resistor upon deactivating the switch device in said second step, and wherein said fourth step includes comparing the detected differentiation value with a predetermined reference value and determining that an abnormality exists when the differentiation value exceeds the predetermined reference value.

5. A method as claimed in claim 1, wherein said third step includes measuring an amount of time that elapses from a time in which the switch device is deactivated in said second step to a time in which the current flow within the resistor changes by a predetermined amount, and wherein said fourth step includes determining a position of the movable iron core based on the amount of time measured in said third step.

6. A method as claimed in claim 5, wherein said fourth step further includes comparing the amount of time measured in said third step with a predetermined reference time and determining that an abnormality exists when the amount of time is equal to or less than the predetermined reference time, the abnormality being that the movable iron core has failed to move to an absorbing position.

7. An apparatus for checking the operation of a solenoid having a movable iron core, said apparatus comprising:

a switch device;

a coil for energizing the solenoid when a current is supplied thereto in response to an activation of said switch device and for deenergizing the solenoid in the absence of the current supplied thereto in response to a deactivation of said switch device;

a resistor, connected in series with said coil, which generates a detection voltage indicative of a current flowing in said coil;

a diode, connected in parallel to the series connected resistor and coil, which is non-conductive upon activation of the switch device and which conducts an electrical energy accumulated in said coil upon deactivation of said switch device;

deenergizing means for temporarily deactivating the switch device to thereby temporarily deenergize the solenoid by shutting off the supply of current to the coil for only a relatively short time period such that an effect on a movement of the iron core is minimal;

detecting means for detecting a change in the detection voltage generated by said resistor when the solenoid is being temporarily deenergized by said deenergizing means; and, discriminating means for discriminating a position of the movable iron based on the change in the detection voltage detected by said detecting means.

8. An apparatus as claimed in claim 7, wherein said detecting means further detects a differential value between a value of the detection voltage of the resistor upon deactivating the switch device by said deenergizing means and upon reactivating the switch at the expiration of the relatively short time period, and wherein said discriminating means is further for comparing the detected differential value with a predetermined reference value and determining that an abnormality exists when the differential current exceeds the predetermined reference value.

9. An apparatus as claimed in claim 8, further comprising a correcting means for determining a resistance of the coil based on a voltage applied to the coil and a current flowing through the coil while the solenoid is energized, and for correcting the predetermined reference value based on the determined resistance of the coil.

10. An apparatus as claimed in claim 7, wherein said detecting means is further for detecting a differentiation value denoting an amount of change per unit time of the detection voltage of the resistor upon deactivating the switch device by said deenergizing means, and wherein said discriminating means is further for comparing the detected differentiation value with a predetermined reference value and determining that an abnormality exists when the differentiation value exceeds the predetermined reference value.

11. An apparatus as claimed in claim 7, wherein said detecting means is further for measuring an amount of time that elapses from a time in which the switch device is deactivated by said deenergizing means to a time in which the detection voltage of the resistor changes by a predetermined amount, and wherein said discriminating means is further for determining a position of the movable iron core based on the amount of time measured by said detecting means.

12. An apparatus as claimed in claim 11, wherein said discriminating means is further for comparing the amount of time measured by said detecting means with a predetermined reference time and determining that an abnormality exists when the amount of time is equal to or less than the predetermined reference time, the abnormality being that the movable iron core has failed to move to an absorbing position.

13. A method of checking the operation of a solenoid having a coil and a movable iron core, said method comprising:
   a first step of deactivating a switch device to cause a solenoid driving circuit to cease a supply of current to the coil to thus deenergize the solenoid, the driving circuit including a resister connected in series to the coil and a diode connected in parallel to the series connected coil and resister;
   a second step of temporarily activating the switch device to temporarily supply current to the coil to thus temporarily energize the solenoid, the switch device being activated for a relatively short time period such that an effect on a movement of the movable iron core is minimal;
   a third step of detecting a current flow within the resistor of the driving circuit while the switch device is temporarily activated in said second step; and,
   a fourth step of comparing the current flow detected in said third step with a predetermined reference indicative of a position of the movable iron core to thereby check the operation of the solenoid.

14. A method as claimed in claim 13, wherein said third step includes detecting a differential current between a value of the current flow within the resistor upon activating the switch device in said second step and upon deactivating the switch at the expiration of the relatively short time period, and wherein said fourth step includes comparing the detected differential current with a predetermined reference value and determining that an abnormality exists when the differential current is equal to or less than the predetermined reference value.

15. A method as claimed in claim 14, further comprising a step of determining a resistance of the coil based on a voltage applied to the coil and a current flowing through the coil while the solenoid is in a stationary energized state, and a step of correcting the predetermined reference value based on the determined resistance of the coil.

16. A method as claimed in claim 13, wherein said third step includes detecting a differentiation value denoting an amount of change per unit time of the current flow within the resistor upon activating the switch device in said second step, and wherein said fourth step includes comparing the detected differentiation value with a predetermined reference value and determining that an abnormality exists when the differentiation value is equal to or less than the predetermined reference value.

17. A method as claimed in claim 13, wherein said third step includes measuring an amount of time that elapses from a time in which the switch device is activated in said second step to a time in which the current flow within the resistor changes by a predetermined amount and wherein said fourth step includes determining a position of the movable iron core based on the amount of time measured in said third step.

18. A method as claimed in claim 17, wherein said fourth step further includes comparing the amount of time measured in said third step with a predetermined reference time and determining that an abnormality exists when the amount of time is equal to or less than the predetermined reference time, the abnormality being that the movable iron core has failed to move to an absorbing position.

19. An apparatus for checking the operation of a solenoid having a movable iron core, said apparatus comprising:
   a switch device;
   a coil for energizing the solenoid when a current is supplied thereto in response to an activation of said switch device and for deenergizing the solenoid in the absence of the current supplied thereto in response to a deactivation of said switch device;
   a resistor, connected in series with said coil, which generates a detection voltage indicative of a current flowing in said coil;
   a diode, connected in parallel to the series connected resistor and coil, which is non-conductive upon activation of the switch device and which conducts an electrical energy accumulated in said coil upon deactivation of said switch device;
   energizing means for temporarily activating the switch device to thereby temporarily energize the solenoid by supplying current to the coil for only a relatively short time period such that an effect on a movement of the iron core is minimal;
   detecting means for detecting a change in the detection voltage generated by said resistor when the solenoid is being temporarily energized by said energizing means; and,
   discriminating means for discriminating a position of the movable iron based on the change in the detection voltage detected by said detecting means.

20. An apparatus as claimed in claim 19, wherein said detecting means further detects a differential value between a value of the detection voltage of the resistor upon activating the switch device by said energizing means and upon deactivating the switch at the expiration of the relatively short time period, and wherein said discriminating means is further for comparing the detected differential value with a predetermined reference value and determining that an abnormality exists when the differential current is equal to or less than the predetermined reference value.

21. An apparatus as claimed in claim 20, further comprising a correcting means for determining a resistance of the coil based on a voltage applied to the coil and a current flowing through the coil while the solenoid is in a stationary energized state, and for correcting the predetermined reference value based on the determined resistance of the coil.

22. An apparatus as claimed in claim 19, wherein said detecting means is further for detecting a differentiation value denoting an amount of change per unit time of the detection voltage of the resistor upon activating the switch device by said energizing means, and wherein said discriminating means is further for comparing the detected differentiation value with a predetermined reference value and determining that an abnormality exists when the differentiation value is equal to or less than the predetermined reference value.

23. An apparatus as claimed in claim 19, wherein said detecting means is further for measuring an amount of time that elapses from a time in which the switch device is activated by said energizing means to a time in which the detection voltage of the resistor changes by a predetermined amount, and wherein said discriminating means is further for determining a position of the movable iron core based on the amount of time measured by said detecting means.

24. An apparatus as claimed in claim 23, wherein said discriminating means is further for comparing the amount of time measured by said detecting means with a predetermined reference time and determining that an abnormality exists when the amount of time is equal to or less than the predetermined reference time, the abnormality being that the movable iron core has failed to move to an absorbing position.

* * * * *